(12) United States Patent
Watanabe et al.

(10) Patent No.: US 7,951,715 B2
(45) Date of Patent: May 31, 2011

(54) SEMICONDUCTOR DEVICE FABRICATION METHOD

(75) Inventors: Takashi Watanabe, Kawasaki (JP); Naoki Idani, Kawasaki (JP); Toshiyuki Isome, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 10/823,729

(22) Filed: Apr. 14, 2004

(65) Prior Publication Data
US 2005/0026439 A1 Feb. 3, 2005

(30) Foreign Application Priority Data

Jul. 31, 2003 (JP) ................. 2003-283810
Jan. 21, 2004 (JP) ................. 2004-013357

(51) Int. Cl.
*H01L 21/302* (2006.01)
(52) U.S. Cl. ................. 438/692; 438/691
(58) Field of Classification Search .......... 438/221, 438/296, 424, 633, 691, 692
See application file for complete search history.

(56) References Cited

U.S. PATENT DOCUMENTS

| | | | |
|---|---|---|---|
| 5,861,054 A * | 1/1999 | Miyashita et al. ............ 106/3 |
| 6,001,706 A * | 12/1999 | Tan et al. ............ 438/424 |
| 6,046,112 A * | 4/2000 | Wang ............ 438/693 |
| 6,171,180 B1 * | 1/2001 | Koutny et al. ............ 451/287 |
| 6,343,976 B1 | 2/2002 | Yoshida et al. |
| 6,379,230 B1 | 4/2002 | Hayashi et al. |
| 6,413,156 B1 | 7/2002 | Shimizu et al. |
| 6,494,985 B1 | 12/2002 | Sotozaki et al. |
| 6,638,866 B1 * | 10/2003 | Cheng et al. ............ 438/692 |
| 6,677,239 B2 * | 1/2004 | Hsu et al. ............ 438/692 |
| 6,863,595 B1 * | 3/2005 | Zagrebelny ............ 451/41 |
| 2002/0016074 A1 | 2/2002 | Kimura et al. |
| 2002/0039875 A1 | 4/2002 | Kobayashi et al. |
| 2003/0025200 A1 | 2/2003 | Katsumura et al. |

(Continued)

FOREIGN PATENT DOCUMENTS

JP 10-303152 A 11/1998

(Continued)

OTHER PUBLICATIONS

Japanese Office Action mailed Oct. 13, 2009, issued in corresponding Japanese Application No. 2004-013357.

(Continued)

*Primary Examiner* — David Vu
(74) *Attorney, Agent, or Firm* — Westerman, Hattori, Daniels & Adrian, LLP

(57) ABSTRACT

The method comprises the step polishing the surface of a film-to-be-polished formed over a semiconductor substrate 10 with a polishing pad while a polishing slurry containing abrasive grains, and an additive of a surfactant is being supplied onto the polishing pad 104 to thereby planarize the surface of the film-to-be-polished, and the step of further polishing the surface of the film-to-be-polished with the polishing pad while the polishing slurry and water are being supplied onto the polishing pad, after the surface of the film-to-be-polished has been planarized. In the finishing polish, not only deionized water but also the polishing slurry are supplied on to the polishing pad, a position for the polishing slurry to be supplied to and a position for the deionized water to be supplied to are suitably set, and a ratio of a supply amount of the polishing slurry and a supply amount of the deionized water is suitably set, whereby the intra-plane film thickness of the film-to-be-polished as finish-polished can be uniform.

7 Claims, 56 Drawing Sheets

U.S. PATENT DOCUMENTS

| | | |
|---|---|---|
| 2003/0115806 A1 | 6/2003 | Takami et al. |
| 2007/0269987 A1 | 11/2007 | Nakano et al. |

FOREIGN PATENT DOCUMENTS

| | | |
|---|---|---|
| JP | 11-104955 | 4/1999 |
| JP | 11181403 A | 7/1999 |
| JP | 2000-243733 A | 9/2000 |
| JP | 2000-248263 | 9/2000 |
| JP | 2000248263 A | 9/2000 |
| JP | 2000-315665 A | 11/2000 |
| JP | 2001-9702 | 1/2001 |
| JP | 2001-57532 A | 2/2001 |
| JP | 2001035821 A | 2/2001 |
| JP | 2001-85373 | 3/2001 |
| JP | 2001-338902 | 12/2001 |
| JP | 2001345293 A | 12/2001 |
| JP | 2002-83787 | 3/2002 |
| JP | 2002079461 A | 3/2002 |
| JP | 2002083787 A | 3/2002 |
| JP | 2002110596 A | 4/2002 |
| JP | 2003086548 A | 3/2003 |
| JP | 2003-142435 A | 5/2003 |
| JP | 2003179009 A | 6/2003 |
| WO | 2004100242 A1 | 11/2004 |

OTHER PUBLICATIONS

Japanese Office Action dated Jun. 8, 2010, issued in corresponding Japanese Patent Application No. 2004013357.

* cited by examiner

DISTANCE FROM WAFER CENTER (mm)

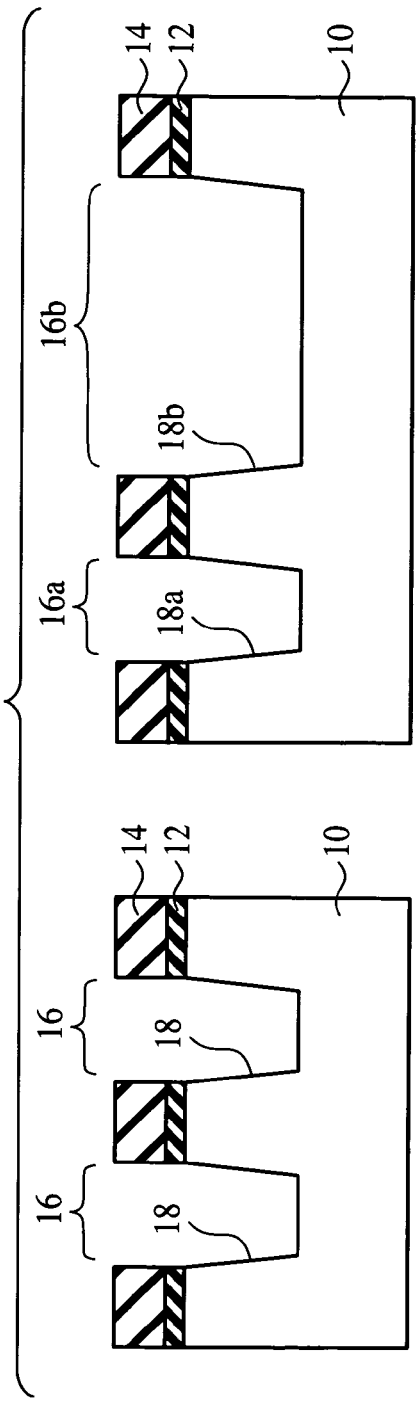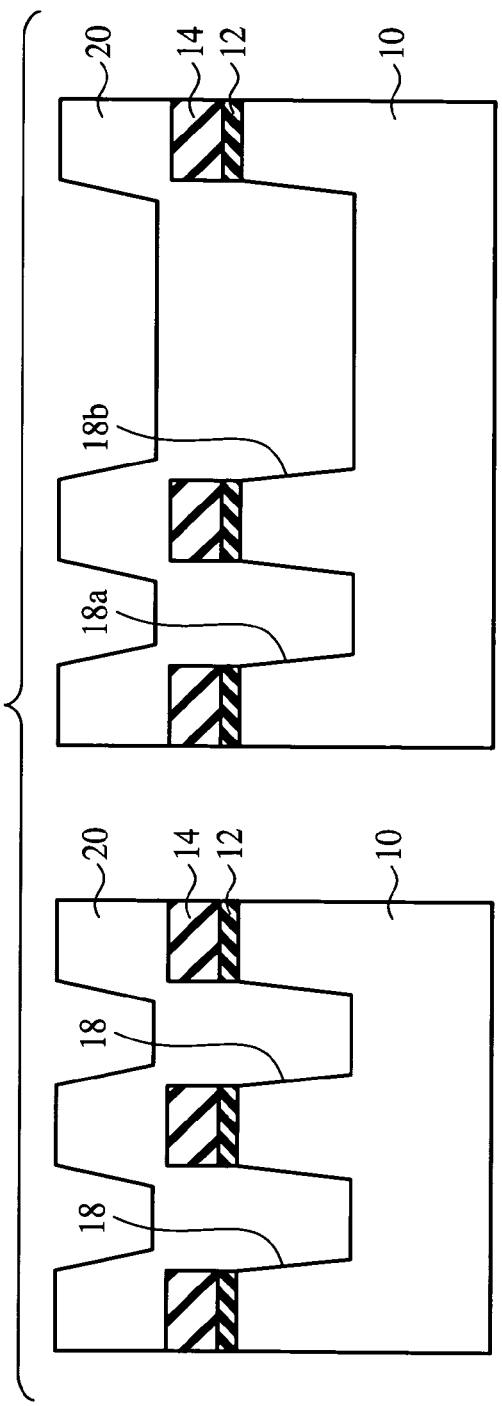

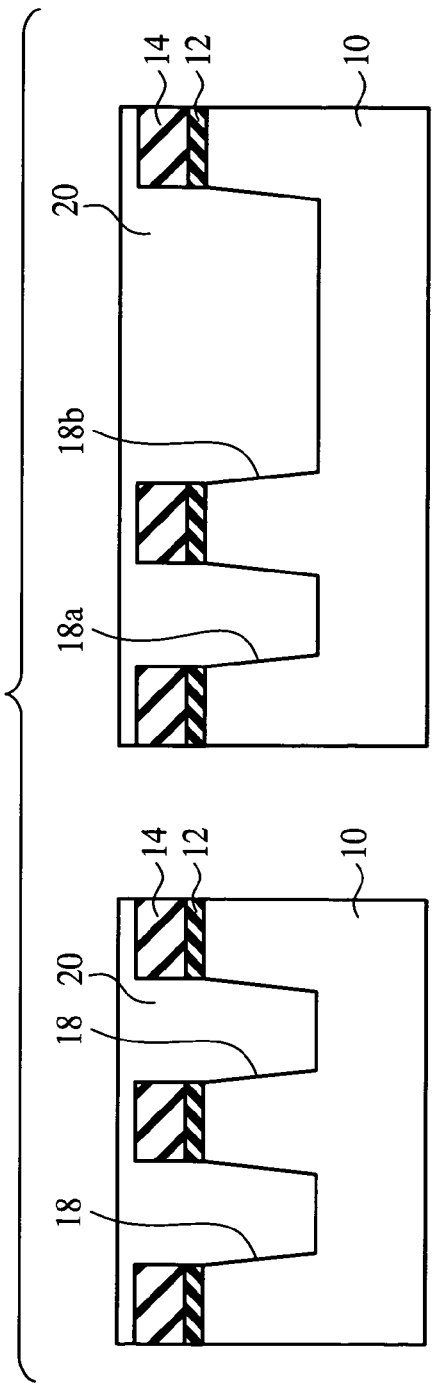
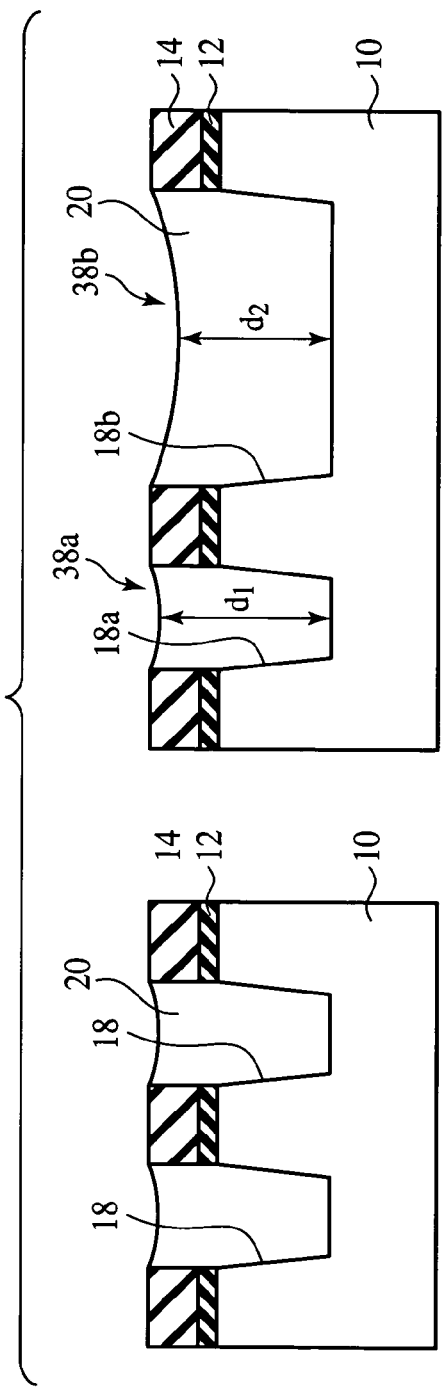
FIG. 34A
FIG. 34B

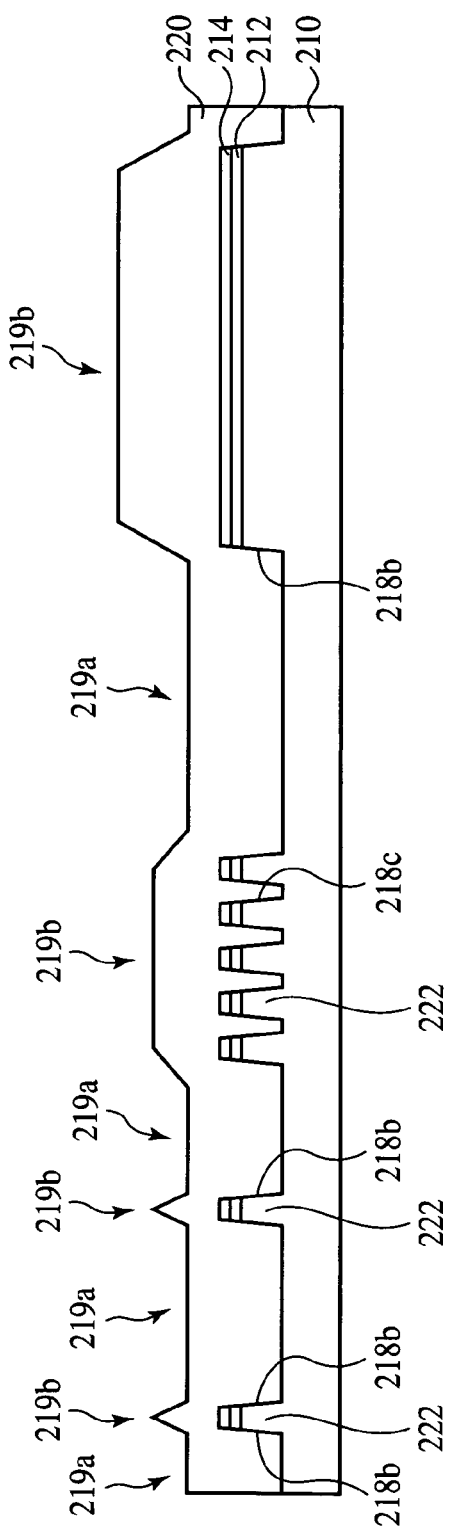
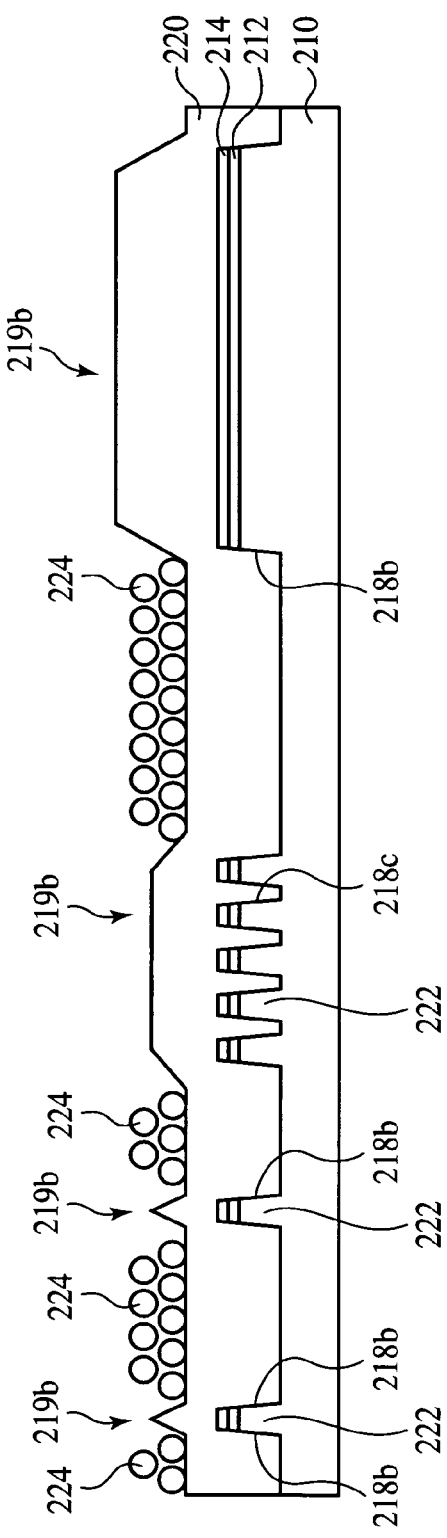

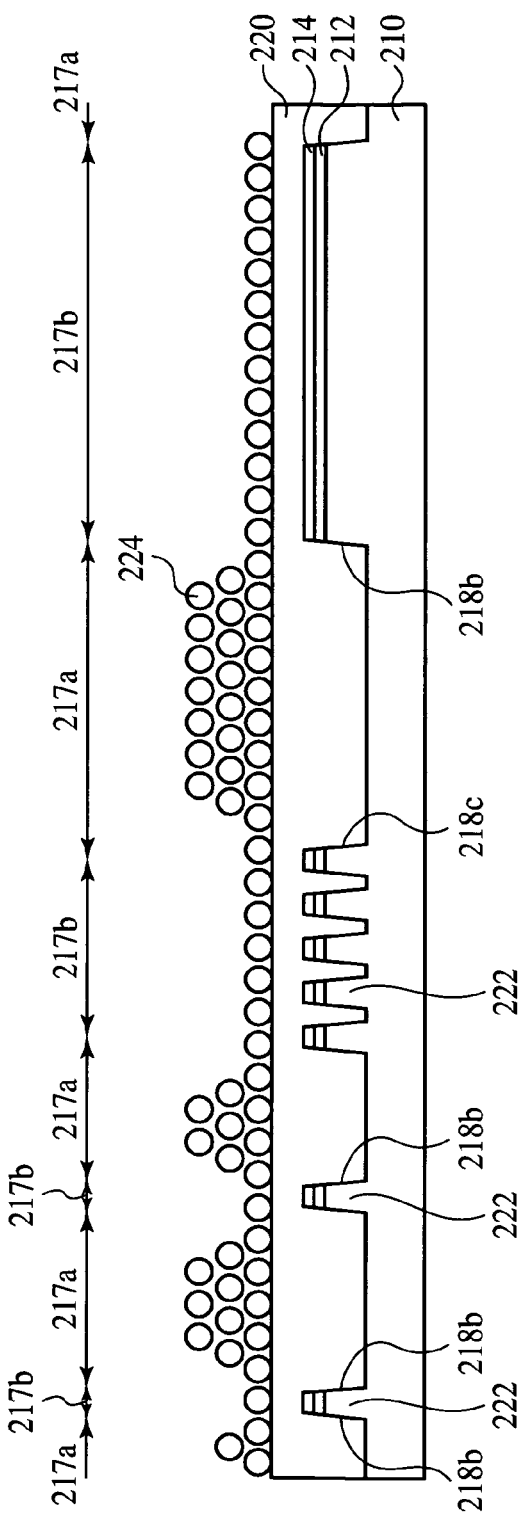
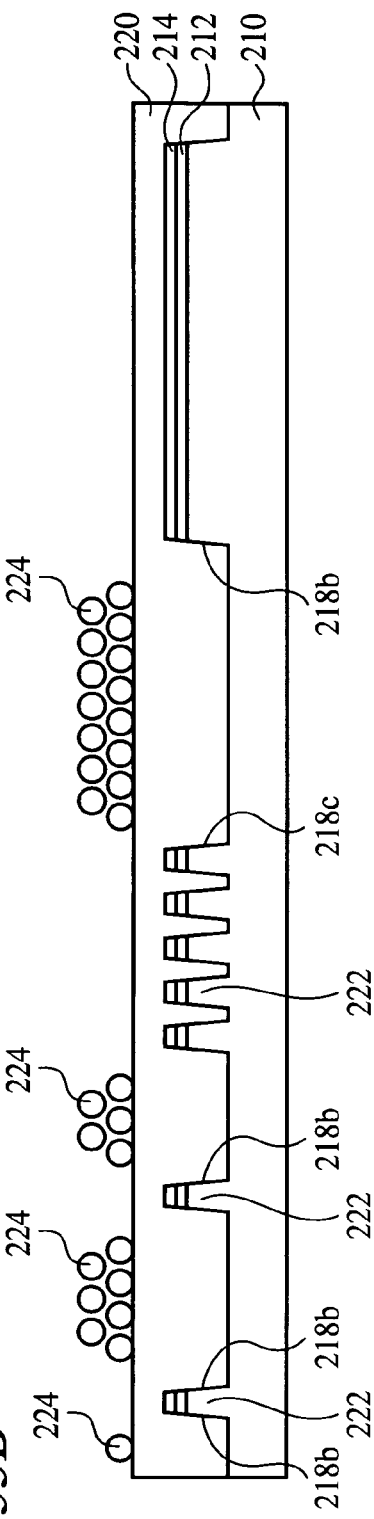

SEMICONDUCTOR DEVICE FABRICATION METHOD

CROSS-REFERENCE TO RELATED APPLICATION

This application is based upon and claims priority of Japanese Patent Application No. 2003-283810, filed on Jul. 31, 2003, and Japanese Patent Application No. 2004-13357, filed on Jan. 21, 2004, the contents being incorporated herein by reference.

BACKGROUND OF THE INVENTION

The present invention relates to a semiconductor device fabrication method, more specifically, a semiconductor device fabrication method in which a film-to-be-polished is polished.

Conventionally, as a technique for forming device isolation regions for defining device regions, LOCOS (LOcal Oxidation of Silicon) has been widely known.

However, when device isolation regions are formed by LOCOS, bird's beaks decrease the device regions. Reducing the oxidation amount for forming the device isolation regions can make the bird's beaks smaller, but when the oxidation amount is small, the device isolation function is not sufficient. When the device isolation regions are formed by LOCOS, large steps are formed on the substrate surface. Thus, the technique for forming device isolation regions by LOCOS has found further micronization and higher integration difficult.

As a technique which takes over LOCOS, STI (Shallow Trench Isolation) is noted. The technique for forming device isolation regions by STI will be explained with reference to FIGS. 47A to 47C. FIGS. 47A to 47C are sectional views of a semiconductor device in the steps of the method for fabricating the semiconductor device, which show the method.

First, as shown in FIG. 47A, a silicon oxide film 212 and a silicon nitride film 214 are sequentially formed on a semiconductor substrate 210.

Next, the silicon nitride film 214 and the silicon oxide film 212 are patterned by photolithography. Thus, openings 216 are formed in the silicon nitride film 214 and the silicon oxide film 212 down to the semiconductor substrate 210.

Next, the semiconductor substrate 210 is anisotropically etched with the silicon nitride film 214 as the mask, which has the openings 216 formed in. Thus, trenches 218 are formed in the semiconductor substrate 210.

Then, as shown in FIG. 47B, a silicon oxide film 220 is formed in the trenches 218 and on the silicon nitride film 214. The silicon oxide film 220 is to be a film-to-be-polished.

Next, as shown in FIG. 47C, the surface of the film-to-be-polished 220 is polished by CMP (Chemical Mechanical Polishing) until the surface of the silicon nitride film 214 is exposed. The silicon nitride film 214 functions as the stopper for polishing the film-to-be-polished 220. As the polishing slurry is used a polishing slurry containing, e.g., abrasive grains of silica and an additive of KOH. Thus, a device isolation regions 221 of the silicon oxide film 220 are buried in the trenches 218. Device regions 222 are defined by the device isolation regions 221.

Then, the silicon nitride film 214 and the silicon oxide film 212 are etched off. Then, transistors (not shown) are formed in the device regions 222. Thus, a semiconductor device is fabricated.

Forming the device isolation regions 221 by STI generates no bird's beaks, as does forming device isolation regions by LOCOS, and accordingly, the decrease of the device regions 222 can be prevented. The depth of the trenches 218 are set large, whereby the effective inter-device distance can be larger, and high device isolating function can be obtained.

However, the semiconductor device fabrication method using the above-described polishing slurry, i.e., the polishing slurry containing abrasive grains of silica and an additive of KOH, does not have high polishing rate and cannot always provide good planarity.

As a polishing slurry whose polishing rate is high and can provide good planarity is proposed, a polishing slurry containing abrasive grains and an additive of a surfactant. In the proposed polishing slurry, the abrasive grains are, e.g., cerium oxide ($CeO_2$). The additive is, e.g., poly(ammonium acrylate).

FIGS. 48A to 48C are conceptual views of the mechanism for polishing a film-to-be-polished with the proposed polishing slurry. FIGS. 49A and 49B are sectional views of the film-to-be-polished polished by the proposed semiconductor device fabrication method.

FIGS. 48A and 49B show the state of the film-to-be-polished before the polish.

As shown in FIGS. 48A and 49A, concavities and convexities are present in the surface of the film-to-be-polished 220. On the surface of the film-to-be-polished 220 having the concavities and convexities, the additive 224 of a surfactant adheres to the concavities to thereby hinder the polish of the film-to-be-polished 220 in the concavities. On the other hand, high pressures are applied to the convexities to thereby release the additives 224 of a surfactant, and the polish of the film-to-be-polished 220 is not hindered. Thus, the convexities on the surface of the film-to-be-polished 220 is selectively polished by the abrasive grains 226. The surface of the film-to-be-polished 220 is thus planarized. The polish for planarizing the surface of the film to-be-polished is called the main polish.

FIG. 48B shows the surface of the film-to-be-polished which have been planarized.

On the planarized surface of the film-to-be-polished 220, the additive 224 of a surfactant stays on the entire surface of the film-to-be-polished, and hinders the film-to-be-polished 220 from being polished. The polishing rate becomes extremely low. Resultantly, as shown n FIG. 49B, the film-to-be-polished 220 remains on the stopper film 214.

Here, it is proposed to set the film thickness of the film-to-be-polished 220 to make the height of the surface of the concavities in the film-to-be-polished 220 substantially equal to the height of the surface of the stopper film 214. However, generally, the film thickness of the film-to-be-polished 220 varies by about ±30 nm from a design value. When the film-to-be-polished 220 is formed thicker than a design value, the film-to-be-polished 220 remains on the stopper film 214.

The film-to-be-polished 220 remaining on the stopper film 214 prevents the stopper film 214 and the silicon oxide film 212 from being etched off, and the film-to-be-polished 220 on the stopper film 214 must be removed by another method.

As a method for removing the film-to-be-polished remaining on the stopper film 214 is proposed to further polish the film-to-be-polished 220 with the feed of the polishing slurry being stopped and with deionized water being fed.

FIG. 48C shows the state where with the feed of polishing slurry onto the polishing pad being stopped and with water being fed onto the polishing pad, the film-to-be-polished is further polished, i.e., the state of the finishing polish.

When the finishing polish is started, the polishing slurry used in the main polish remains between the silicon oxide film 220, which is the film-to-be-polished, and the polishing pad 228. The additive 224 contained in the polishing slurry is water soluble, and is removed in a short period of time when the deionized water is fed. The abrasive grains 226 contained in the polishing slurry, however, are not water soluble and cannot be easily removed, and remain between the film-to-be-polished 220 and the polishing pad 228. The additive 224 has contributed to, as described above, decreasing the polishing rate of the film-to-be-polished 220 when the surface of the film-to-be-polished 220 is planarized. The additive 224 having such function is removed for a short period of time, while the abrasive grains 226 contributing to the polish remain between the film-to-be-polished 220 and the polishing pad 228, whereby the remaining abrasive grains 226 can further polish the film-to-be-polished 220.

Such finishing polish is performed for a prescribed period of time, whereby the film-to-be-polished 220 remaining on the stopper film 214 can be removed from surface of the stopper film 214.

Thus, the polish of the film-to-be-polished 220 is completed.

After the polish of the film-to-be-polished 220 has been completed, the inspection as to whether or not the polish of the film-to-be-polished 220 is normal.

FIGS. 50A and 50B are a plan view and a sectional view of an inspection pattern of the stopper film, which is formed in a scribe line. FIG. 50A is the plan view. FIG. 50B is the sectional view along the line A-A' in FIG. 50A.

FIGS. 51A and 51B are a plan view and a sectional view of an inspection pattern of a buried insulation film, which is formed in a scribe line. FIG. 51A is the plan view. FIG. 51B is the sectional view along the line A-A' in FIG. 51A.

Specifically, it is inspected that the film-to-be-polished 220 is not left on the inspection pattern 232a formed on the scribe line 230. It is inspected whether or not the thickness of the buried insulation film 220 buried in an inspection trench 218a is within a prescribed inspection specified range. Based on the inspection result, it is judged that the polish of the film-to-be-polished 220 has been normal, the next step follows. When the polish of the film-to-be-polished 220 is not normal, the semiconductor device is treated as a defective.

Following references disclose the background art of the present invention.

[Patent Reference 1]
Specification of Japanese Patent Application Unexamined Publication No. 2001-9702

[Patent Reference 2]
Specification of Japanese Patent Application Unexamined Publication No. 2001-85373

[Patent Reference 3]
Specification of Japanese Patent Application Unexamined Publication No. 2001-338902

[Patent Reference 4]
Specification of Japanese Patent Application Unexamined Publication No. 2002-83787

[Patent Reference 5]
Specification of Japanese Patent Application Unexamined Publication No. Hei 11-104955

[Patent Reference 6]
Specification of Japanese Patent Application Unexamined Publication No. 2000-248263

However, in the proposed semiconductor device fabrication method, the depth of concavities called dishings 223 formed in the surface of the buried oxide film 220 often largely vary (see FIG. 52). FIG. 52 is a sectional view of the dishing formed in the surface of the buried oxide film.

In the proposed semiconductor device fabrication method, deep dishings 223 are often formed in the surface of the buried oxide film 220, or the film-to-be-polished 220 often remains on the device region 222.

When the film-to-be-polished 220 is polished with the proposed polishing slurry, the depth of the dishings 223 largely vary depending on the area of the trenches 218, 218a. FIG. 53 is a graph of the film thickness of the buried oxide film buried in the trenches of 40 µm×40 µm and the film thickness of the buried oxide film buried in the trenches of 100 µm×100 µm, which compare the film thicknesses. As seen in FIG. 53, when the area of the trenches is large, the dishing 223 formed in the buried oxide film 220 is deep, and the film thickness of the buried oxide film 220 is thin. Accordingly, when the film-to-be-polished 220 is polished with the proposed polishing slurry, it is difficult to inspect accurately whether or not the polish of the film-to-be-polished 220 is normal.

SUMMARY OF THE INVENTION

An object of the present invention is to provide a semiconductor device fabrication method which can suppress variation of film thickness distributions of the buried oxide film.

Another object of the present invention is to provide a semiconductor device fabrication method which can prevent dishings from being formed deep and can prevent the film-to-be-polished form remaining in the device regions.

Further another object of the present invention is to provide a semiconductor device fabrication method which, even when the proposed polishing slurry is used, enables the inspection as to whether or not the polish of the film-to-be-polished is normal to be made accurately.

According to one aspect of the present invention, there is provided a semiconductor device fabrication method comprising the steps of: polishing the surface of a film-to-be-polished formed over a semiconductor substrate with a polishing pad while a polishing slurry containing abrasive grains, and an additive of a surfactant is being supplied onto the polishing pad to thereby planarize the surface of the film-to-be-polished; and after the surface of the film-to-be-polished has been planarized, further polishing the surface of the film-to-be-polished with the polishing pad while the polishing slurry and water are being supplied onto the polishing pad.

According to another aspect of the present invention, there is provided a semiconductor device fabrication method comprising the steps of: polishing the surface of a film-to-be-polished formed over a semiconductor substrate with a polishing pad while a polishing slurry containing abrasive grains, and an additive of a surfactant is being supplied onto the polishing pad to thereby planarize the surface of the film-to-be-polished; and further polishing the surface of the film-to-be-polished with the polishing pad while at least water is being supplied onto the polishing pad after the surface of the film-to-be-polished has been planarized, in the step of further polishing the surface of the film-to-be-polished, the finish of the polish being detected based on that a drive current or a drive voltage of a polishing table or a polishing head decreases, increases and begins to again decrease.

According to further another aspect of the present invention, there is provided a semiconductor device fabrication method comprising the steps of: forming in a semiconductor substrate or an insulation film a plurality of trenches including a first inspection trench, and a second inspection trench whose area is larger than the first inspection trench; forming a film-to-be-polished, filling the trenchs; polishing the surface of the film-to-be-polished with a polishing pad while a polishing slurry is being supplied onto the polishing pad to thereby planarize the surface of the film-to-be-polished; after the surface of the film-to-be-polished has been planarized, further polishing the surface of the film-to-be-polished with the polishing pad while at least water is being supplied onto the polishing pad; and detecting whether or not a difference between a film thickness of the film-to-be-polished buried in the first inspection trench and a film thickness of the film-to-be-polished buried in the second inspection trench satisfies a prescribed inspection specification.

According to further another aspect of the present invention, there is provided a semiconductor device fabrication method comprising the steps of: polishing the surface of a film-to-be-polished formed over a semiconductor substrate with a polishing pad while a polishing slurry containing abrasive grains, and an additive formed of a surfactant is being supplied onto the polishing pad to planarize the surface of the film-to-be-polished; removing the additive adhering to the surface of the film-to-be-polished while water is being supplied onto the polishing pad, after the surface of the film-to-be-polished has been planarized; and further polishing the surface of the film-to-be-polished by using the polishing pad while the polishing slurry and water are being supplied onto the polishing pad.

As described above, according to the present invention, in the finishing polish, not only deionized water but also the polishing slurry are supplied on to the polishing pad, a position for the polishing slurry to be supplied to and a position for the deionized water to be supplied to are suitably set, and a ratio of a supply amount of the polishing slurry and a supply amount of the deionized water is suitably set, whereby the intra-plane film thickness of the film-to-be-polished after finish-polished can be uniform.

According to the present invention, the finish of the finishing polish is detected based on a drive current or others of the polishing table or others, whereby the finish of the finishing polish can be accurately detected. Thus, according to the present invention, the residue of the film-to-be-polished on the device region and the occurrence of deep dishing in the surface of the buried insulation film of the film-to-be-polished can be prevented.

According to the present invention, in the first stage of the main polish, the film-to-be-polished is polished under a relatively high polishing pressure, and in the second stage of the main polish, the film-to-be-polished is polished under a relatively low polishing pressure. The film-to-be-polished is polished under a relatively high polishing pressure in the first stage polish, and the film-to-be-polished can be polished at a relatively high polishing rate. On the other hand, in the second stage polish, the film-to-be-polished is polished under a relatively low polishing pressure, whereby the surface of the film-to-be-polished can be sufficiently planarized. Thus. according to the present invention, the main polish period of time can be shortened without impairing the planarity of the film-to-be-polished.

According to the present invention, a plurality of inspection patterns of different areas are formed in advance, and based on a difference of film thicknesses of the buried insulation film forming these inspection patterns, whether or not the polish of the film-to-be-polished is normal is inspected, whereby even when the finishing polish is performed with the polishing slurry containing abrasive grains, and an additive of a surfactant, whether or not the polishing of the film-to-be-polished is normal can be inspected. Thus, the present invention can further increase the reliability of semiconductor devices.

According to the present embodiment, the additive adhering to the surface of the film-to-be-polished is removed before the finishing polish, whereby it is prevented to perform the finishing polish with the additive adhering to the surface of the film-to-be-polished. According to the present embodiment, it can be prevented without failure that the film-to-be-polished remains above the device regions. Resultantly, the silicon nitride film and the silicon oxide film on the device regions can be removed without failure.

BRIEF DESCRIPTION OF THE DRAWINGS

FIGS. 9A and 9B are conceptual views (Part 1) showing a position for the polishing slurry to be supplied to and a position for the deionized water to be supplied to.

FIGS. 10A and 10B are conceptual views (Part 2) showing a position for the polishing slurry to be supplied to and a position for the deionized water to be supplied to.

FIGS. 13A and 13B are conceptual views (Part 3) showing a position for the polishing slurry to be supplied to and a position for the deionized water to be supplied to.

FIG. 14 is conceptual views (Part 4) showing a position for the polishing slurry to be supplied to and a position for the deionized water to be supplied to.

FIGS. 33A and 33B are sectional views of a semiconductor device in the semiconductor fabrication method according to a second embodiment of the present invention, which show the method (Part 1).

FIGS. 34A and 34B are sectional views of the semiconductor device in the semiconductor fabrication method according to the second embodiment of the present invention, which show the method (Part 2).

FIGS. 54A and 54B are sectional views of the semiconductor device in the step of the method for fabricating the semiconductor device, which show the mechanism of the film-to-be-polished remaining over the device regions (Part 1).

FIGS. 55A and 55B are sectional views of the semiconductor device in the step of the method for fabricating the semiconductor device, which show the mechanism of the film-to-be-polished remaining over the device regions (Part 2).

DETAILED DESCRIPTION OF THE INVENTION

A First Embodiment

Figure 1:
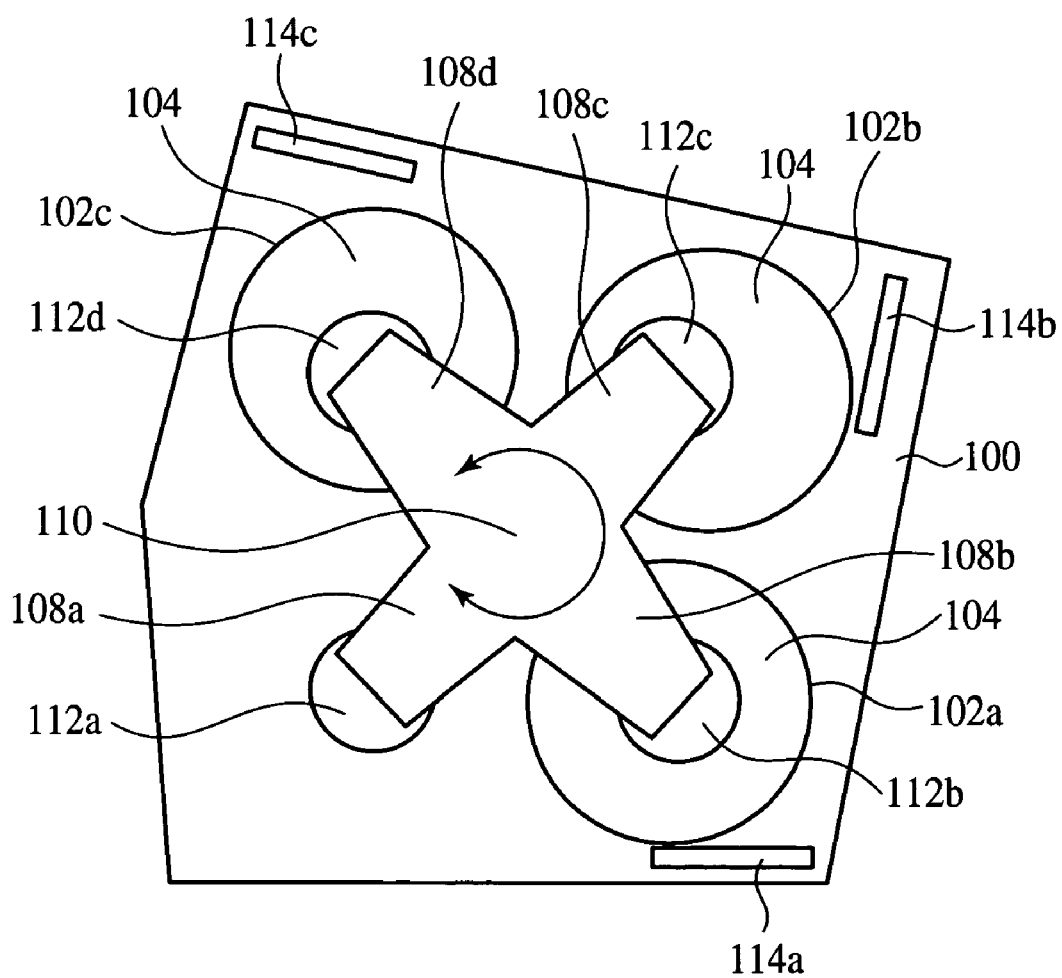
FIG. 1 is a plan view of the polishing apparatus.
Figure 2:
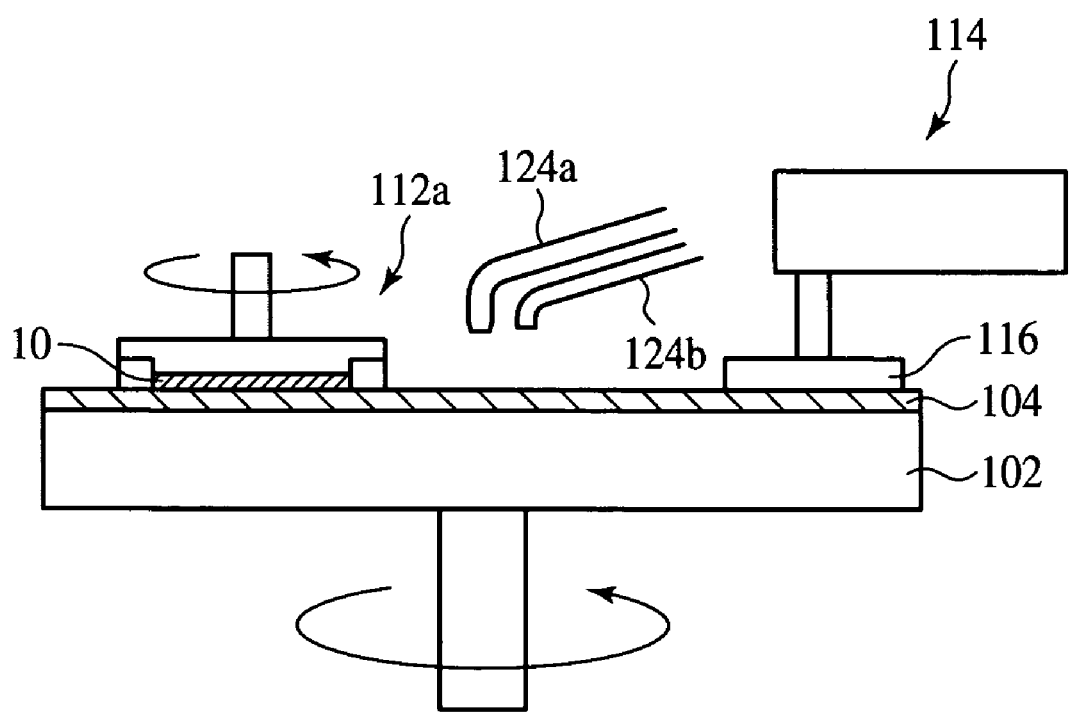
FIG. 2 is a side view of a part of the polishing apparatus shown in FIG. 1.
Figure 3:
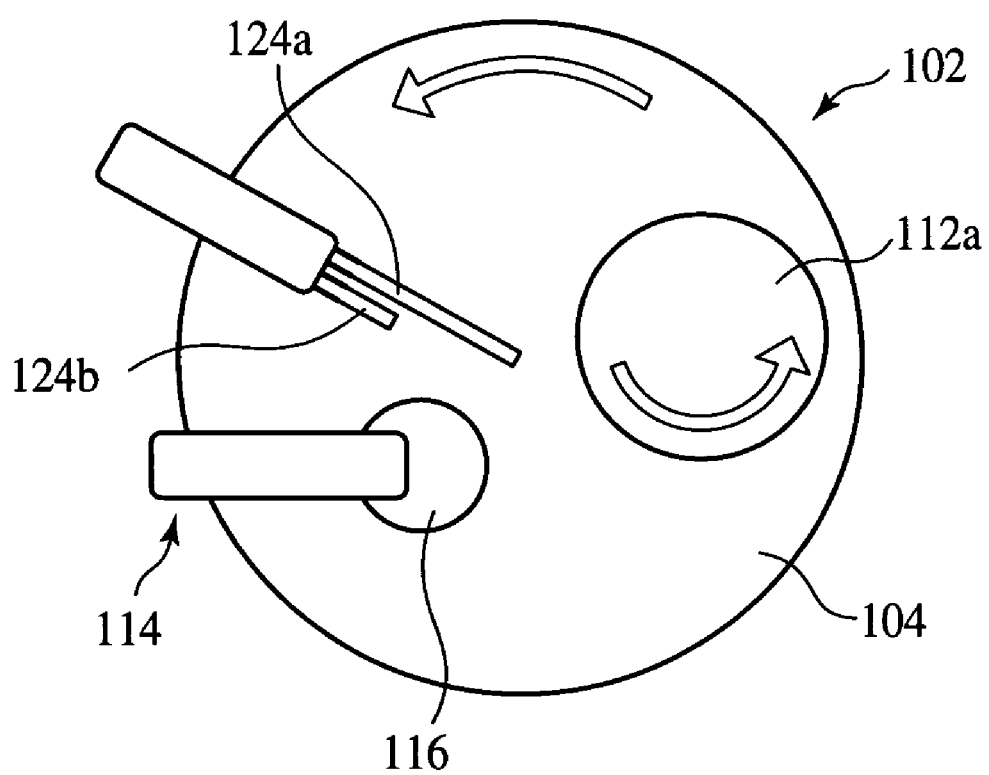
FIG. 3 is a plan view of a part of the polishing apparatus shown in FIG. 1.
Figure 4:
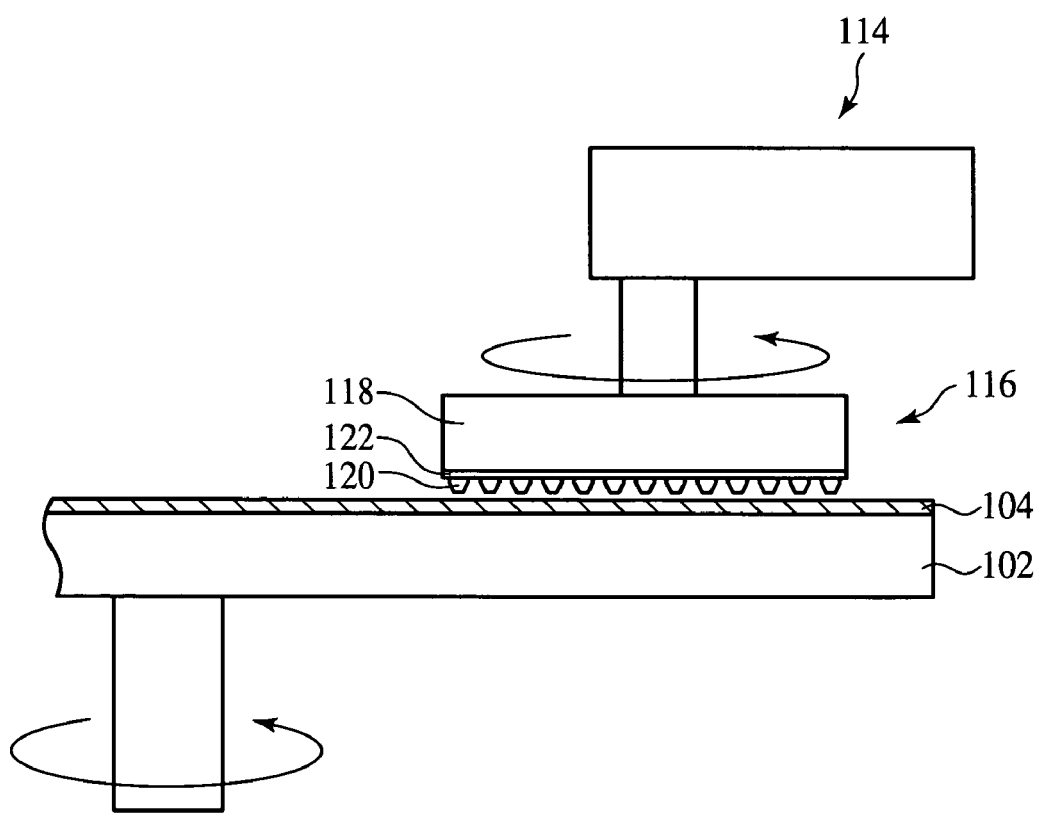
FIG. 4 is an enlarge side view of a part of the polishing apparatus shown in FIG. 1.

Before the semiconductor device fabrication method according to the present embodiment is explained, the polishing apparatus used in the present embodiment will be explained with reference to FIGS. 1 to 4. FIG. 1 is a plan view of the polishing apparatus. FIG. 2 is a side view of the polishing apparatus, which shows a part of the polishing apparatus shown in FIG. 1. FIG. 3 is a plan view of the polishing apparatus, which shows a part of the polishing apparatus shown in FIG. 1. FIG. 4 is an enlarged side view of the polishing apparatus, which shows a part of the polishing apparatus shown in FIG. 1.

As shown in FIG. 1, three rotary polishing tables 102a-102c are disposed on a base 100.

In the present embodiment, the polish of the surface of the film-to-be-polished is performed by, e.g., the polishing table 102a. The polishing tables 102b, 102c are usable to polish the surface of the film-to-be-polished.

As shown, polishing pads 104 are provided on the respective polishing tables 102a-102c. The polishing pads 104 can be, e.g., the polishing pads (Type: IC1400) by RODEL NITTA Co.

A carousel 110 having arms 108a-108d is disposed on the base 100.

Rotary polishing heads 112a-112d are disposed under the respective arms 108a-108d. The carousel 110 is suitably rotated to move the polishing heads 112a-112d. The center of the polishing head 112 is positioned between the center of the polishing pad 104 and the edge of the polishing pad 104.

As shown in FIG. 2, the polishing heads 112a-112d support a semiconductor substrate 10. The polishing heads 112a-112d rotate the semiconductor substrate 10, pressing the semiconductor substrate 10 against the polishing pads 104.

A plurality of nozzles 124a, 124b are disposed on each of the polishing tables 102a-102c. The nozzle 124a supplies a polishing slurry onto the associated polishing pad 104. The nozzle 124b supplies deionized water onto the associated polishing pad 104. As shown in FIG. 3, the nozzles 124a, 124b are movable radially of the polishing table 102 independently of each other, whereby a position at which the nozzles 124a supplies the polishing slurry and a position at which the nozzle 124b supplies the deionized water can be set suitably independently of each other.

As shown in FIG. 1, dressers 114a-114c for dressing the polishing pads 104 are disposed respectively beside the polishing tables 102a-102c.

As shown in FIG. 4, the dresser 114 has a diamond disk 116. The diamond disk 116 comprises a metal base 118 of, e.g., stainless and diamond particles of, e.g., about 150 μm fixed to the metal base 118. Several diamond particles 120 are disposed per 1 cm$^2$. The diamond particles 120 are fixed to the metal base 118 by, e.g., a nickel-plated layer 122.

Thus, the polishing apparatus used in the present embodiment is constituted.

In the proposed semiconductor device fabrication method, in the finishing polish, the surface of the film-to-be-polished is further polished with the supply of the polishing slurry onto the polishing pads stopped and with the deionized water being supplied onto the polishing pads.

Figure 5:
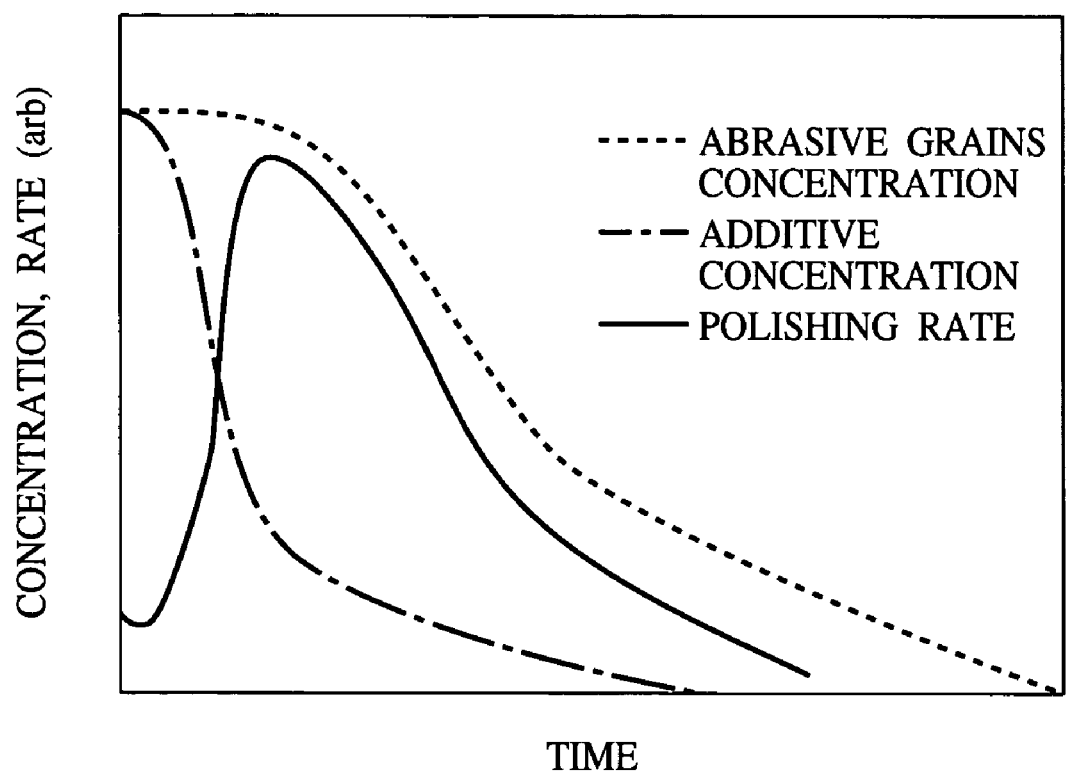
FIG. 5 is a graph (Part 1) showing concentrations of the abrasive grains, concentrations of the additive and polishing rate changes, which shows them conceptually.

FIG. 5 is a graph showing concentrations of the abrasive grains, concentrations of the additive and polishing rate changes in the finishing polish of the proposed semiconductor device fabrication method, which shows them conceptually. The dot line indicates the concentrations of the abrasive grains. The one-dot-chain line indicates the concentrations of the additive of a surfactant. The solid line indicates the polishing rates. Time is taken on the horizontal axis. The abrasive grains concentrations, the additive concentrations and the polishing rates are taken on the vertical axis.

At the start of the finishing polish, the polishing slurry used in the main polish remains between the silicon oxide film which is the film-to-be-polished, and the polishing pads. Since the additive contained in the polishing slurry is water soluble, the additive is removed for a short period of time when the deionized water is fed. Accordingly, the concentration of the additive rapidly goes on decreasing.

On the other hand, the abrasive grains contained in the polishing slurry, which is not water soluble, cannot be easily removed. The additive has contributed to decreasing the rate of polishing the film-to-be-polished when the surface of the film-to-be-polished was planarized. The additive, which decreases the polishing rate, is removed for a short period of time, while the abrasive grains, which contribute to the polishing, cannot be easily removed, whereby the abrasive grains remaining between the film-to-be-polished and the polishing pads can further polish the surface of the film-to-be-polished. The abrasive grains are gradually removed from the surface of the polishing pads by the deionized water fed onto the polishing pads. Accordingly, the concentration of the abrasive grains is gradually decreased. As the concentration of the abrasive grains is decreased, the rate of polishing the film-to-be-polished is more decreased.

Figure 6:
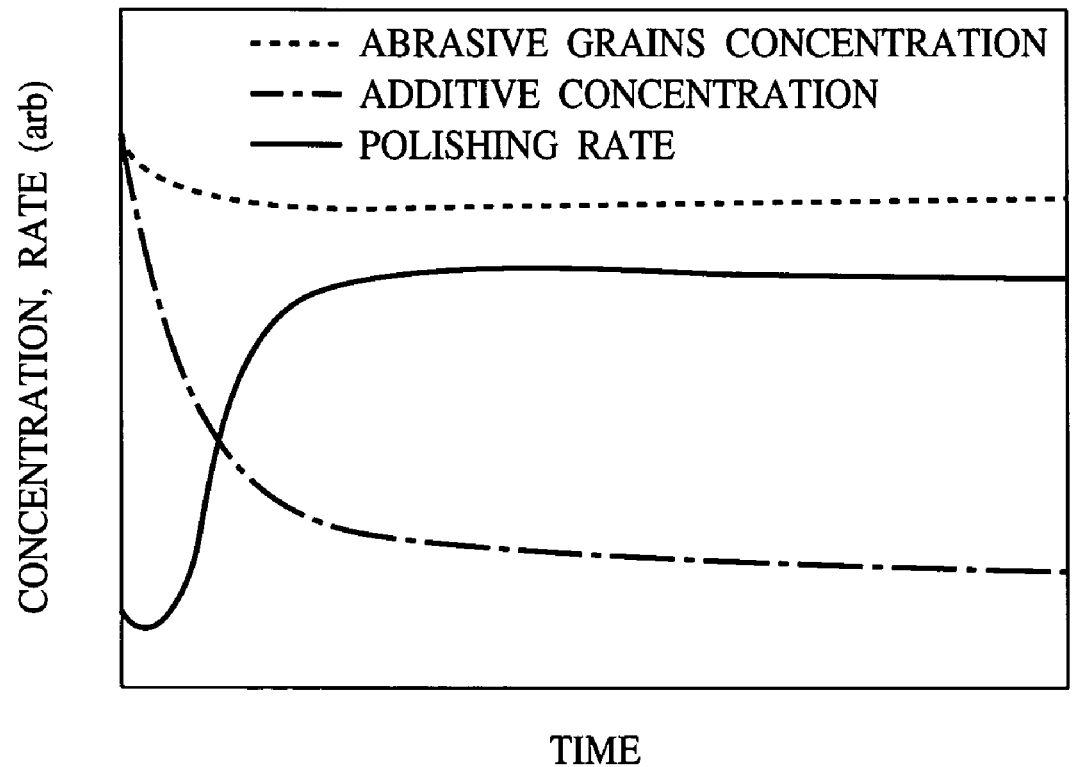
FIG. 6 is a graph (Part 2) showing concentrations of the abrasive grains, concentrations of the additive and polishing rate changes, which shows them conceptually.

FIG. 6 is a graph showing concentration of the abrasive grains, concentration of the additive and polishing rate changes in the finishing polish with both the polishing slurry and the deionized water being fed onto the polishing pad, which shows them conceptually. The dot line indicates the concentrations of the abrasive grains. The one-dot-chain line indicates the concentrations of the additive of a surfactant. The solid line indicates the polishing rates. Time is taken on the horizontal axis. The abrasive grains concentrations, the additive concentrations and the polishing rates are taken on the vertical axis.

As seen in FIG. 6, the surface of the film-to-be-polished is polished with both the polishing slurry and the deionized water being supplied onto the polishing pad, whereby the concentration of the abrasive grains, the concentration of the additive and the polishing rate can be retained substantially constant. Accordingly, the film-to-be-polished can be polished under stable conditions.

Figure 7:
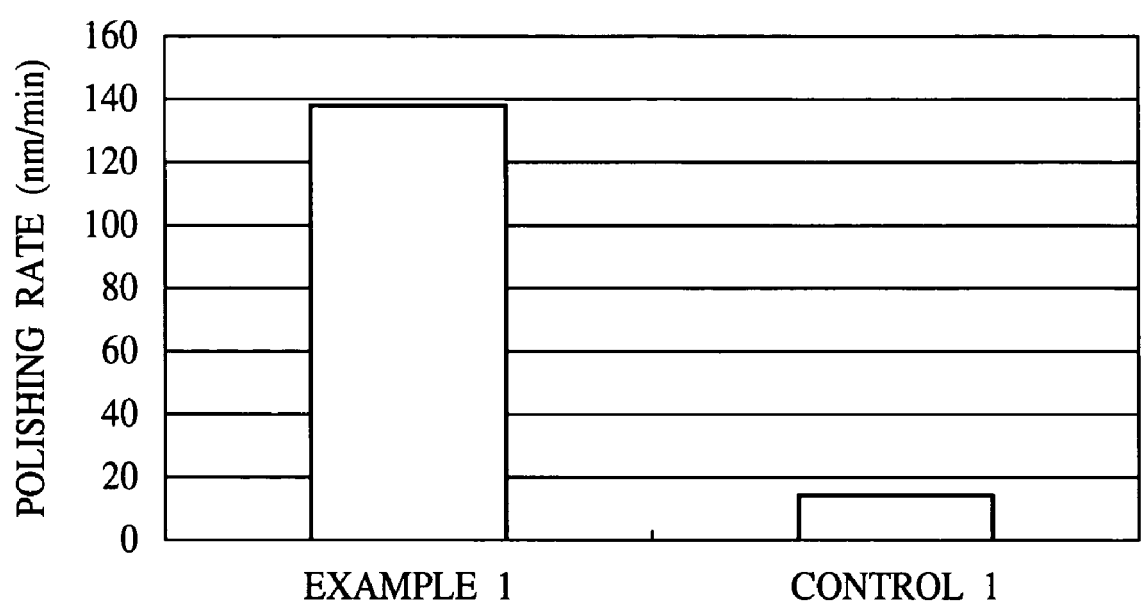
FIG. 7 is a graph of polishing rates of the film-to-be-polished.

FIG. 7 is a graph of rates of polishing the film-to-be-polished. Example 1 indicates the rate of polishing the film-to-be-polished with both the polishing slurry and the deionized water being supplied onto the polishing pad. Control 1 indicates the rate of polishing the film-to-be-polished with the polishing slurry alone being supplied onto the polishing pad. In both Example 1 and Control 1, the films-to-be-polished having flat surfaces were polished.

As seen in FIG. 7, in Control 1, in which the film-to-be-polished was polished with the polishing slurry alone being supplied onto the polishing pad 104, the polishing rate is so low as about 15 nm/min.

In contrast to this, in Example 1, in which the film-to-be-polished with both the polishing slurry and the deionized water being supplied onto the polishing pad 104, the polishing rate is so high as about 140 nm/min. That is, in Example 1, the film-to-be-polished can be polished at a polishing rate about 10 times a polishing rate of Control 1.

Based on the above, the film-to-be-polished is polished with both the polishing slurry and the deionized water being supplied onto the polishing pad 104, whereby the surface of the film-to-be-polished can be polished at a very high polishing rate.

Figure 8:
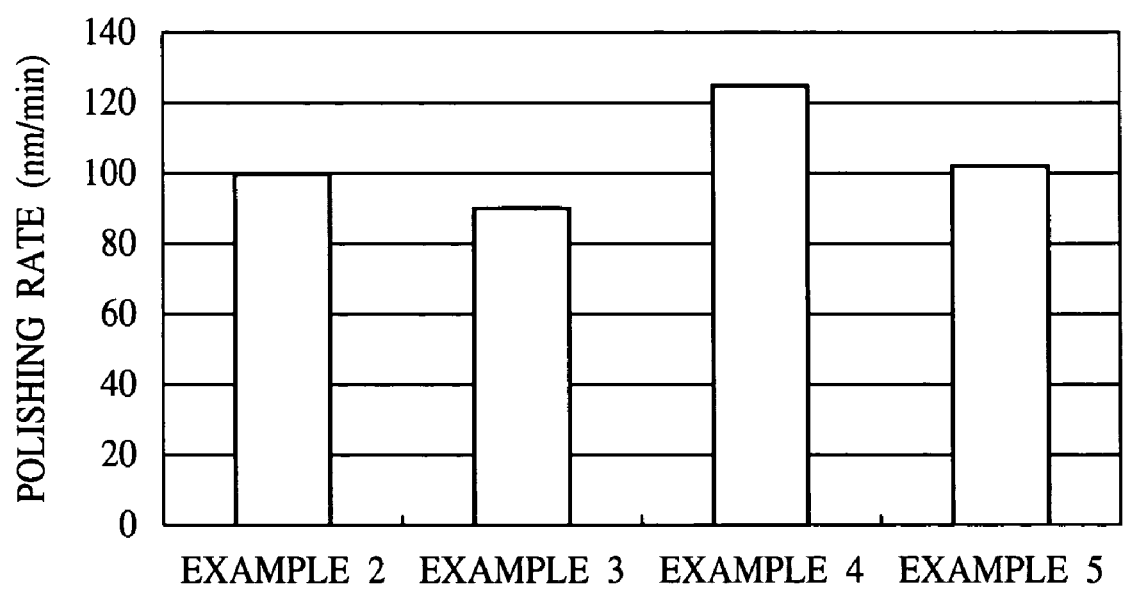
FIG. 8 is a graph of polishing rates of the film-to-be-polished with positions for the polishing slurry to be supplied to and positions for the deionized water to be supplied to suitably changed.

FIG. 8 is a graph of rates of polishing the films-to-be-polished with positions for the polishing slurry to be supplied to and positions for the deionized water to be supplied to suitable changed. FIGS. 9A to 10B are conceptual views of the positions for the polishing slurry to be supplied to and the positions for the deionized water to be supplied to.

Figure 9A:
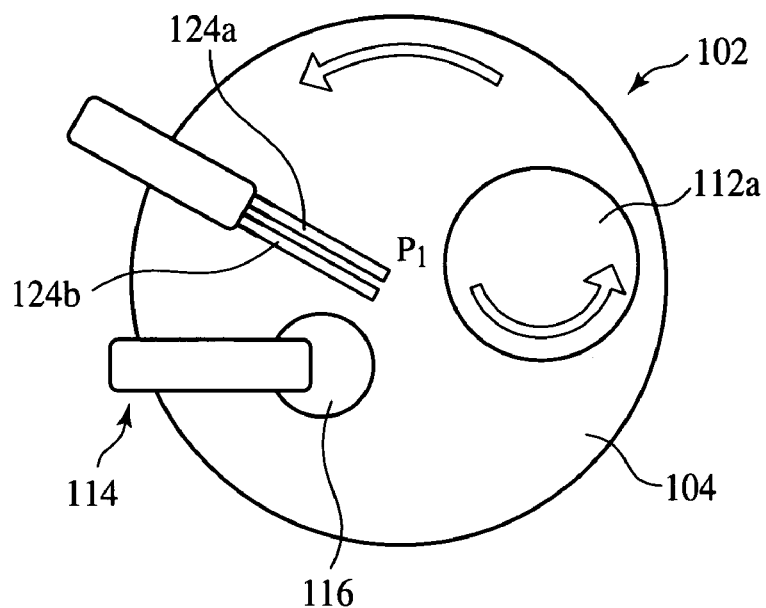

Example 2 indicates the polishing rate of the case shown in FIG. 9A where both the polishing slurry and the deionized water are supplied to the central position $P_1$ of the polishing pad 104.

Figure 9B:
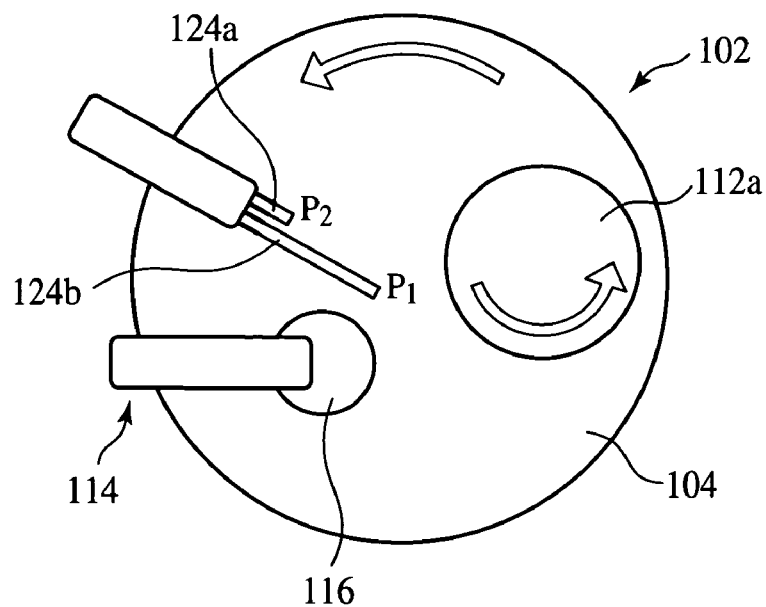

Example 3 indicates the polishing rate of the case shown in FIG. 9B where the polishing slurry is supplied to the position $P_2$ at a 12.5 cm-distance from the center of the polishing pad 104, and the deionized water is supplied to the central position $P_1$ of the polishing pad 104.

Figure 10A:
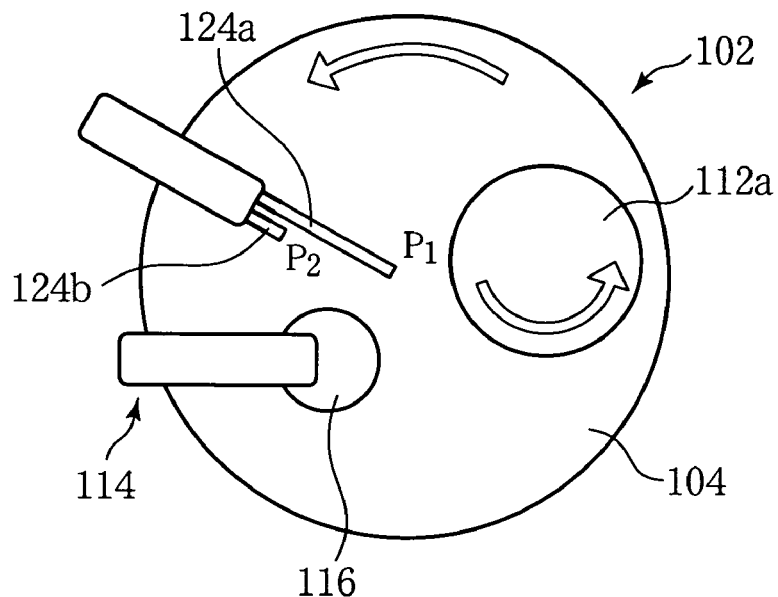

Example 4 indicates the polishing rate of the case shown in FIG. 10A where the polishing slurry is supplied to the central position $P_1$ of the polishing pad 104, and the deionized water is supplied to the position $P_2$ at a 12.5 cm-distance from the center of the polishing pad 104.

Figure 10B:
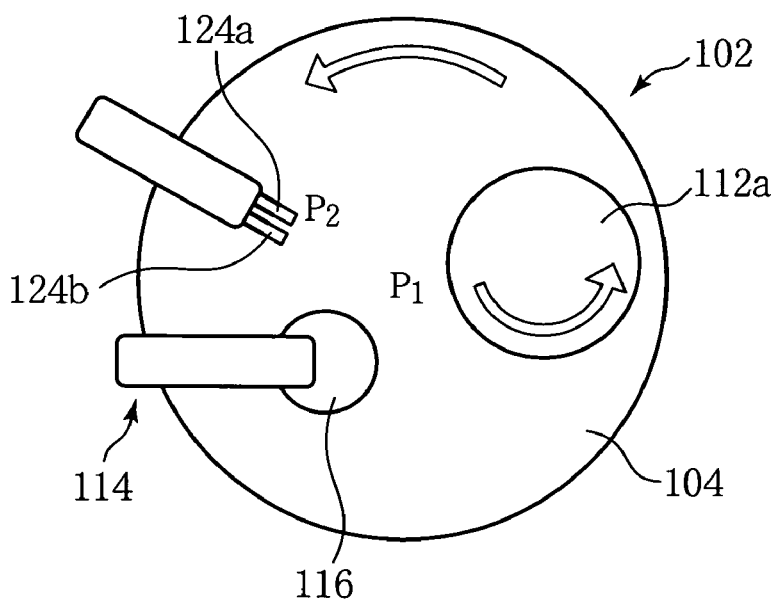

Example 5 indicates the polishing rate of the case shown in FIG. 10B where both the polishing slurry and the deionized water are supplied to the position $P_2$ at a 12.5 cm-distance from the center of the polishing pad 104.

As seen in FIG. 8, the position for the polishing slurry to be supplied to and the position for the deionized water to be supplied to are changed from each other, whereby the polishing rate can be varied. Based on this, it is found that the position for the polishing slurry to be supplied to and the position for the deionized water to be supplied to are suitably set, whereby the polishing rate can be controlled.

Figure 11:
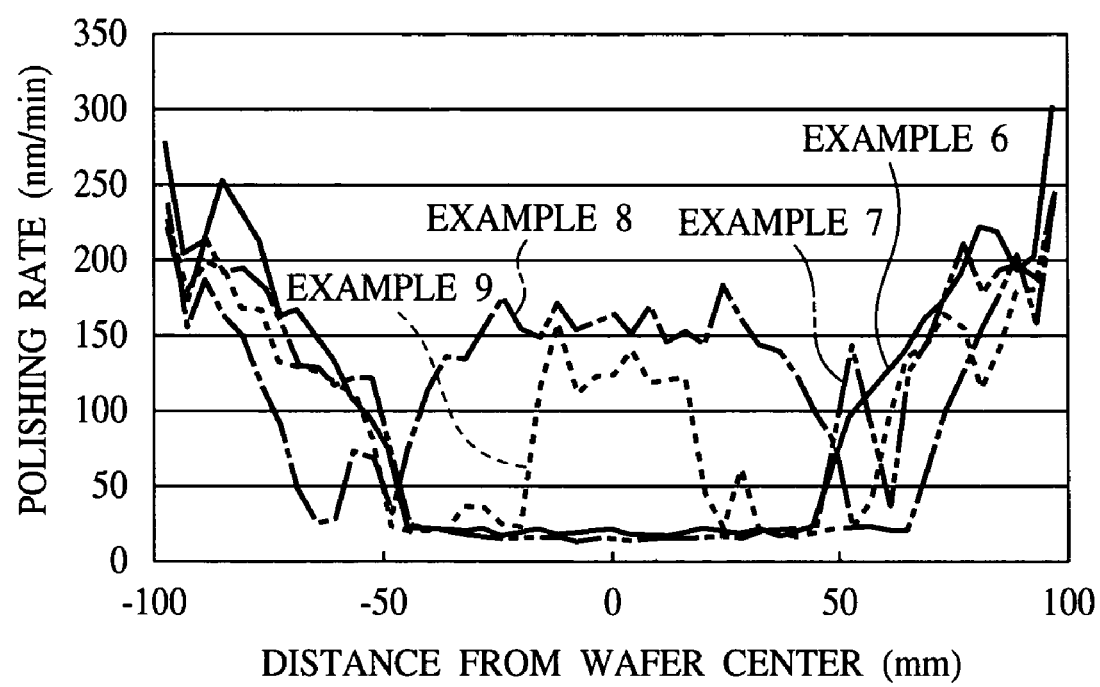
FIG. 11 is a graph (Part 1) of intra-plane distributions of the polishing rate of the film-to-be-polished with the position for the polishing slurry to be supplied to and the position for the deionized water to be supplied to suitable changed.

FIG. 11 is a graph (Part 1) of intra-plane distributions of rates of polishing the films-to-be-polished with positions for the polishing slurry to be supplied to and positions for the deionized water to be supplied to suitably changed. Distances from the centers of the wafers are taken on the horizontal axis. The rates of polishing the films-to-be-polished are taken on the vertical axis.

Example 6 indicates the case shown in FIG. 9A where both the polishing slurry and the deionized water are supplied to the central position $P_1$ of the polishing pad 104.

Example 7 indicates the case shown in FIG. 9B where the polishing slurry is supplied to the position $P_2$ at a 12.5 cm-distance from the center of the polishing pad 104, and the deionized water is supplied to the central position $P_1$ of the polishing pad 104.

Example 8 indicates the case shown in FIG. 10A where the polishing slurry is supplied to the central position $P_1$ of the polishing pad 104, and the deionized water is supplied to the position $P_2$ at a 12.5 cm-distance from the center of the polishing pad 104.

Example 9 indicates the case shown in FIG. 10B where both the polishing slurry and the deionized water are supplied to the position $P_2$ at a 12.5 cm-distance from the center of the polishing pad 104.

As seen in FIG. 11, in Examples 6 and 7, the polishing rate is relatively higher in the region outer of the center of the wafer by 5 cm and more and is relatively low at the central part of the wafer.

In Example 8, the polishing rate is relatively higher in the region outer of the center of the wafer by 7 cm or more, relatively low in the region which is 5-7 cm away from the center of the wafer and relatively high within 5 cm from the center of the wafer.

In Example 9, the polishing rate is relatively low in the region outer of the center of the wafer by 5 cm or more, relatively low in the region 2-5 cm away from the center of the wafer and relatively high within 2 cm from the center of the wafer.

Based on the above, it is found that the position for the polishing slurry to be supplied to and the position for the deionized water to be supplied to are suitably set, whereby the intra-plane distribution of the rate of polishing the film-to-be-polished can be suitably set.

Figure 12:
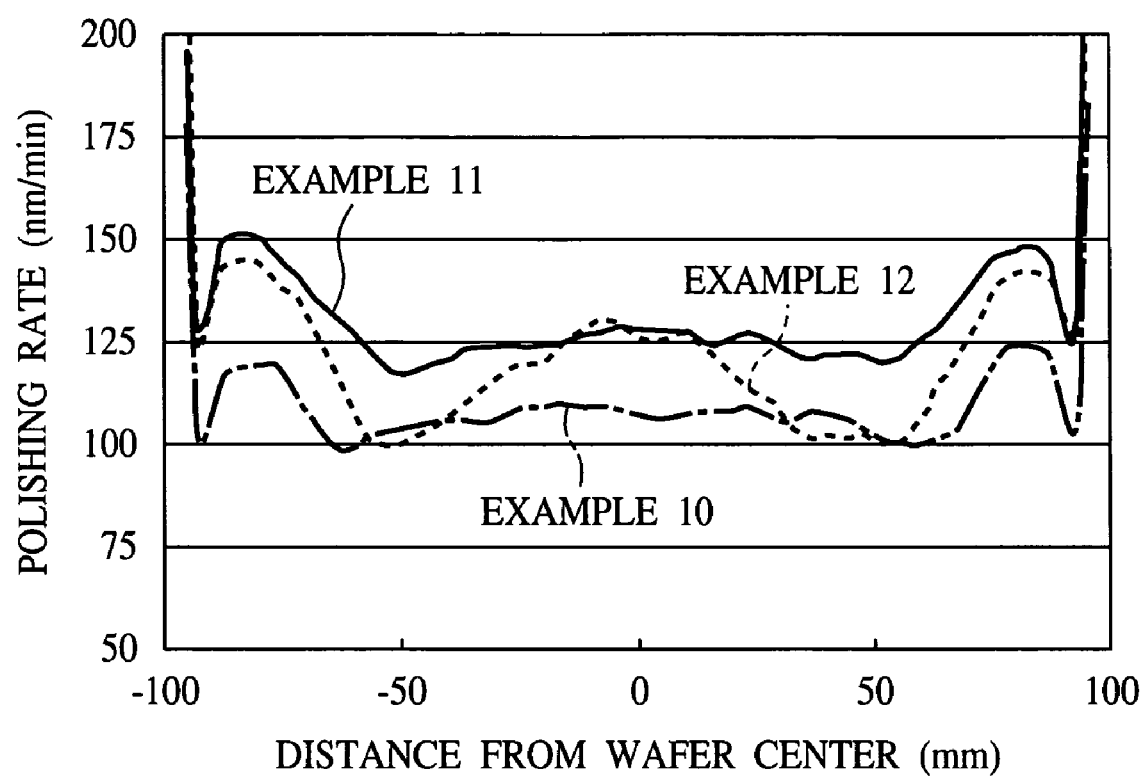
FIG. 12 is a graph (Part 2) of intra-plane distributions of the polishing rate of the film-to-be-polished with the position for the polishing slurry to be supplied to and the position for the deionized water to be supplied to suitable changed.
Figure 13A:
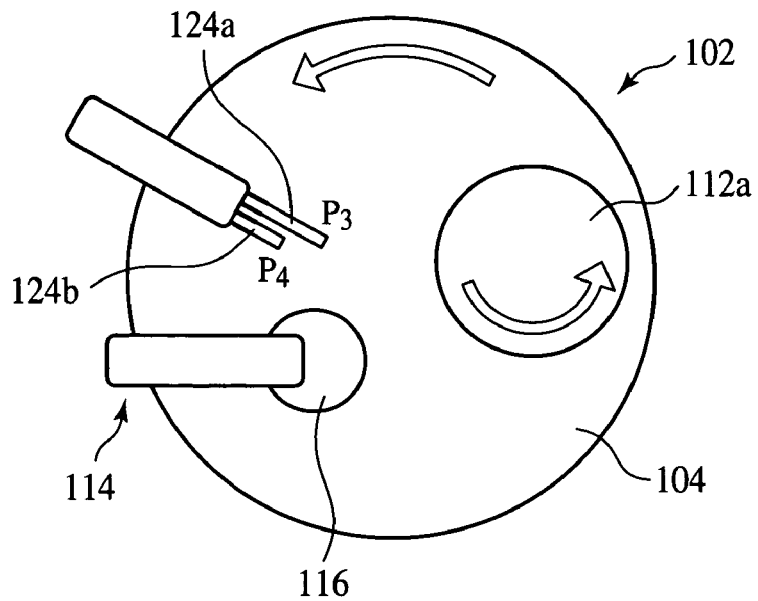
Figure 13B:
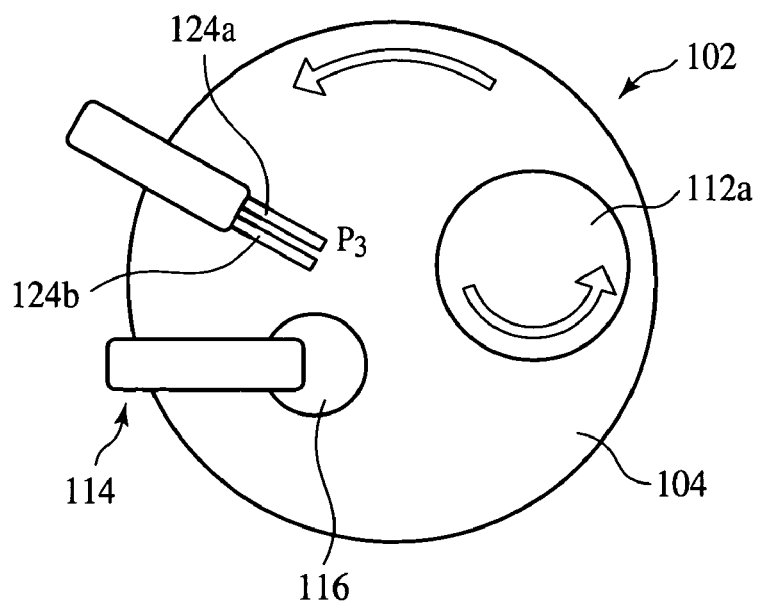
Figure 14:
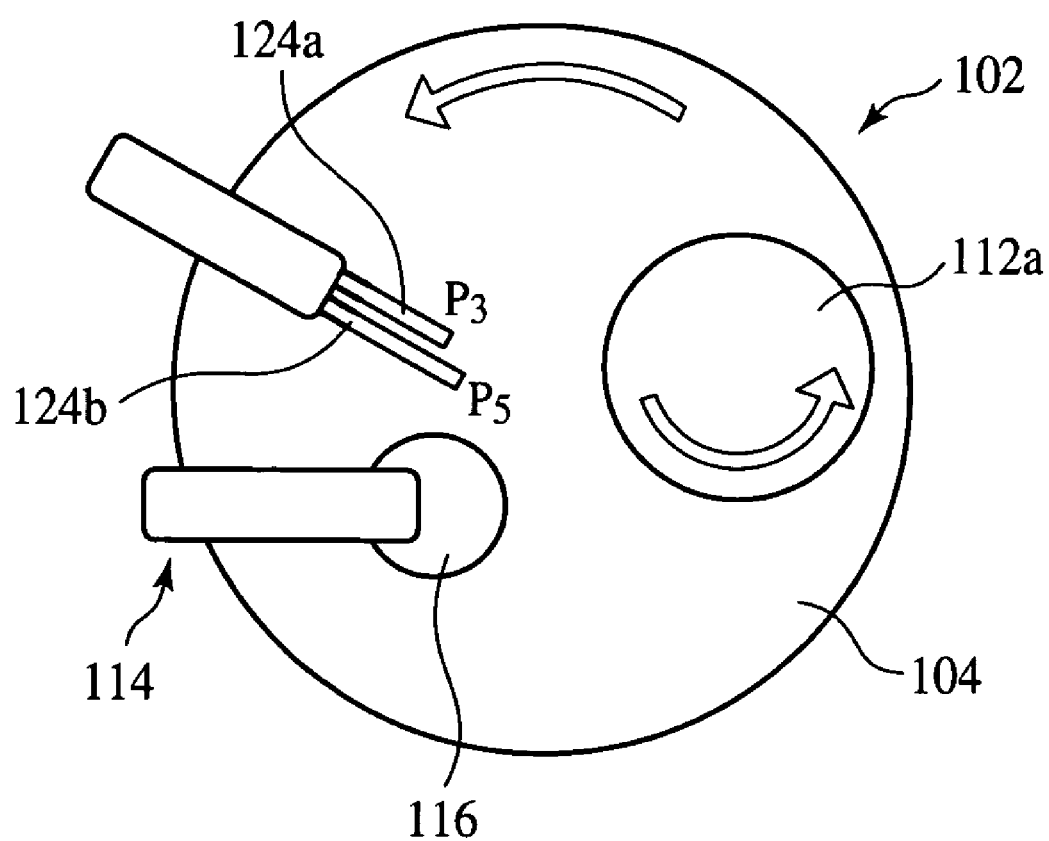

FIG. 12 is a graph (Part 2) of intra-plane distributions of the rate of polishing the films-to-be-polished with the position for the polishing slurry to be supplied to and the position for the deionized water to be supplied to suitable changed. Distances from the centers of wafers are taken on the horizontal axis. Rates of polishing the films-to-be-polished are taken on the vertical axis. In any case, the position for the polishing slurry to be supplied to is $P_3$ which is at a 6.9 cm-distance from the center of the polishing pad 104. FIGS. 13A to 14 are conceptual views showing the positions for the polishing slurry to be supplied to and the positions for the deionized water to be supplied to.

Example 10 indicates the case where the deionized water is supplied outer of the position for the polishing slurry to be supplied to. Specifically, as shown in FIG. 13A, the deionized water was supplied to the position $P_4$ at a 9.4 cm-distance from the center of the polishing pad 104.

Example 11 indicates the case where the deionized water was supplied to the position for the polishing slurry to be supplied to. Specifically, as shown in FIG. 13B, the deionized water was supplied to the position $P_3$ which is 6.9 cm-distance from the center of the polishing pad 104.

Example 12 indicates the case where the deionized water was supplied inner of the position for the polishing slurry to be supplied to. Specifically, as shown in FIG. 14, the deionized water was supplied to the position $P_5$ which is 4.4 cm-distance form the center of the polishing pad.

As seen in FIG. 12, in Examples 10 and 11, the intra-plane distributions of the rates of polishing the films-to-be-polished are relatively uniform. The relatively uniform intra-plane distributions obtained in Examples 10 and 11 will be because the polishing slurry and the deionized water are relatively homogeneously mixed.

On the other hand, in Example 12, the intra-plane distribution of the rate of polishing the film-to-be-polished had relatively high polishing rates near the center of the wafer and near the peripheral part, and relatively low polishing rates in the region between the center of the wafer and the periphery of the wafer. Such intra-plane distribution in Example 12 will be because the polishing slurry and the deionized water are mixed relatively inhomogenously.

Based on the above, it can be found that the position for the deionized water to be supplied to is set at the position for the polishing slurry to be supplied to or outer of the position for the polishing slurry to be supplied to, whereby the intra-plane distribution of the rate of polishing the film-to-be-polished can be made relatively uniform.

Figure 15:
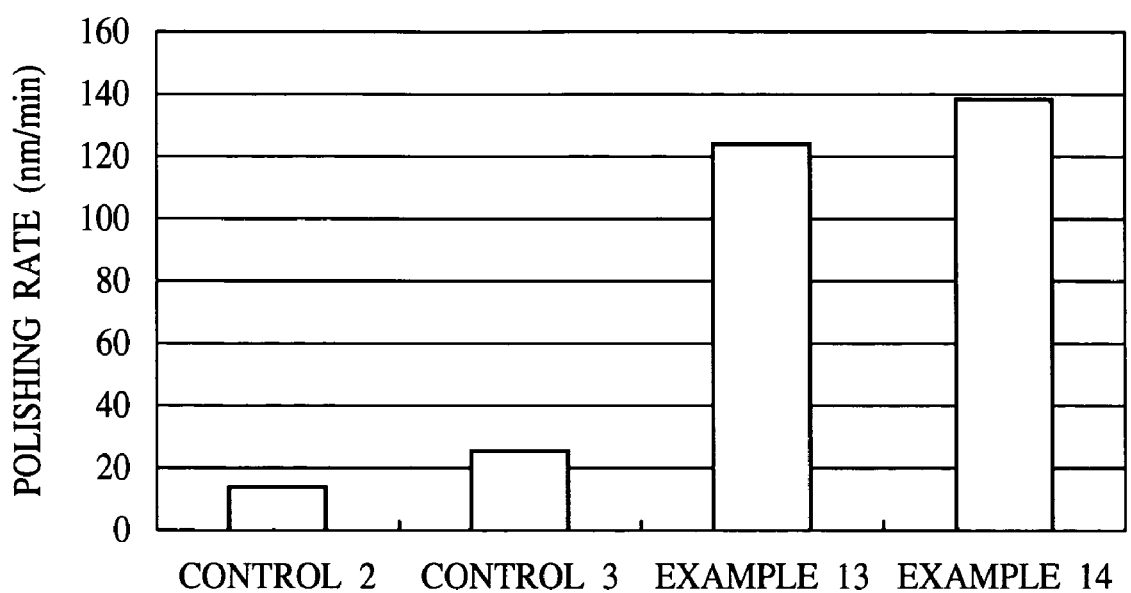
FIG. 15 is a graph of polishing rates of the film-to-be-polished with the supply amount of the polishing slurry and the supply amount of the deionized water changed.

FIG. 15 is a graph of polishing rates of polishing the films-to-be-polished with the supply amount of the polishing slurry and the supply amount of the deionized water changed. The position for the polishing slurry to be supplied to is the central position $P_1$ of the polishing pad 104. The position for the deionized water to be supplied to is the position $P_2$ at a 12.5 cm-distance from the center of the polishing pad 104.

Example 13 indicates the case where 0.1 liters/minute of the polishing slurry and 0.1 liters/minute of the deionized water were supplied, i.e., the supply amount ratio of the polishing slurry to the deionized water was 1:1.

Example 14 indicates the case where 0.05 liters/minute of the polishing slurry and 0.15 liters/minute of the deionized water were supplied, i.e., the supply amount ratio of the polishing slurry to the deionized water was 1:3.

Control 2 indicates the case where 0.2 liters/minute of the polishing slurry and 0 liter/minute of the deionized water were supplied, i.e., the polish was performed without the deionized water supplied and with the polishing slurry alone supplied.

Control 3 indicates the case where 0.15 liters/minute of the polishing slurry and 0.05 liters/minute of the deionized water were supplied, i.e., the supply amount ratio of the polishing slurry to the deionized water was 3:1.

As seen in FIG. 15, in Controls 2 and 3, where, i.e., the ratio of the deionized water supply to the polishing slurry supply amount is relatively low, the rate of polishing the film-to-be-polished is relatively low.

In contrast to this, in Examples 13 and 14, where, i.e., when the deionized water supply amount to the polishing slurry supply amount is relatively low, the rate of polishing the film-to-be-polished is relatively high. Specifically, in Examples 13 and 14, the polishing rates can be about 5 to 10 times the polishing rates of Controls 2 and 3.

Figure 16:
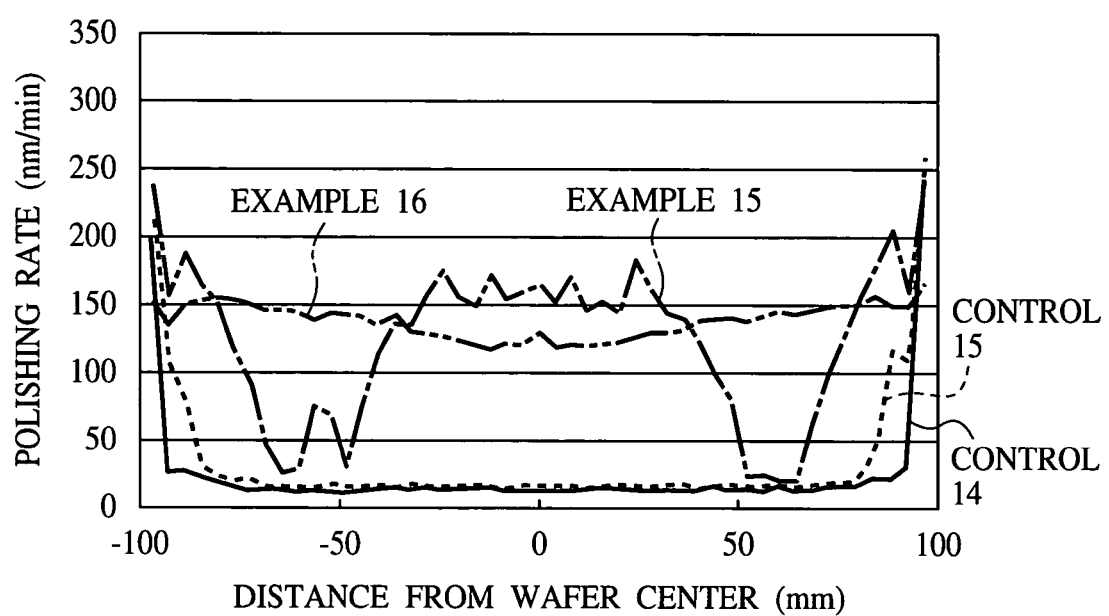
FIG. 16 is a graph (Part 1) of intra-plane distributions of polishing rates of the film-to-be-polished with the ratio between the supply amount of the polishing slurry and the supply amount of the deionized water varied.

FIG. 16 is a graph (Part 1) of intra-plane distributions of the rates of polishing the film-to-be-polished with the ratio between the supply amount of the polishing slurry and the supply amount of the deionized water varied. Distances from the center of the wafers are taken on the horizontal axis. The rates of polishing the film-to-be-polished are taken on the vertical axis. The position for the polishing slurry to be supplied to was the central position $P_1$ of the polishing pad 104. The position for the deionized water to be supplied to was the position $P_2$ at a 12.5 cm-distance form the center of the polishing pad 104.

Example 15 indicates the case where the polishing slurry supply amount was 0.1 liters/minute, and the deionized water supply amount was 0.1 liters/minute. That is, the ratio of the polishing slurry supply amount to the deionized water supply amount was 1:1.

Example 16 indicates the case where the polishing slurry supply amount was 0.05 liters/minute, and the deionized water supply amount was 0.15 liters/minute. That is, the ratio of the polishing slurry supply amount to the deionized water supply amount was 1:3.

Control 4 indicates the case where the polishing slurry supply amount was 0.2 liters/minute, and the deionized water supply amount was 0 liter/minute, i.e., for the finishing polish, the polishing slurry alone was supplied without supplying the deionized water.

Control 5 indicates the case where the polishing slurry supply amount was 0.15 liters/minute, and the deionized water supply amount was 0.05 liters/minute, i.e., the supply amount ratio of the polishing slurry to the deionized water was 3:1.

As seen in FIG. 16, in Control 4, the polishing rate is low in the region outer from the center of the wafer by 9.5 cm or more and is very low in the region inner of the center of the wafer by 9.5 cm or less.

In Control 5, the polishing rate is relatively high in the region outer of the center of the wafer by 8.5 cm or more and relatively low in the region inner of the region at a 8.5 cm-distance from the center of the wafer.

In Example 15, the polishing rate is relatively high in the region outer of the center of wafer by 7 cm or more, and is relatively low in the region at a 5-7 cm-distance from the center of the wafer, and is relatively high in the region inner of the region at 5 cm-distance from the center of the wafer.

In Example 16, the polishing rate is relatively high on the entire surface of the wafer.

Figure 17:
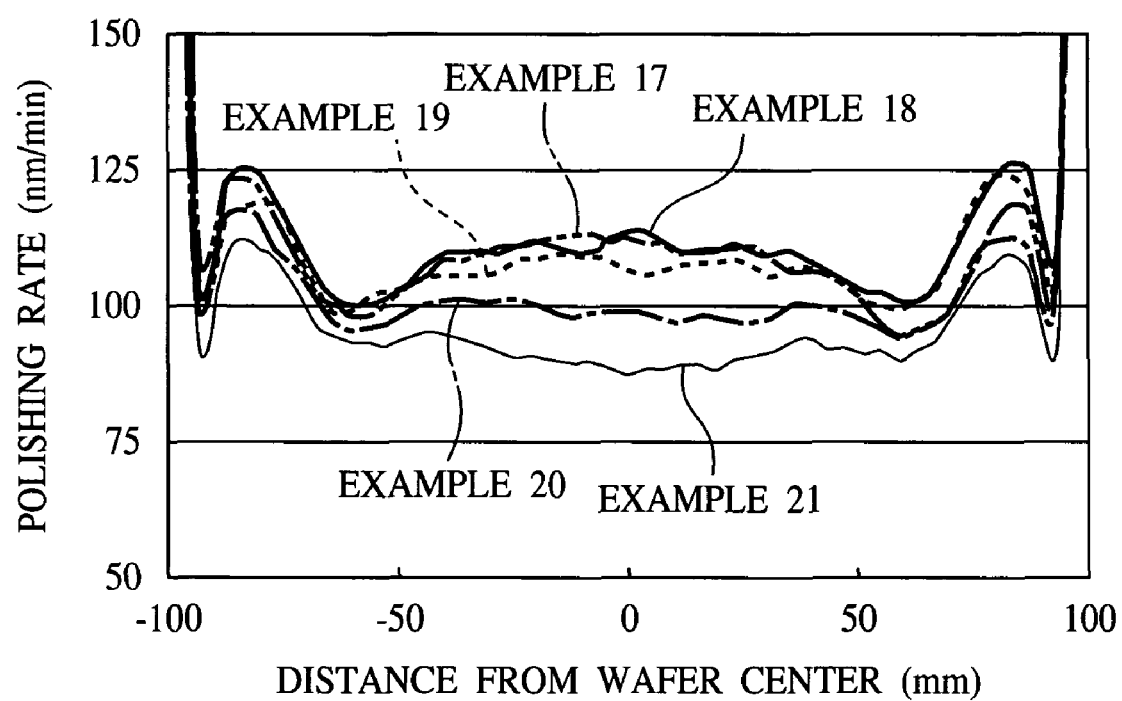
FIG. 17 is a graph (Part 2) of intra-plane distributions of polishing rates of the film-to-be-polished with the ratio between the supply amount of the polishing slurry and the supply amount of the deionized water varied.

FIG. 17 is a graph (Part 2) of distributions of the rate of polishing the film-to-be-polished with the ratio between the polishing slurry supply amount and the deionized water supply amount varied. Distances from the center of the wafer are taken on the horizontal axis. Rates of polishing the film-to-be-polished are taken on the vertical axis. The position for the polishing slurry to be supplied to is the position $P_3$ at a 6.9 cm-distance from the center of the polishing pad 104. The position for the deionized water to be supplied to is the position $P_4$ at a 9.4 cm-distance from the center of the polishing pad 104.

Example 17 indicates the case where the ratio of the polishing slurry supply amount to the deionized water supply amount was 1:2.

Example 18 indicates the case where the ratio of the polishing slurry supply amount to the deionized water supply amount was 1:2.5.

Example 19 indicates the case where the ratio of the polishing slurry supply amount to the deionized water supply amount was 1:3.

Example 20 indicates the case where the ratio of the polishing slurry supply amount to the deionized water supply amount was 1:4.

Example 21 indicates the case where the ratio of the polishing slurry supply amount to the deionized water supply amount was 1:5.

As described above with reference to FIG. 1, when the ratio of the deionized water supply amount to the polishing slurry amount supply amount is 1, i.e., in Example 15, the intra-plane distribution of the rate of polishing the film-to-be-polished was disuniform.

In contrast to this, as in Examples 17 to 21, when the ratio of the deionized water supply amount to the polishing slurry supply amount is 2 or larger, the intra-plane distribution of the rate of polishing the film-to-be-polished is relatively uniform. More specifically, when the ratio of the deionized water supply amount to the polishing slurry supply amount is about 2 to 3, as in Examples 17 to 19, the intra-plane distribution of the polishing rate can be generally relatively uniform. When the ratio of the deionized water supply amount to the polishing slurry supply amount is about 4 to 5, as in Examples 20 and 21, the polishing rate is a little lower in the region at a 50 nm or less distance from the center of the wafers.

Based on the above, it is found that the ratio of the deionized water supply amount to the polishing slurry supply amount is set at 2 or larger, whereby the intra-plane distribution of the rate of polishing the film-to-be-polished can be uniform.

Figure 18:
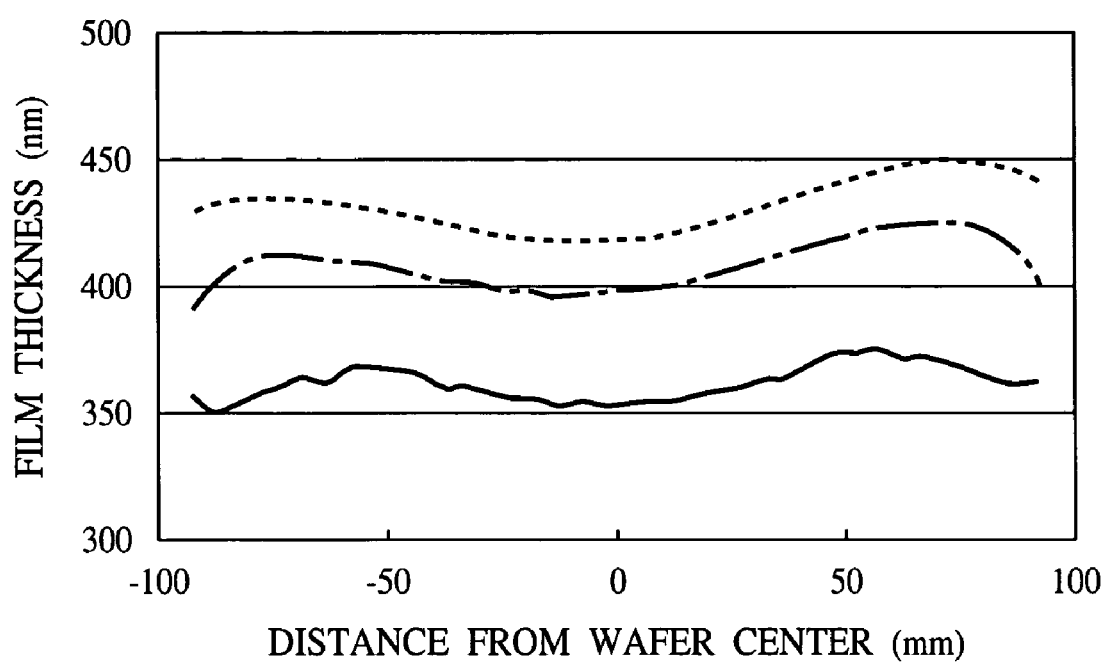
FIG. 18 is a graph of film thickness distributions of the film-to-be-polished.

FIG. 18 is a graph of film thickness distributions of the film-to-be-polished before the film-to-be-polished is polished, after the film-to-be-polished has been main-polished, and after the film-to-be-polished has been finish-polished. Distances from the center of the wafers are taken on the horizontal axis. Film thicknesses of the film-to-be-polished are taken on the vertical axis. The broken line indicates the intra-plane distribution of the film thickness of the film-to-be-polished which has been formed and is before the main-polish. The one-dot-chain line indicates the intra-plane distribution of the film thickness of the film-to-be-polished which has been main-polished and is before the finishing polish. The solid line indicates the intra-plane distribution of the film thickness of the film-to-be-polished which has been finish-polished.

When the film-to-be-polished is formed, the film-to-be-polished was formed under the following conditions. The film-to-be-polished was formed on a wafer with a 380 nm-step formed on. The film-to-be-polished was silicon oxide film. The process for forming the film-to-be-formed was CVD. The film thickness of the film-to-be-polished was 425 nm.

When the film-to-be-polished was main-polished, the main-polish was made under the following conditions. That is, the supply amount of the polishing slurry was 0.135 liters/minute. The pressure for pressing the polishing head against the polishing pad, i.e., the polishing pressure was 280 gf/cm$^2$. The rotation number of the polishing head was 142 rotations/minute. The rotation number of the polishing table was 140 rotations/minute. The finish of the main polish was detected based on a change of the drive current for the polishing table. Specifically the finish of thee polish was detected based on fact that a change of the drive current for the polishing table becomes smaller than a certain value.

When the film-to-be-polished was finish-polished, the film-to-be-polished was polished under the following conditions. That is, the ratio of the supply amount of the polishing slurry to the supply amount of the deionized water was 1:5. The supply amount of the polishing slurry was 0.05 liters/minute. The supply amount of the deionized water was 0.25 liters/minute. The position for the polishing slurry to be supplied to was the position at a 6.9 cm-distance from the center of the polishing pad 104. The position for the deionized water to be supplied to was the position at a 9.4 cm-distance from the center of the polishing pad 104. The polishing pressure was 175 gf/cm$^2$. The rotation number of the polishing head was 122 rotations/minute. The rotation number of the polishing table was 120 rotations/minute. The finish of the polish was the timing when the silicon nitride film which is the stopper film was exposed.

As indicated by the broken line in FIG. 18, the film-to-be-polished before polished has the film thickness distribution where the film thickness of the film-to-be-polished is a little smaller at the center of the wafer and the peripheral part of the wafer, and is a little larger in the region between the center of the wafer and the peripheral part thereof.

As indicated by the one-dot-chain line, the film-to-be-polished after main-polished has the film thickness distribution where the film thickness of the film-to-be-polished is relatively small in the region outer of the center of wafer by 80 mm.

As indicated by the solid line, the film-to-be-polished after finish-polished has the film thickness distribution where the film thickness of the film-to-be-polished is generally relatively uniform.

As described above, the film-to-be-polished had such relatively disuniform film thickness intra-plane distribution before polished and after main-polished, but after finish-polished, the film-to-be-polished had the relatively uniform film thickness intra-plane distribution.

Based on the above, in the finishing polish, not only the deionized water but also the polishing slurry are supplied onto the polishing pad, the position for the polishing slurry to be supplied to and the position for the deionized water to be supplied to are suitably set, and the polishing slurry supply amount and the deionized water supply amount are suitably set, whereby the intra-plane distribution of the film thickness of the film-to-be-polished after finish-polished can be made uniform.

Figure 19:
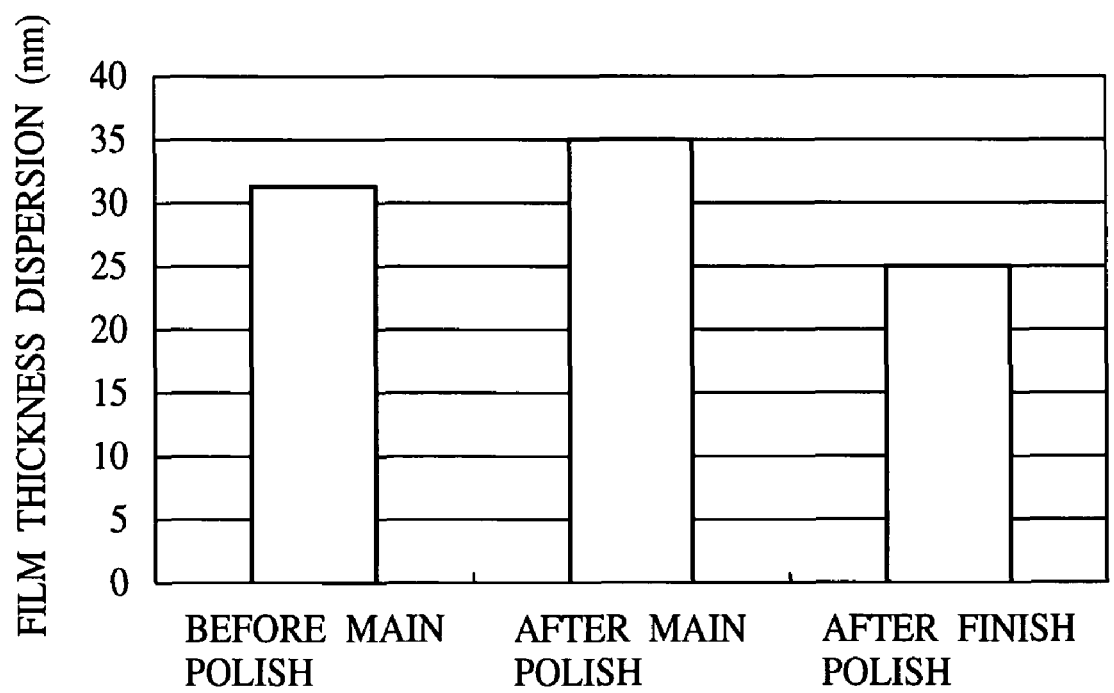
FIG. 19 is a graph of intra-plane dispersions of the film thickness of the film-to-be-polished.

FIG. 19 is a graph of wafer intra-plane dispersions of the film thickness of the film-to-be-polished before main-polished, after main-polished and after finish-polished. The wafer intra-plane dispersions of the film-thickness of the film-to-be-polished were measured at 40 positions on the wafer by an optical film thickness measuring apparatus. The dispersions were given by differences between measured maximum and minimum values of the film-to-be-polished.

As shown in FIG. 19, the film thickness intra-plane dispersion of the film-to-be-polished before polished was about 32 nm.

The film thickness intra-plane dispersion of the film-to-be-polished after main-polished was about 35 nm.

The film thickness intra-plane dispersion of the film-to-be-polished after finish-polished was about 25 nm.

As described above, the film thickness intra-plane dispersions of the film-to-be-polished are relatively large before polished and after main-polished, but after finish-polished, the film thickness intra-plane dispersion of the film-to-be-polished is relatively small.

Based on the above, it is found that in the finishing polish, not only the deionized water but also the polishing slurry are supplied onto the polishing pad, the position for the polishing slurry to be supplied to and the position for the deionized water to be supplied to are suitably set, and the polishing slurry supply amount and the deionized water supply amount are suitably set, whereby the intra-plane dispersion of the film-to-be-polished can be made small.

Figure 20:
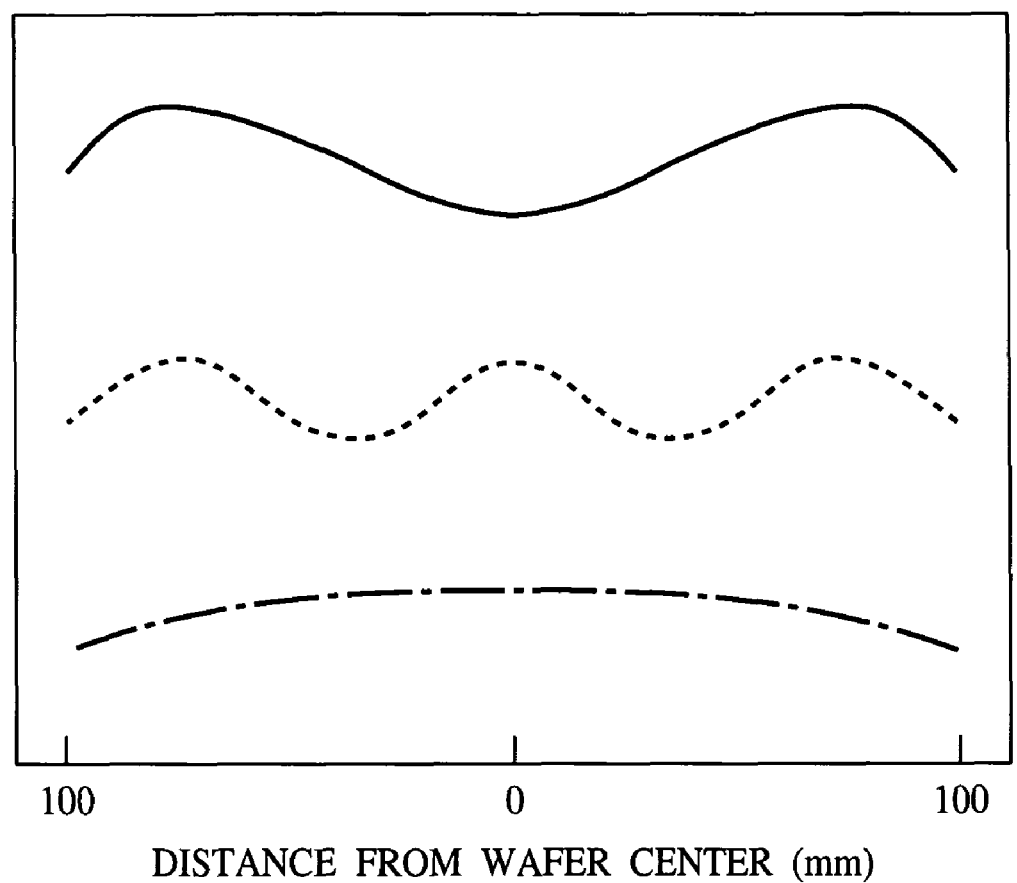
FIG. 20 is a conceptual view of intra-plane distributions of the film thickness of the film-to-be-polished before main polish.

FIG. 20 is a conceptual view of film thickness intra-plane distributions of the film-to-be-polished before main-polished.

The solid line indicates the film thickness distribution of the film-to-be-polished where the film thickness of the film-to-be-polished is larger a little inner of the peripheral part of the wafer, and the film thickness of the silicon oxide film is smaller at the center of the wafer and the peripheral part of the wafer.

The broken line indicates the film thickness distribution of the film-to-be-polished where the film thickness of the silicon oxide film is larger at the center of the wafer and a little inner of the peripheral part of the wafer and is smaller a little outer of the center of the wafer and at the peripheral part of the wafer.

The one-dot chain line indicates the film thickness distribution of the film-to-be-polished where the film thickness of the film-to-be-polished is increased gradually from the peripheral part of the wafer to the center of the wafer.

As shown in FIG. 20, before the main polish, the film thickness intra-plane distribution of the film-to-be-polished varies depending on characteristics, etc. of the film deposition system, and the film thickness of the intra-plane distribution of the film-to-be-polished after main-polished is largely influenced by the film thickness distribution of the film-to-be-polished before main-polished. Even in either of the cases, both the polishing slurry and the deionized water are supplied in the finishing polish, the position for the polishing slurry to be supplied to and the position for the deionized water to be supplied to are suitably set, and the ratio of the polishing slurry supply amount to the deionized water supply amount is suitably set, whereby the film thickness of the film-to-be-polished can be made uniform.

(Semiconductor Device Fabrication Method)

Figure 21A:
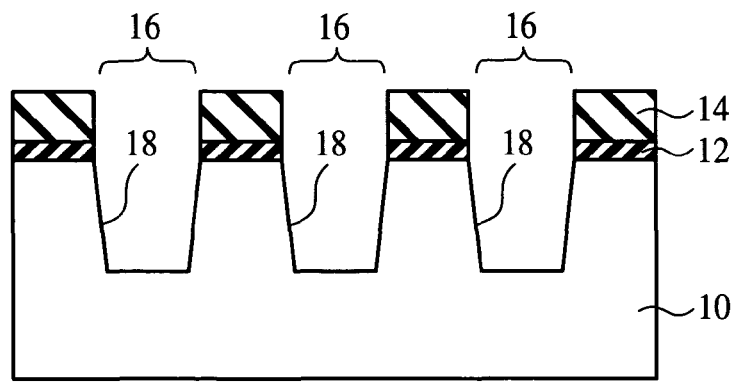
FIGS. 21A to 21C are sectional views of a semiconductor device in the steps of the semiconductor device fabrication method according to a first embodiment of the present invention (Part 1).
Figure 21B:
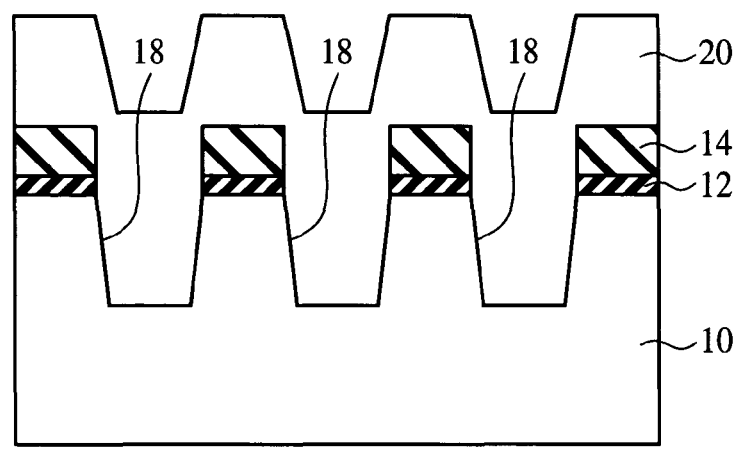
Figure 21C:
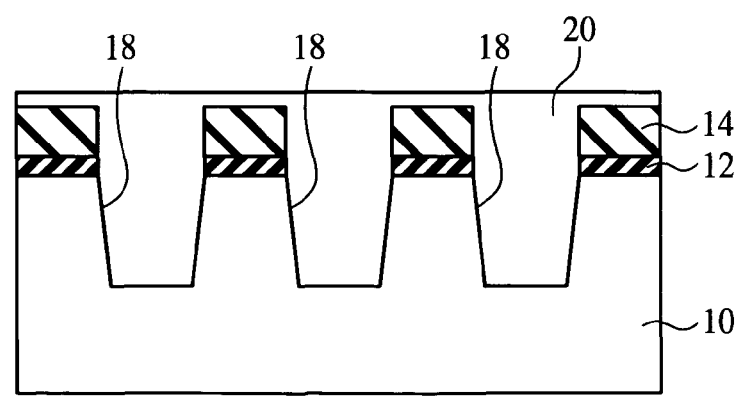

The semiconductor device fabrication method according to a first embodiment of the present invention will be explained with reference to FIGS. 21A to 23. FIG. 21A to 21C are sectional views of a semiconductor device in the steps of the semiconductor fabrication method according to the present embodiment, which show the method.

First, as shown in FIG. 21A, a semiconductor substrate 10 is prepared. The semiconductor substrate 10 is, e.g., a silicon substrate.

Then, a silicon oxide film 12 is formed on the entire surface of the semiconductor substrate 10 by, e.g., thermal oxidation. The thickness of the silicon oxide film 12 is, e.g., about 10 nm.

Next, a silicon nitride film 14 is formed on the entire surface by, e.g., CVD. The film thickness of the silicon nitride film 14 is, e.g., about 100 nm.

Then, openings 16 are formed in the silicon nitride film 14 and the silicon oxide film 12 down to the silicon substrate 10 by photolithography.

Then, with the silicon nitride film 14 with the openings 16 formed in as the mask, the semiconductor substrate 10 is anisotropically etched, and trenches 18 are formed in the semiconductor substrate 10. The depth of the trenches 18 is about, e.g., 300 nm from the surface of the silicon nitride film 14.

Then, as shown in FIG. 21B, a silicon oxide film 20 is formed on the entire surface by, e.g., high-density plasma CVD. The film thickness of the silicon oxide film 20 is, e.g., 450 nm. This, the silicon oxide film 20 is buried in the trenches 18. The silicon oxide film 20 having concavities and convexities is thus formed. The silicon oxide film 20 is to be the film-to-be-polished.

Then, the semiconductor substrate 10 is held by the polishing head 112a (see FIG. 1) with the film-to-be-polished 20 of the silicon oxide film positioned beneath.

Then, the carousel 110 is rotated counter-clockwise by about 90 degrees. Thus, the polishing head 112a supporting the semiconductor substrate 10 is positioned over the polishing table 102a with the polishing pads 104 disposed on the upper surface thereof.

Next, as shown in FIG. 21C, the film-to-be-polished 20 formed on the semiconductor substrate 10 is main-polished by CMP. The main-polish is performed as follows. That is, while the semiconductor substrate 10 is rotated by the polishing head 112a, the polishing head 112a is lowered. The surface of the film-to-be-polished is pressed against the surface of the polishing pad 104. At this time, the polishing table 102a is rotated while the polishing slurry is supplied onto the polishing pad 104 through the nozzle 124a.

The polishing conditions for the main polish are as follows.

The pressure for pressing the polishing head 112a against the polishing pad 104, i.e., the polishing pressure is, e.g., 100-500 gf/cm$^2$. The polishing pressure is, e.g., 210 gf/cm$^2$ here.

The rotation number of the polishing head 112a is, e.g., 70-150 rotations/minute. The rotation number of the polishing head is, e.g., 142 rotations/minute here.

The rotation number of the polishing table 102a is, e.g., 70-150 rotations/minute. The rotation number of the polishing table 102a is, e.g., 140 rotations/minute here.

The supply amount of the polishing slurry is within the range of, e.g., 0.1-0.3 liters. The supply amount of the polishing slurry is, e.g., 0.15 liters/minute here. The polishing slurry is supplied to, e.g., the central position P$_1$ of the polishing pad.

The polishing slurry is provided by an polishing slurry containing abrasive grains, and additive of a surfactant. The abrasive grains are, e.g., cerium oxide (ceria). The additive is, e.g., poly(ammonium acrylate). Such polishing slurries can be exemplified by polishing slurries, e.g., by EKC Technology, Inc. (Type: Micro Planer STI2100).

The finish of the main polish is detected by a change of the drive voltage or the drive current of the polishing table 102a as described above.

Figure 23:
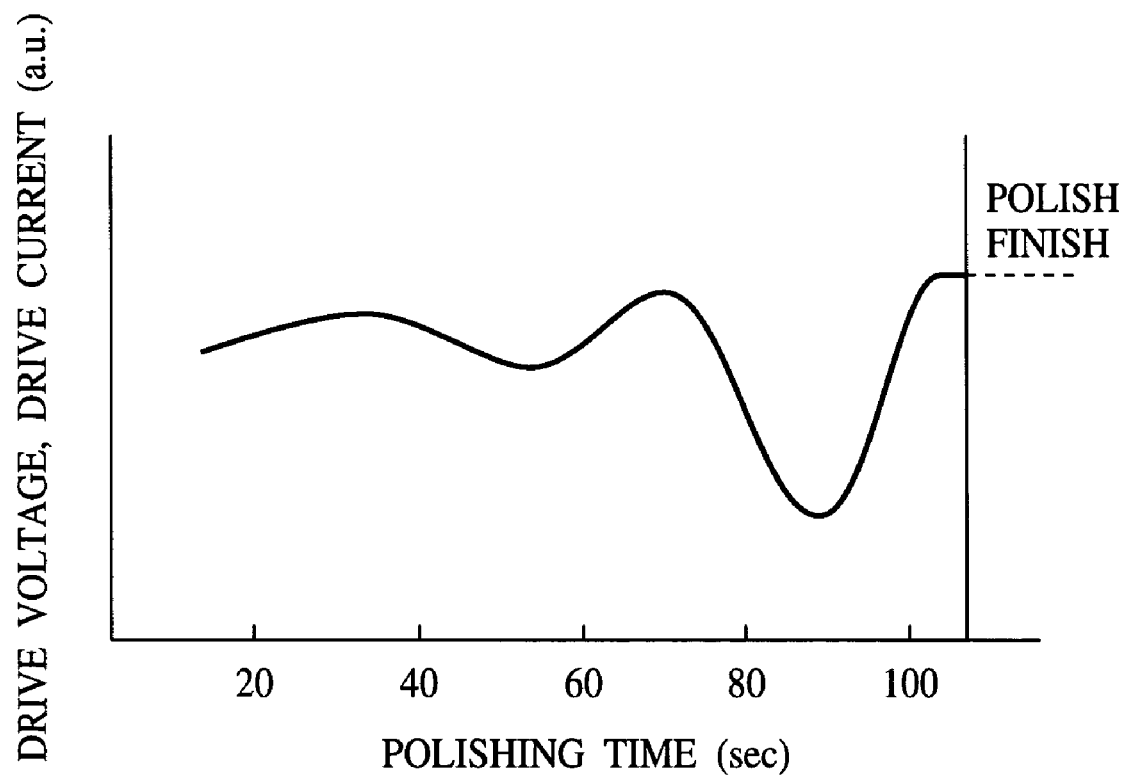
FIG. 23 is sectional views of the semiconductor device in the steps of the semiconductor device fabrication method according to the first embodiment of the present invention (Part 3).

The drive voltage or the drive current of the polishing table 102 in the main polish changes as exemplified in FIG. 23. FIG. 23 is a graph which conceptually indicates changes of the drive voltage of the polishing table. The drive current of the polishing table changes also in the same way as the drive voltage of the polishing table. When the surface of the film-to-be-polished 20 is substantially planarized, the drive voltage and the drive current of the polishing table 102a doe not substantially change as shown in FIG. 23. A change of the drive voltage or the drive current per a unit time is observed, whereby the finish can be detected. Specifically, the time when a change of the drive voltage or the drive current becomes smaller than a certain value can be the finish of the main polish.

The finish of the main polish is detected based on the drive voltage or the drive current of the polishing table 102a here. However, the method for detecting the finish of the main polish is not limited to the above, and the finish of the main polish may be detected by other methods. For example, a torque of the polishing table 102a are observed to detect the finish. Otherwise, the drive voltage, drive current, torque, etc. of the polishing head 112a may be observed to detect the finish.

Otherwise, the finish of the main polish is may be detected based on the spectral reflectance at the surface of the semiconductor substrate 10. Otherwise, the finish of the main polish is may be detected based on the reflectance of the single wavelength at the surface of the semiconductor substrate 10.

It is detected by the above-described finish detecting methods that the surface of the film-to-be-polished 20 has been planarized.

The surface of the film-to-be-polished is thus planarized, and the main polish is completed (see FIG. 21C).

The polishing pad 104 may be dressed before the main polish or in the main polish.

Conditions for dressing the polishing pad 104 are as exemplified below.

A load to be applied to the polishing pad 104a by the diamond disk 116 is, e.g., 1300-4600 gf. The rotation number of the diamond disc 116 is, e.g., 70-120 rotations/minute.

Then, the finishing polish follows. The finishing polish is performed as follows. That is, the polishing slurry is supplied onto the polishing pad 104 through the nozzle 124a while the deionized water is supplied onto the polishing pad 104 through the nozzle 124b. The polishing slurry is supplied to the central position P$_1$ of the polishing pad 104. The deionized water is supplied to the position P$_2$ at a 12.5 cm-distance from the center of the polishing pad 104. That is, a distance between the center portion of the polishing pad 104 and the position for the deionized water to be supplied to is longer than a distance between the center portion of the polishing pad 104 and the position for the polishing slurry to be supplied to. While the polishing head 112a is being rotated, the film-to-be-polished 20 is pressed against the surface of the polishing pad 104. At this time, the polishing table 102b is also rotated.

The position for the polishing slurry to be supplied to and the position for the deionized water to be supplied to are not limited to the above and may be suitably set.

It is possible that the surface of the film-to-be-polished 20 is polished with a mixture of the polishing slurry and the deionized water being supplied onto the polishing pad 104.

Conditions for making the finishing polish are set as exemplified below.

The polishing pressure is within the range of, e.g., 100-500 gf/cm$^2$. The polishing pressure is, e.g., 210 gf/cm$^2$ here.

The rotation number of the polishing head 112a is within the range of, e.g., 70-150 rotations. The rotation number of the polishing head is, e.g., 122 rotations/minute.

The rotation number of the polishing table 102a is within the range of, e.g., 70-150 rotations/minute. The rotation number of the rotation table 102a is, e.g., 120 rotations/minute.

The supply amount of the polishing slurry to be supplied onto the polishing pad 104 is within the range of, e.g., 0.05-0.3 liters/minute. The supply amount of the polishing slurry is, e.g., 0.05 liters/minute here.

The supply amount of the deionized water to be supplied onto the polishing pad 104 is within the range of, e.g., 0.05-0.3 liters/minute. The supply amount of the deionized water is, e.g., 0.15 liters/minute.

The finishing polish period of time is, e.g., about 60 seconds.

The conditions for making the finishing polish are not limited to the above and may be suitably set.

Figure 22A:
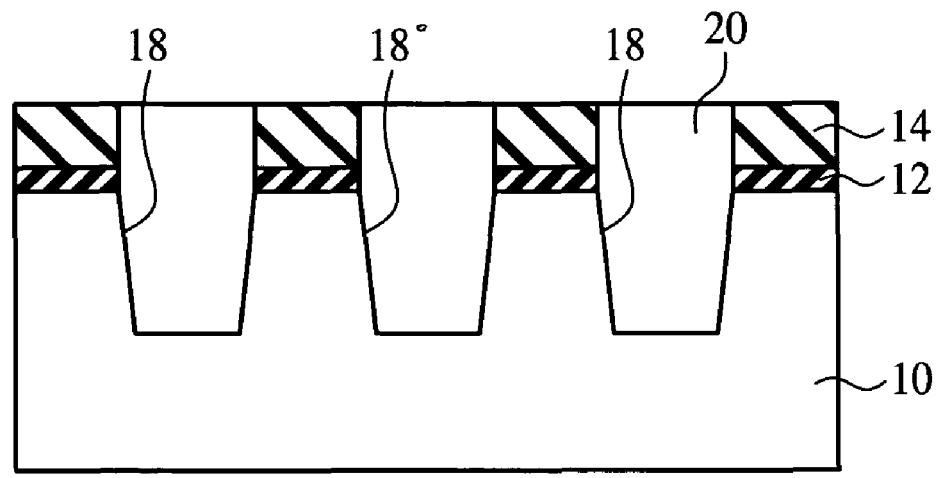
FIGS. 22A and 22B are sectional views of the semiconductor device in the steps of the semiconductor device fabrication method according to the first embodiment of the present invention (Part 2).

Thus, the silicon oxide film 20 on the silicon nitride film 14 is removed, and the finishing polish is completed (se FIG. 22A).

Figure 22B:
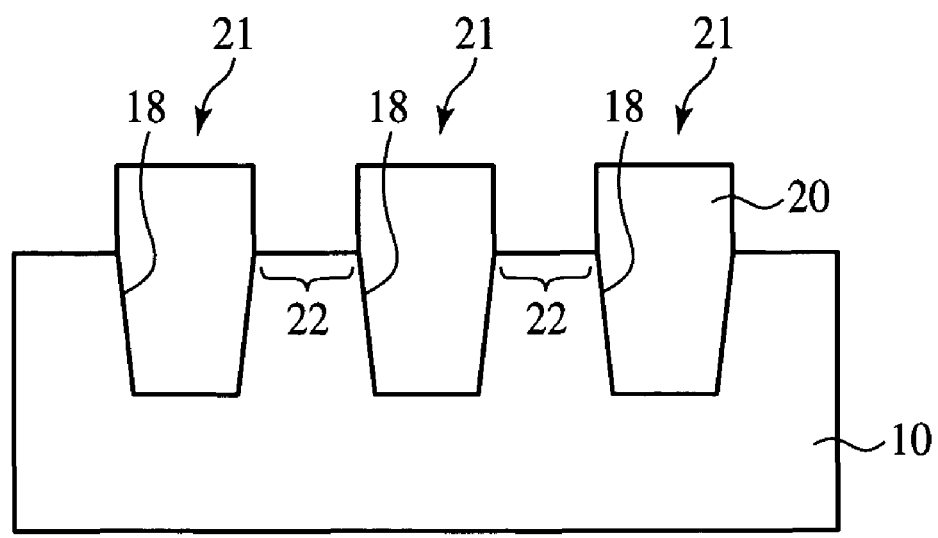

Then, as shown in FIG. 22B, the silicon nitride film 14 and the silicon oxide film 12 are etched off. Device regions 22 are defined by the device isolation regions 21 of the silicon oxide film 20 buried in the trenches 18.

Then, transistors, etc. (not shown) are formed in the device regions 22.

Thus, a semiconductor device is fabricated by the semiconductor device fabrication method according to the present embodiment.

As described above, according to the present embodiment, in the finishing polish, not only the deionized water but also the polishing slurry are supplied onto the polishing pad, the position for the polishing slurry to be supplied to and the position for the deionized water to be supplied to are suitably set, and the ratio of the polishing slurry supply amount to the deionized water supply amount is suitably set, whereby the film thickness intra-pane distribution of the film-to-be-polished as finish-polished can be made uniform.

Modifications

Figure 24A:
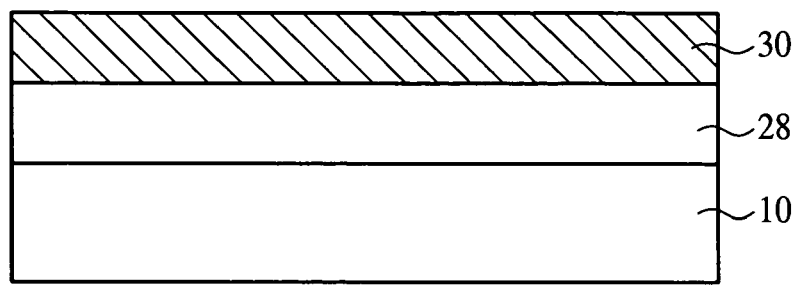
FIGS. 24A to 24C are sectional views of a semiconductor device in the steps of the semiconductor device fabrication method according to a modification of the first embodiment of the present invention (Part 1).

Then, a modification of the semiconductor device fabrication method according to the present embodiment will be explained with reference to FIGS. 24A to 25. FIGS. 24A to 25 are sectional views of a semiconductor device in the steps of the semiconductor device fabrication method according to the present modification, which explain the modification.

First, as shown in FIG. 24A, an inter-layer insulation film 28 is formed on a semiconductor substrate 10 with transistors (not shown), etc. formed on.

Then, a layer film 30 is formed on the entire surface. The layer film 30 is to be a material of an interconnection. The layer film 30 can be formed by sequentially laying, e.g., a 5 nm-thickness Ti film, a 50 nm-thickness TiN film, a 300 nm-thickness Al film, a 5 nm-thickness Ti film and a 80 nm-thickness TiN film.

Figure 24B:
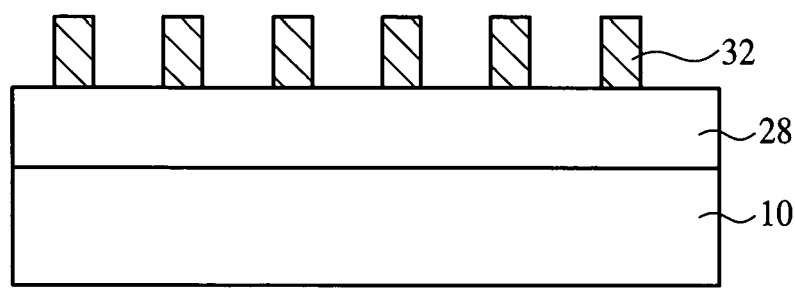
Figure 25:
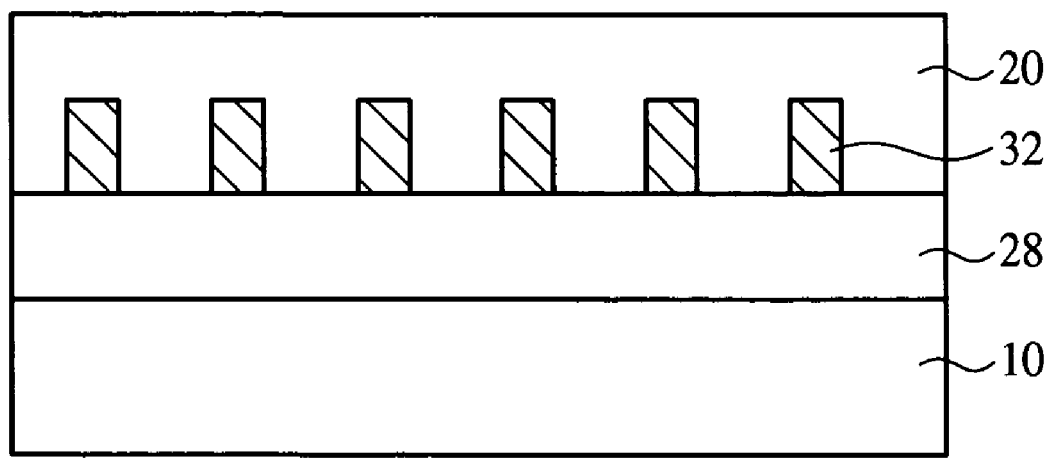
FIG. 25 is sectional views of the semiconductor device in the steps of the semiconductor device fabrication method according to the modification of the first embodiment of the present invention (Part 2).

Then, as shown in FIG. 24B, the layer film 30 is patterned by photolithography. Thus, a plurality of interconnections 32 of the layer film 30 are formed.

Figure 24C:
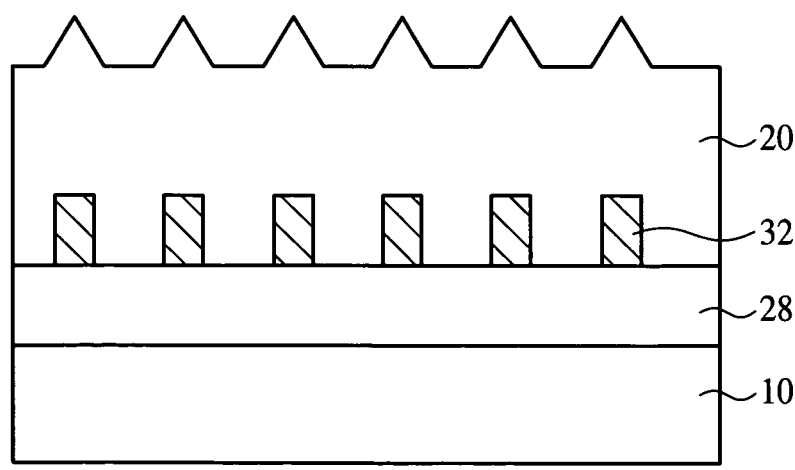

Then, as shown in FIG. 24C, a silicon oxide film 20 is formed on the entire surface by, e.g., high-density plasma CVD. The film thickness of the silicon oxide film 20 is, e.g., about 700 nm. The silicon oxide film 20 is to be the film-to-be-polished.

Then, the film-to-be-polished 20 of the silicon oxide film is main-polished and finish-polished. Methods for main-polishing and finish-polishing the film-to-be-polished may be the same as in the semiconductor device fabrication method described above with reference to FIGS. 21C and 22A.

Then, as shown in FIG. 25, a semiconductor device including the film-to-be-polished 20 whose surface is planarized is fabricated.

As described above, the film-to-be-polished 20 may be the film-to-be-polished 20 formed on the interconnections 32.

A Second Embodiment

The semiconductor device fabrication method according to a second embodiment will be explained with reference to FIG. 21A to 21C and FIGS. 26 to 32. The same members of the present embodiment as those of the semiconductor device fabrication method according to the first embodiment shown in FIGS. 1 to 25 are represented by the same reference numbers not to repeat or to simplify their explanation.

The semiconductor device fabrication method according to the present embodiment is characterized mainly in that the finish of the finish polish is detected based on the drive current, etc. of the polish table, etc., and the film-to-be-polished is polished under a relative high polishing pressure in the first stage of the main polish and then polished under a relative low polishing pressure in the second stage of the main polish.

First, in the same as in the semiconductor device fabrication method according to the first embodiment, a semiconductor substrate 10 is prepared (see FIG. 21A).

Next, in the same way as in the semiconductor device fabrication method according to the first embodiment, a silicon oxide film 12 is formed on the entire surface of the semiconductor substrate 10 by, e.g., thermal oxidation. The film thickness of the silicon oxide film 12 is, e.g., about 10 nm.

Then, in the same way as in the semiconductor device fabrication method according to the first embodiment, a silicon nitride film 14 is formed on the entire surface by, e.g., CVD. The film thickness of the silicon nitride film 14 is, e.g., about 100 nm. The silicon nitride film 14 functions as the stopper film in polishing the silicon oxide film 12, which is the film-to-be-polished.

Then, in the same way as in the semiconductor device fabrication method according to the first embodiment, openings 16 are formed in the silicon nitride film 14 and the silicon oxide film 12 down to the semiconductor substrate 10 by photolithography.

Next, in the same way as in the semiconductor device fabrication method according to the first embodiment, with the silicon nitride film 14 with the openings 16 formed in, the semiconductor substrate 10 is anisotropically etched. Thus, trenches 18 are formed in the semiconductor substrate 10. The dept of the trenches 18 is, e.g., about 380 nm from the surface of the silicon nitride film 14.

Next, in the same way as in the semiconductor device fabrication method according to the first embodiment, a silicon oxide film 20 is formed on the entire surface by, e.g., high-density plasma CVD (see FIG. 21B). The film thickness of the silicon oxide film 20 is, e.g., 425 nm. Thus, the silicon oxide film 20 is buried in the trenches 18. Thus, the silicon oxide film 20 having concavities and convexities in the surface is formed.

Next, in the same way as in the semiconductor device fabrication method according to the first embodiment, the semiconductor substrate 10 is supported by the polishing head 112a with the silicon oxide film 20, which is the film-to-be-polished, positioned underneath.

Then, in the same way as in the semiconductor device fabrication method according to the first embodiment, the carousel 110 is rotated counter-clockwise by about 90 degrees. Thus, the polishing head 112a supporting the semiconductor substrate 10 is positioned on the polishing table 102a with the polishing pad 104 disposed on the upper side.

Then, the film-to-be-polished 20 formed on the semiconductor substrate 10 is main-polished by CMP. The main polish is performed as follows. That is, while the semiconductor substrate 10 is being rotated by the polishing head 112a, the polishing head 112a is lowered to press the surface of the film-to-be-polished 20 against the surface of the polishing pad 104. At this time, while the polishing table 102a is rotated, the polishing slurry is supplied onto the polishing pad 104 through the nozzle 124a.

Conditions for the main polish are as follows.

The rotation number of the polishing head 112a is, e.g., 70-150 rotations/minute. The rotation number is, e.g., 142 rotations/minute here.

The rotation number of the polishing table 112a is, e.g., 70-150 rotations/minute. The rotation number is, e.g., 140 rotations/minute here.

The supply amount of the polishing slurry 126 is within the range of, e.g., 0.1-0.3 liters. The supply amount of the polishing slurry is 0.15 liters/minute here.

As in the first embodiment, the polishing slurry is provided by an polishing slurry containing abrasive grains, and an additive of a surfactant.

The main polish includes the first stage polish and the second stage polish. In the first stage polish, the surface of the film-to-be-polished 20 is polished under a relatively high polishing pressure, and in the second stage polish the surface of the film-to-be-polished 20 is polished under a relatively low polishing pressure. The surface of the film-to-be-polished 20 is polished under a relatively high polishing pressure in the first stage polish so that the surface of the film-to-be-polished 20 can be polished at a high rate to thereby improve the throughput. On the other hand, the surface of the film-to-be-polished 20 is polished under a relatively low polishing pressure in the second stage polish so that the polish of the film-to-be-polished 20 under a relatively low polishing pressure can sufficiently planarize the surface of the film-to-be-polished 20.

Polishing conditions other than the polishing pressure may be set different between the first stage polish and the second stage polish or the same for the first stage polish and the second stage polish.

The polishing pressure in the first stage polish is, e.g., 300-700 gf/cm$^2$. The polishing pressure of the first stage is, e.g., 420 gf/cm$^2$ here.

Figure 26:
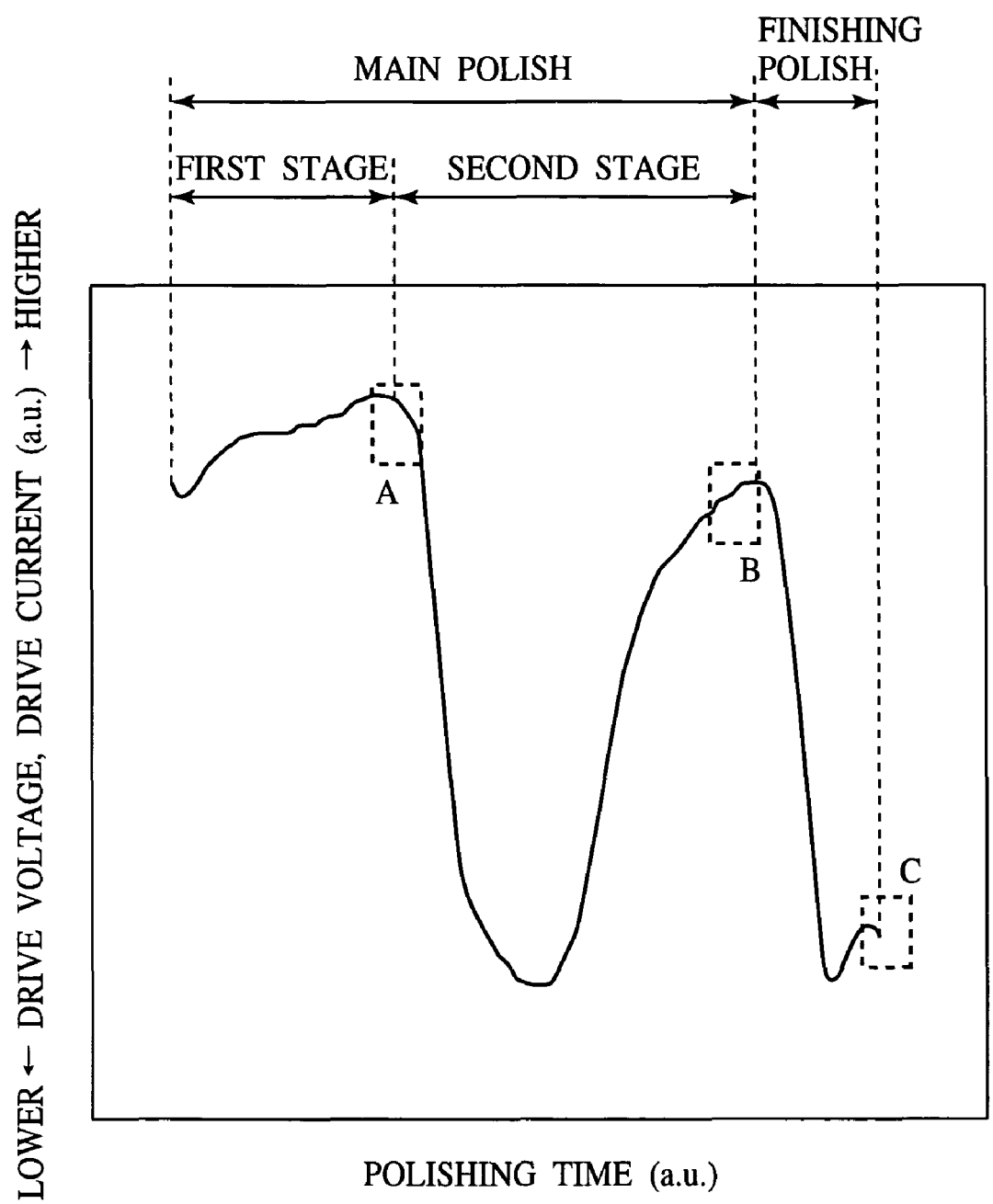
FIG. 26 is a graph of changes of the drive current of the polishing table.

FIG. 26 is a graph of drive current changes of the polishing table. Time is taken on the horizontal axis. The drive current of the polishing table is taken on the vertical axis.

As shown in FIG. 26, the drive current of the polishing table 102 gradually increases and then begins to decrease. The timing A where the drive current of the polishing table 102 begins to decrease is the finish of the first stage polish.

The polishing pressure of second stage polish is, e.g., 60-300 gf/cm$^2$. However, the polishing pressure in the second stage polish is set lower than the polishing pressure of the first stage polish. The second stage polishing pressure is, e.g., 280 gf/cm$^2$ here.

In the second stage polishing pressure, where the polish is performed under a lower polishing pressure, the drive current of the polishing table abruptly decreases. Then, the drive current of the polishing table increases, and the drive current increase of the polishing table stops. The timing B, where the drive current increase of the polishing table stops, is the finish of the second stage polish.

Thus, it is detected by the above-described finish detecting method that the surface of the film-to-be-polished 20 has been planarized.

Thus, the surface of the film-to-be-polished 20 of the silicon oxide film is planarizes, and the main polish is completed (see FIG. 21C).

Conditions for the main polish are not limited to the above and can be suitably set.

The polishing pad 104 may be dressed in the same way as in the semiconductor device fabrication method according to the first embodiment. That is, the polishing pad 104 maybe dressed before the main polish or in the main polish.

Conditions for dressing the polishing pad 104 are as exemplified below.

The load to be applied to the polishing pad 104a by the diamond disk 116 is, e.g., 1300-4600 gf. The rotation number of the diamond disk 116 is, e.g., 70-120 rotations/minutes.

Then, the finishing polish follows. The finishing polish is performed as follows. That is, the polishing slurry is supplied onto the polishing pad 104 through the nozzle 124a while the deionized water is supplied onto the polishing pad 104 through the nozzle 124b. Then, while the polishing head 112a is being rotated, the film-to-be-polished 20 is pressed against the surface of the polishing pad 104. At this time, the polishing table 102b is also rotated. Positions for the polishing slurry and the deionized water to be supplied to may be suitably set.

It is possible that the surface of the film-to-be-polished 20 is polished with a mixture of the polishing slurry and the deionized water being supplied onto the polishing pad 104.

Conditions for the finishing polish are set as exemplified below.

The polishing pressure is within the range of, e.g., 60-300 gf/cm$^2$. In the finishing polish, the film-to-be-polished 20 is polished under a polishing pressure which is lower than the polishing pressure in the second stage polish. The polishing pressure is, e.g., 175 gf/cm$^2$ here.

The supply amount of the polishing slurry to be supplied onto the polishing pad 104 is with the range of, e.g., 0.05-0.3 liters/minute. The supply amount is, e.g., 0.05 liters/minute here.

The supply amount of the deionized water to be supplied onto the polishing pad 104 is within the range of, e.g., 0.05-0.3 liters/minute. The supply amount is, e.g., 0.15 liters/minute here.

The rotation number of the polishing head and the rotation number of the polishing table may be set different between the first stage polish and the second stage polish or may be set the same.

Conditions for the finishing polish are not limited to the above and may be suitably set.

In the finishing polish, where the film-to-be-polished is polished under a polishing pressure lower than in the second polish, the drive current of the polishing table abruptly decreases. Then, the drive current of the polishing table increases, and the drive current increase of the polishing table stops. Then, the drive current of the polishing table begins to decrease. In the finishing polish, the timing C, where the drive current of the polishing table which has decreased and then increased begins to further decrease, is the finish of the polishing. The timing C, where the drive current of the polishing table which has decreased and then increased begins to further decrease, substantially agrees with the timing when the surface of the silicon nitride film 14 as the stopper film begins to be exposed, whereby the residue of the film-to-be-polished 20 in the device regions 22 can be prevented, and the occurrence of deep dishings in the surface of the buried insulation film 20 can be prevented.

Thus, the silicon oxide film 20 on the silicon nitride film 14 is removed, and the finishing polish is completed (see FIG. 22A).

The finish of the polish is detected based on the drive current of the polish table 102a here. However, the method of detecting the finish of the polish is not limited to the above, and the finish of the polish may be detected by another method. For example, the finish of the polish may be detected based on the drive voltage of the polishing table 102. The finish of the polish may be detected based on the drive voltage or the drive current of the polishing head 112a. The drive voltage of the polishing table 102, the drive voltage of the polishing head 112a and the drive current of the polishing head 112a change as does the drive current of the polishing table shown in FIG. 23, and based on the drive voltage of the polishing table 102, the drive voltage of the polishing head 112a or the drive current of the polishing head 112a, the finish of the polish can be detected in the same way.

The finish of the polish may be detected based on a torque of the polishing table 102a or the polishing head 112a.

Otherwise, the finish of the main polish or the finishing polish is may be detected based on the spectral reflectance at the surface of the semiconductor substrate 10. Otherwise, the finish of the main polish or the finishing polish is may be detected based on the reflectance of the single wavelength at the surface of the semiconductor substrate 10.

Then, as shown in FIG. 22B, the silicon nitride film 14 and the silicon oxide film 12 are etched off. Device regions 22 are defined by the device isolation regions 21 of the silicon oxide film 20 buried in the trenches 18.

Then, transistors, etc. (not shown) are formed in the device regions 22.

Thus, a semiconductor device is fabricated by the semiconductor device fabrication method according to the present embodiment.

Figure 27:
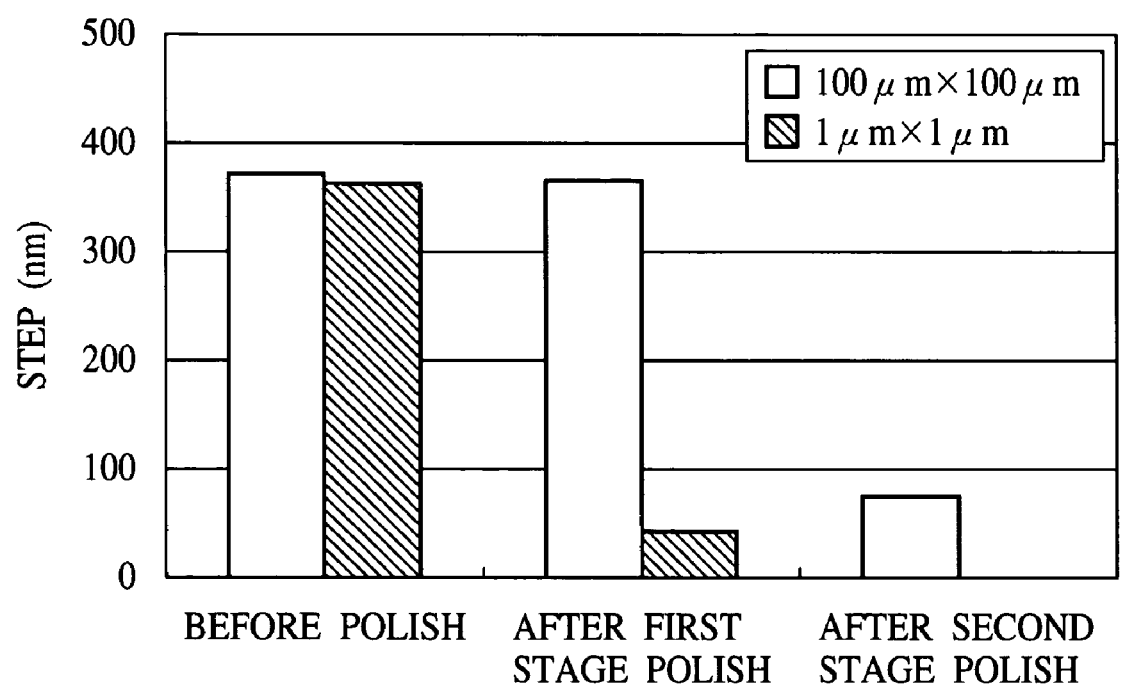
FIG. 27 is a graph of changes of steps present on the surface of the film-to-be-polished.

FIG. 27 is a graph of changes of steps present on the surface of the film-to-be-polished. FIG. 27 shows the heights of the steps present on the surface of the film-to-be-polished 20 before the first stage polish, after the first stage polish and after the second stage polish.

The step of a convexity having a relatively large area is shown without hatches. As the step of the convexity of a relatively large area, the step of a 100 μm×100 μm convexity was measured.

The step of a convexity having a relatively small area is shown with hatches. As the step of the convexity of a relatively small area, the step of a 1 μm×1 μm convexity was measured.

As seen in FIG. 27, after the first stage polish, the step of the convexity of a relatively small area is conspicuously mitigated in comparison before the first stage polish. Specifically, after the first stage polish, the step is mitigated down to about 12% of the step before the first stage polish. On the other hand, the step of the convexity of a relatively large area is not substantially mitigated.

Based on the above, it is found that the first stage polish conspicuously mitigates the step of the convexity of a relatively small area.

After the second stage polish, the step of the convexity of a relatively large area is conspicuously mitigated in comparison with after the first stage polish. Specifically, after the second stage polish, the step is mitigated down to about 20% of the step after the first stage polish.

Based on the above, it is found that the second stage polish conspicuously mitigates the step of the convexity of a relatively large area.

Figure 28:
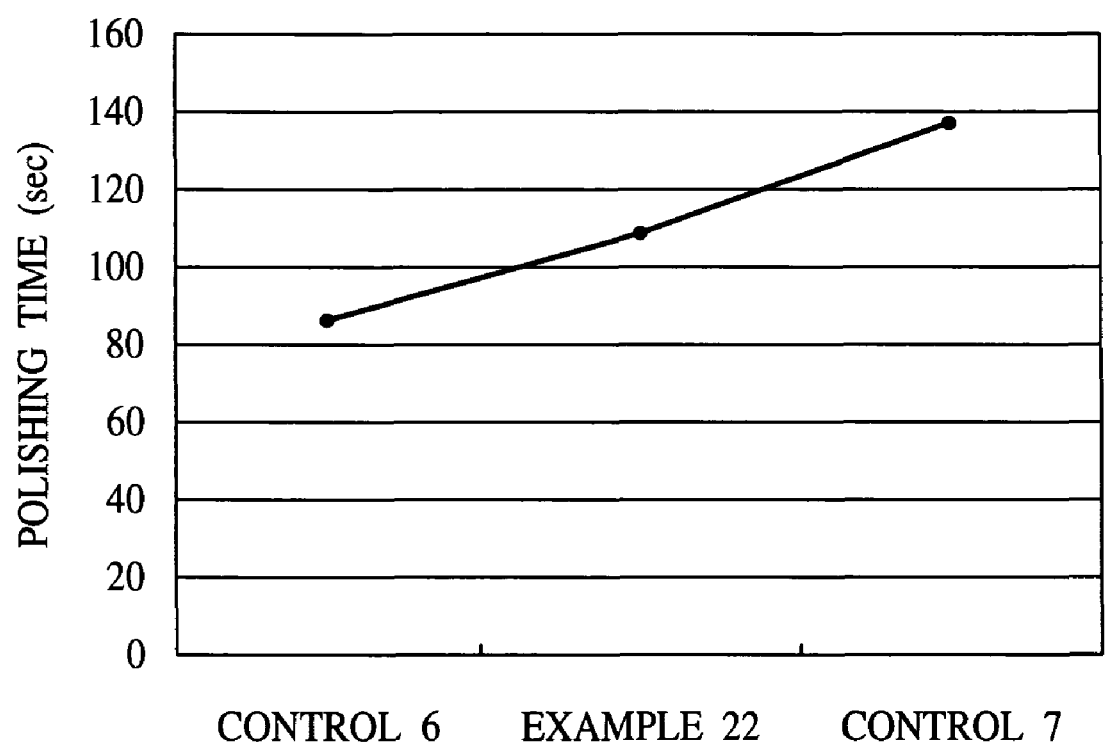
FIG. 28 is a graph of relationships between the polishing pressure and the polishing period of time of the main polish.

FIG. 28 is a graph of relationships between the polishing pressure and polishing time of the main polish.

Example 22 indicates the case of the semiconductor device fabrication method according to the present embodiment, i.e., where in the first stage polish, the film-to-be-polished is polished under a relatively high polishing pressure and is polished under a relatively low polishing pressure in the second stage polish. The polishing pressure of the first stage polish was 420 gf/cm$^2$. The polishing pressure of the second stage polish was 280 gf/cm$^2$.

Control 6 indicates the case where the polishing pressure of the main polish was not stepped, and the main polish was performed under a relatively high polishing pressure. The polishing pressure was 420 gf/cm$^2$.

Control 7 indicates the case of the proposed semiconductor device fabrication method, i.e., where the polishing pressure of the main polish is not stepped, and the main polish was performed under a relatively low polishing pressure. The polishing pressure was 280 gf/cm$^2$.

As seen in FIG. 28, in Control 6, the time of the main polish was about 87 seconds.

In control 7, the time of the main polish was about 138 seconds.

In contrast to these, in Example 22, the time of the main polish was about 110 seconds. In Example 22, the polishing time was shortened by about 28 seconds in comparison with Control 7.

Based on the above, it is found that the present embodiment can shorten the time of the main polish in comparison with the proposed semiconductor device fabrication method.

Figure 29:
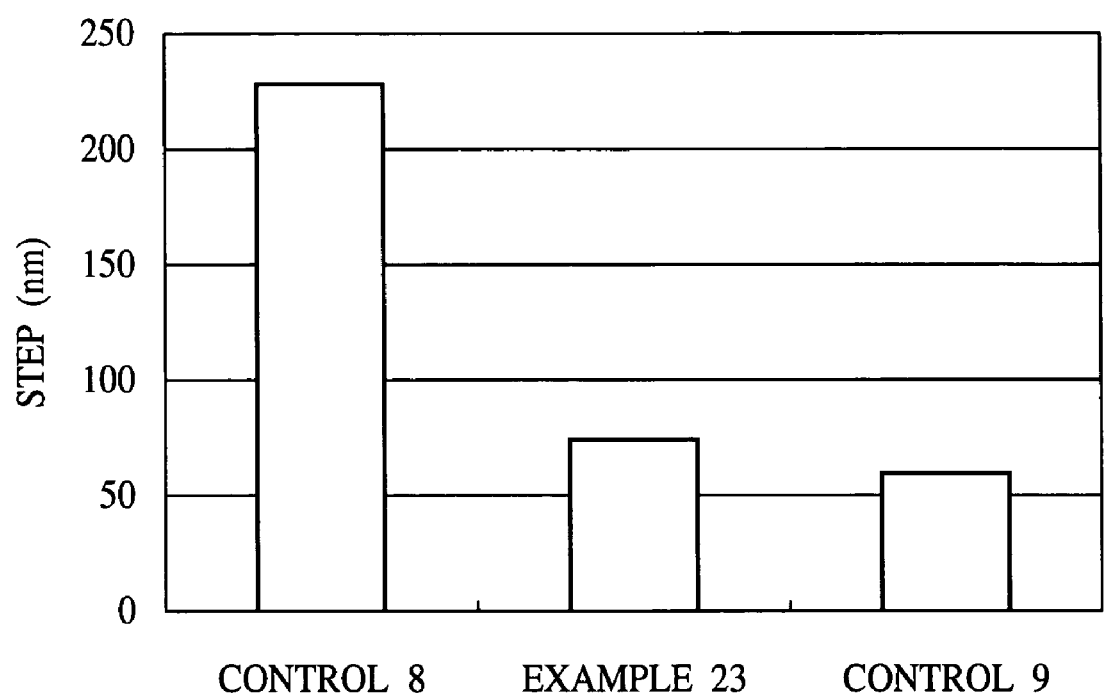
FIG. 29 is a graph of steps remaining on the surface of the film-to-be-polished as main-polished.

FIG. 29 is a graph of residual steps on the surface of the film-to-be-polished after main-polished.

Example 23 indicates the case of the semiconductor device fabrication method according to the present embodiment, i.e., where the film-to-be-polished is polished under a relatively high polishing pressure in the first stage of the main polish and polished under a relatively low polishing pressure in the second stage of the main polish. The polishing pressure in the first stage polish was 420 gf/cm$^2$. The polishing pressure in the second stage was 280 gf/cm$^2$.

Control 8 indicates the case where the polishing pressure of the main polish was not stepped and was performed under a relatively high polishing pressure. The polishing pressure was 420 gf/cm$^2$.

Control 9 indicates the case of the proposed semiconductor device fabrication method, i.e., where the polishing pressure of the main polish was not stepped and was performed under a relatively low polishing pressure. The polishing pressure was 280 gf/cm$^2$.

As seen in FIG. 29, in Control 8, the residual step on the surface of the film-to-be-polished was about 115 nm.

In Control 9, the residual step on the surface of the film-to-be-polished was about 60 nm.

In contrast to these, in Example 23, the residual step on the surface of the film-to-be-polished was about 75 nm.

Based on the above, it is found that the present embodiment can sufficiently mitigate the step on the surface of the film-to-be-polished 20 in the main polish, as does the proposed semiconductor device fabrication method.

Figure 30:
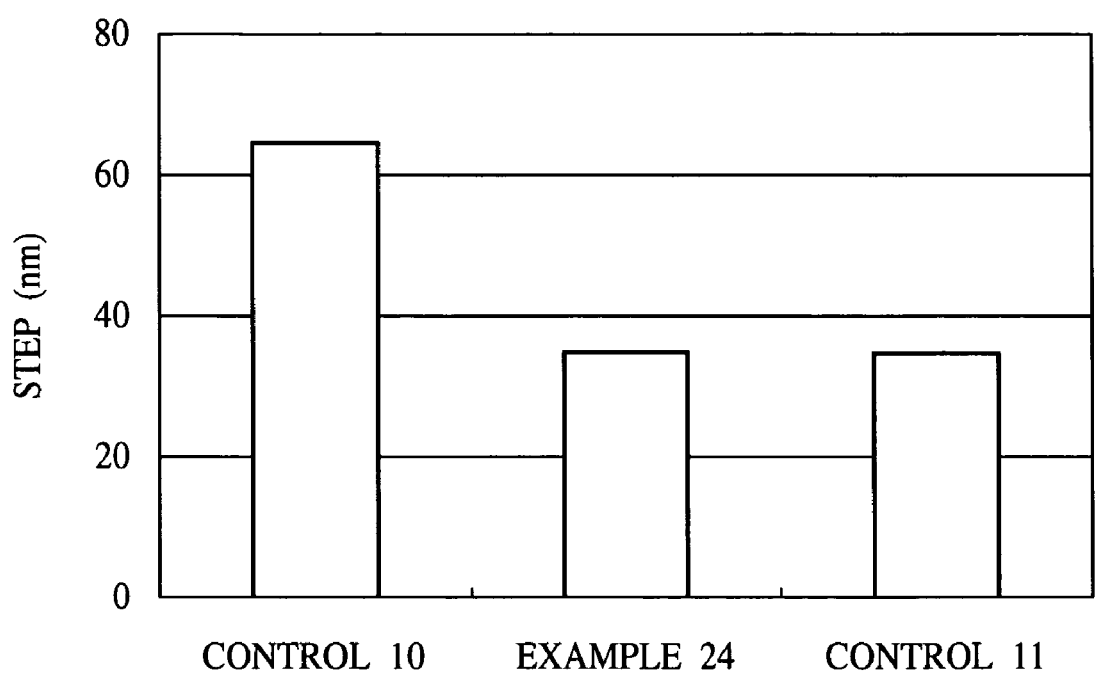
FIG. 30 is a graph of steps remaining in the chip region as main-polished.

FIG. 30 is a graph of steps remaining in chip regions after main-polished.

Example 24 indicates the case of the semiconductor device fabrication method according to the present embodiment, i.e., where the film-to-be-polished was polished under a relatively high polishing pressure in the first stage of the main polish, under a relatively low polishing pressure in the second stage of the main polish, and in the finishing polish polished under a lower polishing pressure than in the second stage of the main polish. The polishing pressure of the first stage of the main polish was 420 gf/cm². The polishing pressure of the second stage of the main polish was 280 gf/cm². The polishing pressure of the finishing polish was 175 gf/cm². In the finishing polish, the polishing slurry and the deionized water are both supplied onto the polishing pad. The supply amount of the polishing slurry was 0.05 liters/minute. The supply amount of the deionized water was 0.15 liters/minute. In the finishing polish, the timing C where the drive current of the polishing table which has decreased and then increased begins to further decrease was the finish of the polish.

Control 10 indicates the case where the polishing pressure of the main polish was not set in 2 steps and the main polish was performed under a relatively high polishing pressure. The polishing pressure was 420 gf/cm².

Control 11 indicates the case of the proposed semiconductor device fabrication method where the polishing pressure of the main polish was not set in two steps, and the main polish was performed under a relatively low polishing pressure. The polishing pressure was 280 gf/cm².

As seen in FIG. 30, in Control 10, the step in the chip was about 65 nm.

In Control 11, the step in the chip was about 37 nm.

In contrast to this, in Example 24, the step in the chip was about 37 nm.

Based on the above, it is found that the present embodiment can sufficiently mitigate the step of the intra-chip, as can the proposed semiconductor device fabrication method.

Figure 31:
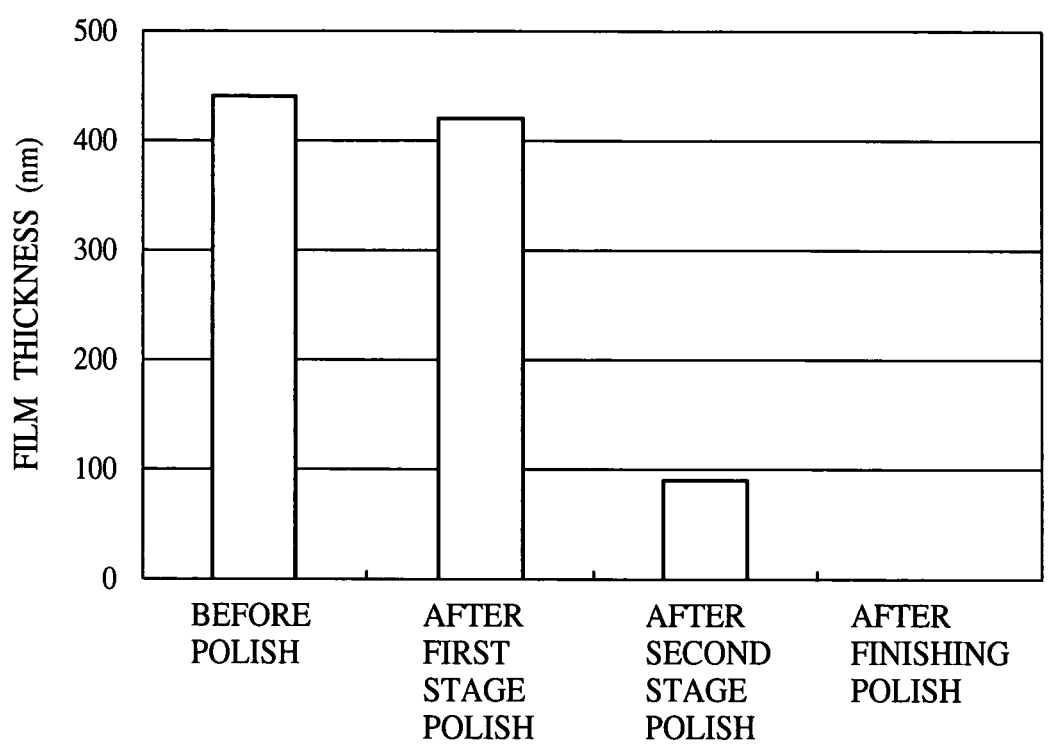
FIG. 31 is a graph of changes of the film thickness of the film-to-be-polished remaining on the device region.

FIG. 31 is a graph of film thickness changes of the film-to-be-polished remaining in the device regions. FIG. 31 shows the film thicknesses of the film-to-be-polished 20 before the first stage polish, after the first stage polish, after the second stage polish and after the finishing polish, which is remaining in the device regions 22.

As seen in FIG. 31, it is found that the film thickness of the film-to-be-polished 20 remaining in the device regions 22 gradually decreases. After the finishing polish has been completed, any of the film-to-be-polished 20 does not remain on the device regions 22. Based on this, the finish of the finishing polish is detected based on a change of the drive current or others of the polishing table 102 or others, whereby the film-to-be-polished 20 on the device regions 22 can be removed without failure.

Figure 32:
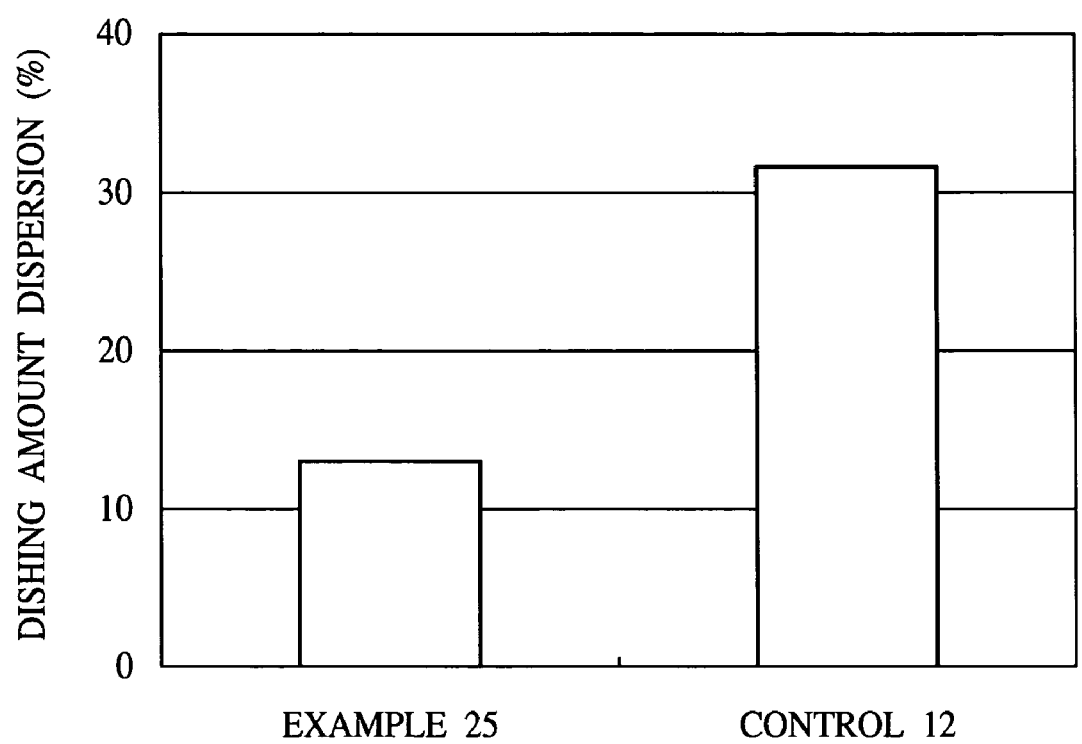
FIG. 32 is a graph of a statistically treated result of dispersions of the dishing amount among the wafers.

FIG. 32 is a graph of the result of dispersions of dishing amounts among wafers, which are statistically treated. Example 25 indicates the case of the semiconductor device fabrication method according to the present embodiment, i.e., where the finish of the finishing polish was detected based on a change of the drive current of the polishing table. Control 12 indicates the case where the finishing polish has been performed for a prescribed period of time. In Control 12, the period of time of the finishing polish was 30 seconds. Either of Example 25 and Control 12, 25 wafers were polished.

The dispersion of the dishing amount among the wafers were given as follows. That is, in 3 chips in each of the wafers, the film thickness of the buried insulation film buried in the 40 μm×40 μm trenches and the film thickness of the buried insulation film buried in the 130 μm×210 μm trenches were measured. For measuring the film thickness of the buried insulation film, an optical film thickness measuring apparatus was used. The dishing amount was given by the difference between the film thickness of the buried insulation film buried in the 40 μm×40 μm trenches and the film thickness of the buried insulation film buried in the 130 μm×210 μm trenches. The dishing amount was measured on 25 wafers at 3 positions of the respective wafers, and the dishing amounts were measured at 75 positions respectively of Example 25 and Control 12. Standard deviations were given based on 75 data of the dishing amounts. Ratios of the given standard deviations to the average film thickness were used as deviations among the wafers.

As seen in FIG. 32, it is found that in Control 12, the dispersion of the dishing amounts is as large as about 32%. Based on this, when the finishing polish is performed for a prescribed period of time, the dispersion of the dishing depth among the wafers is large.

In contrast to this, in Example 25, the dispersion of the dishing amount is as small as about 13%. Based on this, in the present embodiment, i.e., in the case where the finish of the finishing polish is detected based on a change of the drive current or others of the polishing table, the dispersion of the dishing amount among the wafers can be depressed by a half of the dispersion of the case of the proposed semiconductor device fabrication method.

Based on this, it is found that the present embodiment can suppress the dispersion of the dishing amount among the wafers.

The semiconductor device fabrication method according to the present embodiment is characterized mainly in that as described above, the finish of the finishing polish is detected based on a change of the drive current or others of the polishing table or others.

In the proposed semiconductor device fabrication method, in the finishing polish, for a prescribed period of time, the film-to-be-polished 20 is polished. Accordingly, due to dispersions, etc. of the film thickness of the film-to-be-polished 20 in the deposition process, it is often that the film-to-be-polished 20 remains on the device regions 22, or deep dishings are formed in the buried insulation film of the film-to-be-polished 20.

In contrast to this, in the present embodiment, the finish of the finishing polish is detected based on a change of the drive current or others of the polishing table 102 or others corresponding to the exposure of the stopper film 14, whereby the finish of the finishing polish can be accurately detected. Thus, the present embodiment can prevent the residue of the film-to-be-polished 20 on the device regions 22 and the occurrence of deep dishings in the surface of the buried insulation film 20 of the film-to-be-polished.

The semiconductor device fabrication method according to the present embodiment is characterized mainly in that in the first stage of the main polish, the film-to-be-polished 20 is polished under a relatively high pressure and is polished under a relatively low polishing pressure in the second stage of the main polish.

In the proposed semiconductor device fabrication method, the film-to-be-polished 20 is polished in the main polish under a relatively low polishing pressure, and the polishing period of time for the main polish is not sufficiently short.

In contrast to this, in the semiconductor device fabrication method according to the present embodiment, the film-to-be-polished 20 is polished in the first stage of the main polish under a relatively high polish pressure, and is polished in the second stage of the main polish under a relatively low polishing pressure. In the first stage polishing, the film-to-be-polished 20 is polished under a relatively high pressure, and can be polished at a relative high polishing rate. On the other hand, in the second stage polish, the film-to-be-polished 20 is polished under a relatively low polishing pressure, and the surface of the film-to-be-polished 20 can be sufficiently planarized. Thus, according to the present embodiment, the main polishing time can be shortened without impairing the planarity of the film-to-be-polished 20.

A Third Embodiment

The semiconductor device according to a third embodiment of the present invention will be explained with reference to FIGS. 33A to 37. FIGS. 33A to 35 are sectional views of a semiconductor device in the steps of the semiconductor device fabrication method according to the present embodiment, which show the method. In FIGS. 33A to 35, the chip region is shown on the left side of the drawings, and on the right side of the drawings, the scribe line region is shown. FIG. 36 is a plan view explaining the semiconductor device fabrication method according to the present embodiment. The same members of the present embodiment as those of the semiconductor device fabrication method according to the first or the second embodiment are represented by the same reference numbers not to repeat or to simplify their explanation.

The semiconductor device fabrication method according to the present embodiment is characterized mainly in that a plurality of inspection patterns of sizes different from each other are formed in advance, and based on a film thickness difference between a buried oxide film of the inspection patterns, whether or not the finishing polish has been normally performed is inspected.

A semiconductor substrate 10 is prepared (see FIG. 33A).

Next, a silicon oxide film 12 is formed on the entire surface of the semiconductor substrate 10 by, e.g., thermal oxidation. The thickness of the silicon oxide film 12 is, e.g., about 10 nm.

Then, a silicon nitride film 14 is formed on the entire surface by, e.g., CVD. The thickness of the silicon nitride film 14 is, e.g., about 100 nm. The silicon nitride film 14 functions as the stopper film in polishing the film-to-be-polished 20 of the silicon oxide film.

Then, openings 16 are formed in the silicon nitride film and silicon oxide film 12 down to the semiconductor substrate 10 by photolithography. At this time, a 40 μm×40 μm opening 16a and a 70 μm×150 μm opening 16b are formed in the scribe line. The distance between the opening 16a and the opening 16b is, e.g., 50 μm or more.

Next, with the silicon nitride film 14 with the openings 16, 16a, 16b formed in as the mask, the semiconductor substrate 10 is anisotropically etched. Trenches 18 are thus formed in the semiconductor substrate 10. The depth of the trenches 18 is, e.g., about 380 nm from the surface of the silicon nitride film 14. In the scribe line, a first trench 18a for inspection is formed corresponding to the opening 16a, and a second trench 18b for inspection is formed corresponding to the opening 16b.

Then, a silicon oxide film 20 is formed on the entire surface by, e.g., high-density plasma CVD. The film thickness of the silicon oxide film 20 is, e.g., 425 nm. The silicon oxide film 20 is thus buried in the trenches 18. Thus, the silicon oxide film 20 having concavities and convexities in the surface is formed (see FIG. 33B).

Next, the semiconductor substrate 10 is held by the polishing head 112a with the film-to-be-polished 20 of the silicon oxide film positioned beneath.

Then, the carousel 110 is rotated counter-clockwise by about 90 degrees, as in the semiconductor device fabrication method according to the first and the second embodiments. Thus, the polishing head 112a supporting the semiconductor substrate 10 is positioned on the polishing table 102a with the polishing pad 104 disposed on the upper surface.

Next, the film-to-be-polished 20 formed on the semiconductor substrate 10 is main-polished by CMP. The main polish is performed as follows. That is, while the semiconductor substrate 10 is being rotated by the polishing head 112a, the polishing head 112a is lowered to press the surface of the film-to-be-polished 20 against the surface of the polishing pad 104. At this time, the polishing table 102a is rotated, while the polishing slurry is supplied onto the polishing pad 104 through the nozzle 124a.

Polishing conditions for the main polish are as follows.

The polishing pressure is, e.g., 100-500 gf/cm$^2$. The polishing pressure is 200 gf/cm$^2$ here.

The rotation number of the polishing head 112a is, e.g., 70-150 rotations/minute. The rotation number of the polishing head is 112a, e.g., 120 rotations/minute.

The rotation number of the polishing table 102a is, e.g., 70-150 rotations/minute. The rotation number of the polishing table 102a is, e.g., 120 rotations/minute.

The supply amount of the polishing slurry 126 is within the range of, e.g., 0.1-0.3 liters/minute here. The supply amount of the polishing slurry is, e.g., 0.2 liters/minute here.

The polishing slurry is provided by a polishing slurry containing abrasive grains, and an additive of a surfactant, as in the first and the second embodiments.

The finish of the main polish is detected based on a change of the drive current or others of the polishing table 102a or others, as is in the first embodiment.

Thus, the main polish of polishing the film-to-be-polished 20 is completed (see FIG. 34A).

The conditions for the main polish are not limited to the above and may be suitably set.

The polishing pad 104 may be dressed before the main polish or in the main polish. Conditions for the dressing may be the same as, e.g., in the semiconductor device fabrication method according to the first or the second embodiment.

In the same way as in the semiconductor device fabrication method according to the first embodiment, the finishing polish is performed. The finishing polish is performed as follows. That is, the supply of the polishing slurry is stopped, and the deionized water is supplied onto the polishing pad 104 through the nozzle 124b. Then, with the polishing head 112a being rotated, the film-to-be-polished 20 is pressed against the surface of the polishing pad 104. At this time, the polishing table 102b is also rotated. The position for the deionized water to be supplied to is suitably set. It is possible that the surface of the film-to-be-polished 20 is polished without stopping the supply of the polishing slurry and with both the polishing slurry and the deionized water being supplied onto the polishing pad.

It is possible that the surface of the film-to-be-polished 20 is polished with a mixture of the polishing slurry and the deionized water being supplied onto the polishing pad 104.

Conditions for the finishing polish are set as exemplified below.

The pressure for pressing the polishing head 112a against the polishing pad 104, i.e., the polishing pressure is within the range of, e.g., 50-500 gf/cm$^2$. The polishing pressure is, e.g., 140 gf/cm$^2$.

The rotation number of the polishing head 112a is within the range of 40-150 rotations/minute. The rotation number of the polishing head 112a is 120 rotations/minute here.

The rotation number of the polishing table 102a is within the range of 40-150 rotations/minute. The rotation number of the polishing table 102a is 120 rotations/minute here.

The supply amount of the deionized water to be supplied onto the polishing pad 104 is within the range of, 0.1-10 liters/minute. The deionized water supply amount is, e.g., 0.2 liters/minute here.

The period of time of the finishing polish is, e.g., 40 seconds.

Conditions for the finishing polish are not limited to the above and may be suitably set.

Thus, the silicon oxide film 20 on the silicon nitride film 14 is removed, and the finishing polish is completed (see FIG. 34B).

As shown in FIGS. 34B and 36, the 40 μm×40 μm—first inspection pattern 38a of the buried insulation film 20 is buried in the first inspection trench 18a formed in the scribe line 36 between the chip region 34 and the other chip region 34. The 70 μm×150 μm—second inspection pattern 38b of the buried insulation film 20 is buried in the second inspection trench 18b formed in the scribe line 36.

As shown in FIG. 34B, the surface area of the first inspection pattern 38a has a relatively small area, and the dishing occurring in the surface of the buried insulation film 20 forming the first inspection pattern 38a is very shallow. Accordingly, the film thickness $d_1$ of the buried insulation film forming the first inspection pattern 38a becomes relatively large. On the other hand, the second inspection pattern 38b has a relatively large area, and the dishing occurring in the surface of the buried insulation film 20 forming the second inspection pattern 38b is relatively deep. Accordingly, the film thickness $d_2$ of the buried insulation film 20 forming the second inspection pattern 38b becomes relatively small.

Then, the film thickness $d_1$ of the buried insulation film 20 forming the first inspection pattern 38a and the film thickness $d_2$ of the buried insulation film 20 forming the second inspection pattern are measured. Based on a difference Δd between the film thickness $d_1$ of the buried insulation film 20 forming the first inspection pattern and the film thickness $d_2$ of the buried insulation film 20 forming the second inspection pattern, it is inspected whether or not the polish of the film-to-be-polished 20 is normal. Whether or not the polish of the film-to-be-polished 20 is normal is judged based on whether or not the difference Δd satisfies a prescribed inspection specifications.

Figure 37:
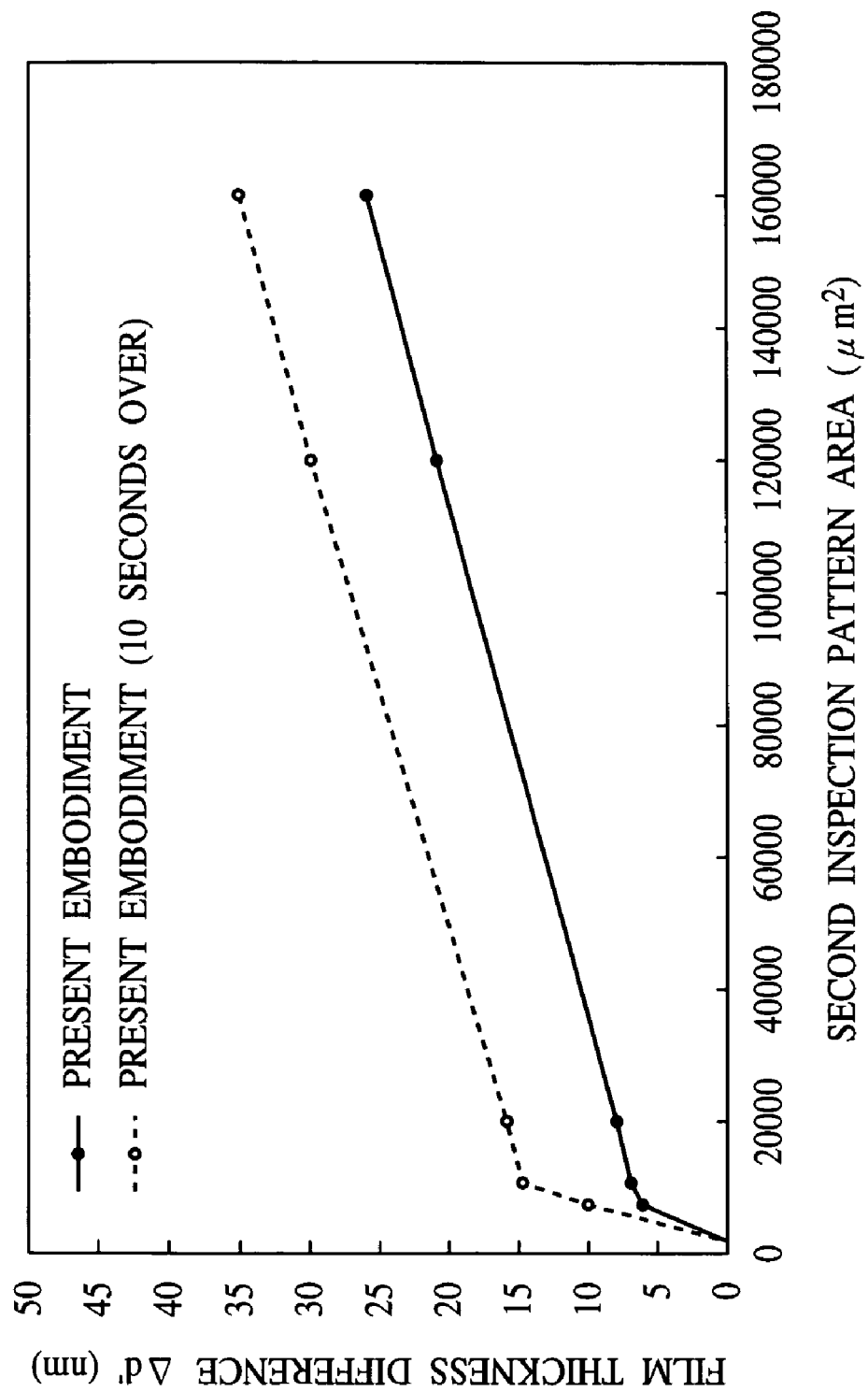
FIG. 37 is a graph of relationships between the area of the second inspection pattern, and the difference between the film thickness of the first inspection pattern and the film thickness of the second inspection pattern.

FIG. 37 is a graph of relationships between areas of the second inspection pattern, and differences of the film thickness of the first inspection pattern and the film thickness of the second inspection pattern. The surface areas of the second inspection pattern 38b are taken on the horizontal axis. The differences Δd of the film thickness $d_1$ of the first inspection pattern 38a and the film thickness $d_2$ of the second inspection pattern 38b are taken on the vertical axis. As described above, the 40 μm×40 μm pattern was used as the first inspection pattern 38a. Using such relatively small area pattern as the first inspection pattern 38a is because the dishing amount of a relatively small area pattern is so small that the film thickness $d_1$ of the buried insulation film 20 forming the first inspection pattern 38a can be the reference film thickness. For this reason, the area of the first inspection pattern is preferably below 3600 μm² or less. When the first inspection patter 38a is too small, it is difficult to measure the thickness of the position where the first inspection pattern 38a has been formed. Preferably, the first inspection pattern 38a is 1000 μm² or more. Accordingly, the area of the first inspection pattern is preferably about 1000-3600 μm².

The solid line indicates the case of the semiconductor fabrication method according to the present embodiment, i.e., where the polishing slurry containing abrasive grains, and an additive of a surfactant, and the finishing polish was performed for a prescribed period of time.

The broken line indicates the case where the polishing slurry containing abrasive grains, and an additive of a surfactant, and the finishing polish was performed longer than the prescribed period of time by 10 seconds.

For measuring the film thickness of the film-to-be-polished 20, a thin film measuring apparatus (type: ASET-F5x) by KLA-Tencor Corporation.

As seen from the comparison between the characteristics indicated by the solid line and the broken line, in the finishing polish with the proposed polishing slurry, i.e., the polishing slurry containing the abrasive grains, and an additive of a surfactant, when the finishing polishing period of time exceeds the prescribed polishing period of time, the difference Δd between the film thickness $d_1$ of the buried insulation film 20 forming the first inspection pattern 38a and the film thickness $d_2$ of the buried insulation film 20 forming the second inspection pattern 38b becomes large.

When the inspection as to whether the polish of polishing the film-to-be-polished 20 has been normal, the difference Δd between the film thickness $d_1$ of the buried insulation film 20 forming the first inspection pattern 38a and the film thickness $d_2$ of the buried insulation film 20 forming the second inspection pattern 38b, and a preset film thickness difference Δd' (see FIG. 37) are compared with each other to judge whether or not a difference ΔD between the film thickness difference Δd and the film thickness Δd' satisfies the prescribed inspection specifications.

For example, when the area of the second inspection pattern is about 10000 μm², the preset film thickness difference Δd' is about 7 nm. When the difference ΔD of 2 nm or less is judged normal by the inspection specification, the polish of polishing the film-to-be-polished 20 is judged normal when the difference Δd between the film thickness $d_1$ of the buried insulation film 20 of the first inspection pattern 38a and the film thickness $d_2$ of the buried insulation film 20 of the second inspection pattern 38b is 5-9 nm.

When the polish of polishing the film-to-be-polished 20 is judged normal, the following step follows.

On the other hand, when the difference Δd between the film thickness $d_1$ of the buried insulation film 20 forming the first inspection pattern and the film thickness $d_2$ of the buried insulation film 20 forming the second inspection pattern is outside the prescribed inspection specification, the polish of the polishing the film-to-be-polished 20 is judged not normal, and the wafer is treated as a defective. For example, when the difference Δd between the film thickness $d_1$ of the buried insulation film 20 of the first inspection pattern 38a and the film thickness $d_2$ Of the buried insulation film 20 of the second inspection pattern 38b is about 15 nm, it can be judged that the polishing period of time was longer by 10 seconds (see FIG. 37).

As seen in FIG. 37, when the second inspection pattern area is 10000 μm² or more, the film thickness difference between the film thickness of the buried insulation film forming the first inspection pattern and the film thickness of the buried insulation film forming the second inspection pattern is proportional to the area of the second inspection pattern. Accordingly, the area of the second inspection pattern is 10000 μm² or more, whereby the inspection as to whether the polish of polishing the film-to-be-polished is normal can be accurately made. Thus, preferably, the area of the second inspection pattern is 10000 μm² or more.

Figure 35:
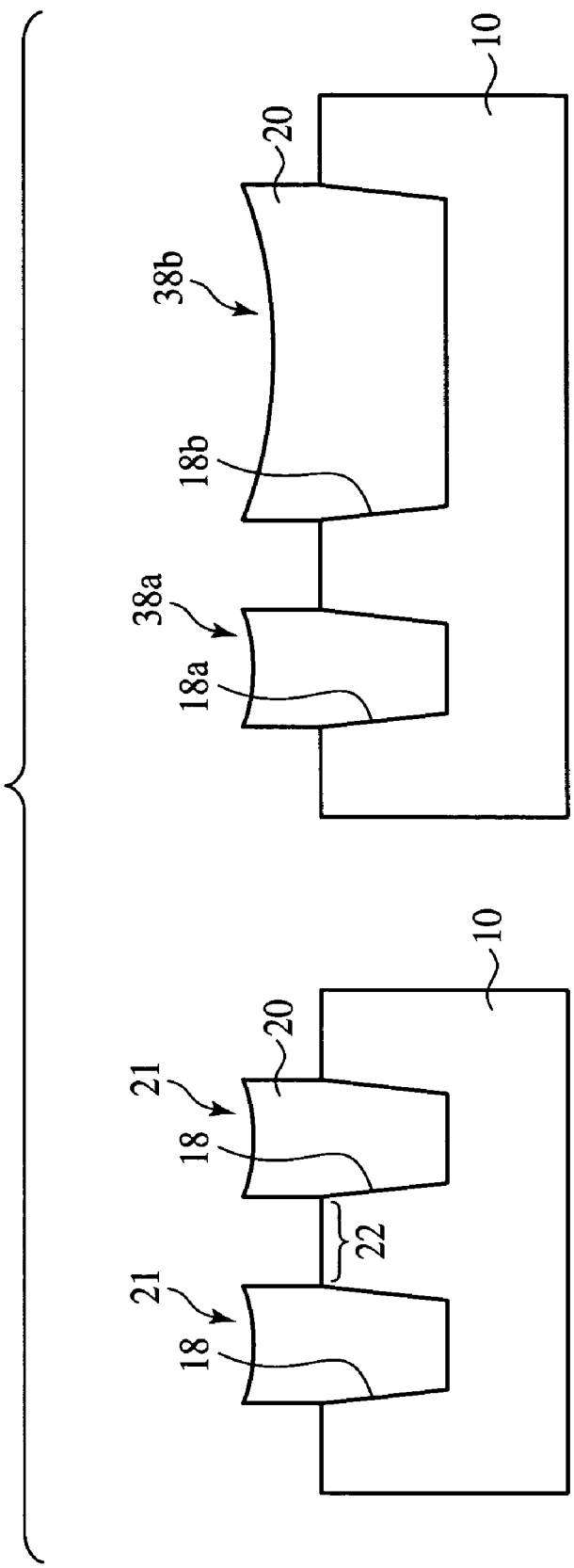
FIG. 35 is sectional views of the semiconductor device in the semiconductor fabrication method according to the second embodiment of the present invention, which show the method (Part 3).
Figure 36:
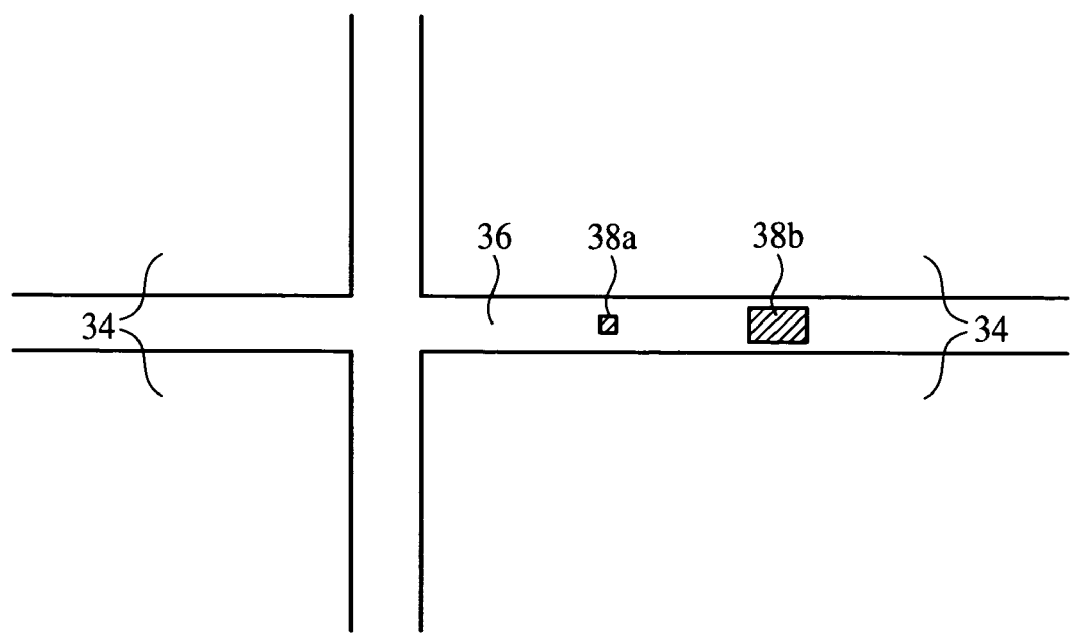
FIG. 36 is a plan view showing the semiconductor device fabrication method according to a third embodiment of the present invention.

Then in the same was as in the semiconductor device fabrication method according to the first embodiment, the silicon nitride film and the silicon oxide film are etched off (see FIG. 35). The device regions 22 are defined by the device isolation regions 21 of the silicon oxide film 20 buried in the trenches 18.

Thus, the semiconductor device fabrication method according to the present embodiment can fabricate a semiconductor device.

Then, transistors, etc. (not shown) are formed in the device regions 22.

Two kinds of inspection patterns of different area are formed, but more kinds of patterns of different areas may be formed.

As described above, according to the present embodiment, inspection patterns of different area are formed, and based on a film thickness difference between the buried insulation film forming the inspection patterns, whether or not the polish of polishing the film-to-be-polished is normal is inspected, whereby even when the finishing polish is performed with the polishing slurry containing abrasive grains, and an additive of a surfactant, whether or not the polish of polishing the film-to-be-polished is normal can be accurately inspected. Accordingly, the present embodiment can further increase the reliability of semiconductor devices.

Modification 1

Figure 38A:
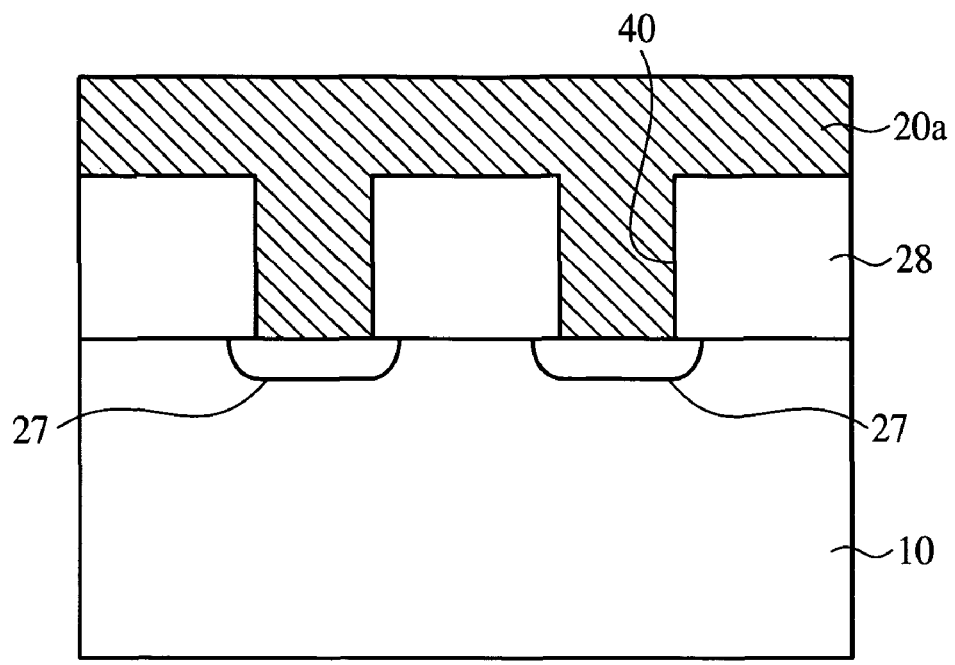
FIGS. 38A and 38B are sectional views of a semiconductor device in the steps of the semiconductor device fabrication method according to a modification (Modification 1) of the third embodiment of the present invention.
Figure 38B:
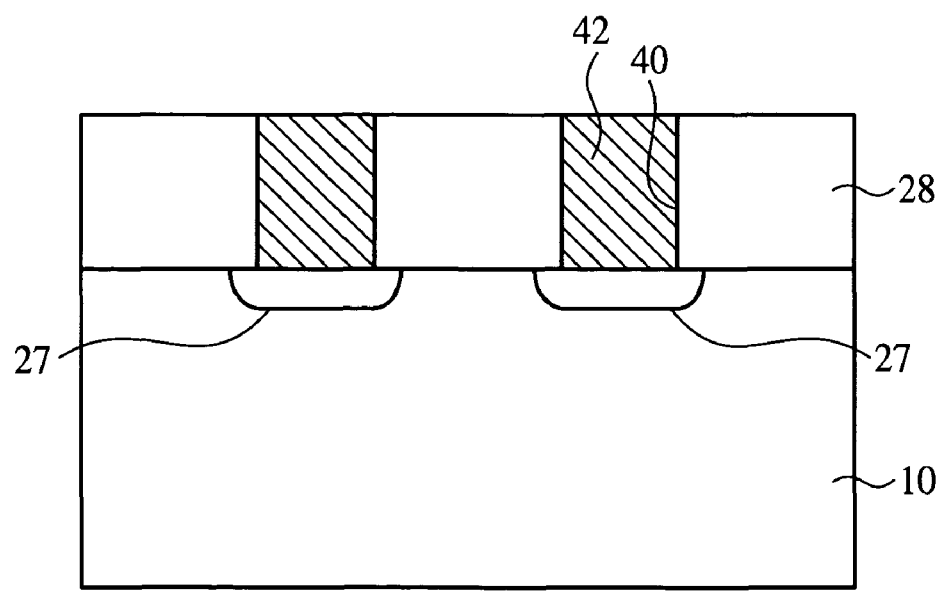

Then, a modification (Modification 1) of the semiconductor device fabrication method according to the present embodiment will be explained with reference to FIGS. 38A and 38B. FIGS. 38A and 38B are sectional views of a semiconductor device in the steps of the semiconductor device fabrication method according to the present modification, which show the method.

As shown in FIG. 38A, an inter-layer insulation film 28 of a silicon oxide film is formed on a semiconductor substrate 10 with a transistor including a gate electrode (not shown) and source/drain regions 27 formed on.

Contact holes 40 are formed in the inter-layer insulation film 28 down to the source/drain regions 27 by photolithography. Conductor plugs are to be buried in the contact holes 40. At this time, a first inspection trench (not shown) and a second inspection trench (not shown) are formed in a scribe line 36 (see FIG. 36).

Next, a polysilicon film 20a is formed on the entire surface.

Next, the surface of the film-to-be-polished 42 of the polysilicon film is polished. The method for polishing the film-to-be-polished 42 is the same as in the semiconductor device fabrication method described above with reference to FIG. 34A and FIG. 34B. The polysilicon film 20a and the silicon oxide film 28 have polish characteristics different from each other. When the film-to-be-polished 20a of the polysilicon film is polished, the inter-layer insulation film 28 of the silicon oxide film functions as the stopper film. Next, a first inspection pattern (not shown) and a second inspection pattern (not shown) are formed in the first inspection trench and the second inspection trench.

Thus, as shown in FIG. 38B, conductor plugs 44 of the polysilicon are buried in the contact holes 40.

Thus, the semiconductor device fabrication method according to the present modification can fabricate a semiconductor device.

As described above, the film-to-be-polished 20a may be the polysilicon film 20a formed on the inter-layer insulation film 28.

Modification 2

Figure 39A:
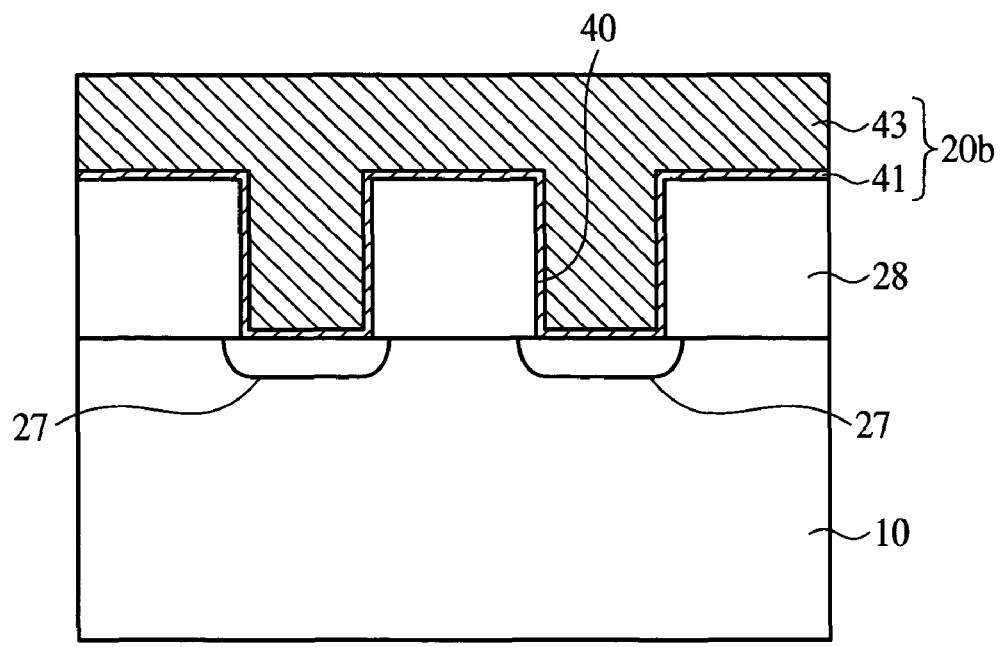
FIGS. 39A and 39B are sectional views of a semiconductor device in the steps of the semiconductor device fabrication method according to a modification (Modification 2) of the third embodiment of the present invention.
Figure 39B:
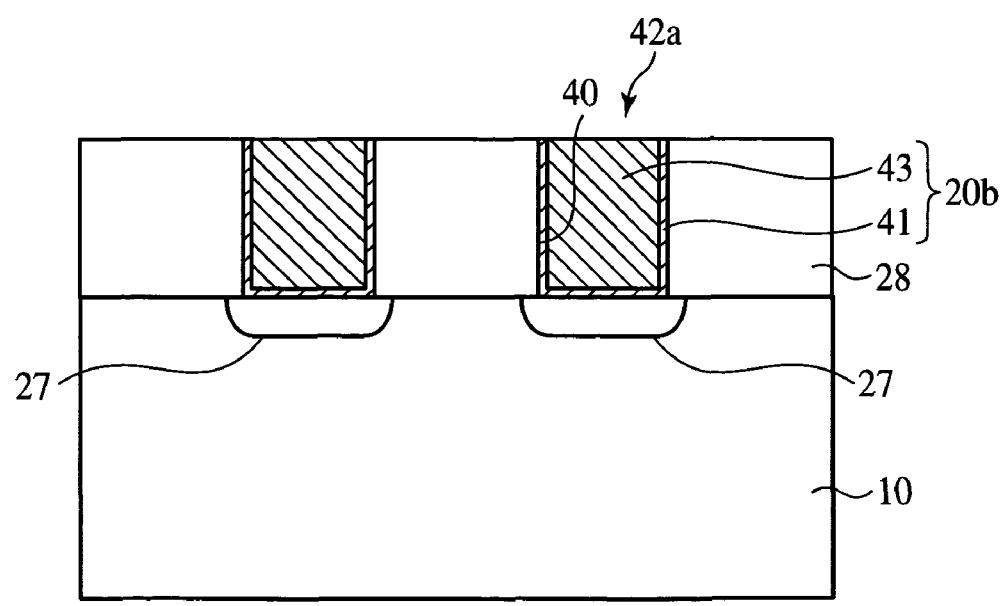

Next, a modification (Modification 2) of the semiconductor device fabrication method according to the present embodiment will be explained with reference to FIGS. 39A and 39B. FIGS. 39A and 39B are sectional views of a semiconductor device in the steps of the semiconductor device fabrication method according to the present modification, which show the method.

First, as shown in FIG. 39A, an inter-layer insulation film 28 of a silicon oxide film is formed on a semiconductor substrate 10 with a transistor including a gate electrode (not shown) and source/drain regions 27 formed on.

Then, contact holes 40 are formed in the inter-layer insulation film 38 down to the source/drain regions 27 by photolithography. Conductor plugs are to be buried in the contact holes 40. At this time, a first inspection trench (not shown) and a second inspection trench (not shown) are formed in a scribe line 36 (see FIG. 36).

Then, a TiN film 41 is formed on the entire surface. The TiN film 41 functions as a barrier film. The TiN film 41 is formed here, but a Ti film and a TiN film may be sequentially laid the latter on the former.

Next, a tungsten film 43 is formed. The tungsten film 43 is to be a material of the interconnections. The TiN film 41 and the tungsten film 43 form a layer film 20b.

Then, in the same way as in the semiconductor device fabrication method described above with reference to FIGS. 34A and 34B, the surface of the film-to-be-polished 20b of the layer film is polished. Thus, conductor plugs 42a of the layer film are buried in the contact holes 40.

Thus, the semiconductor device fabrication method according to the present modification can fabricate a semiconductor device.

As described above, the film-to-be-polished 20b may be the layer film of the TiN film 41 and the tungsten film 43, or others.

Modification 3

Figure 40A:
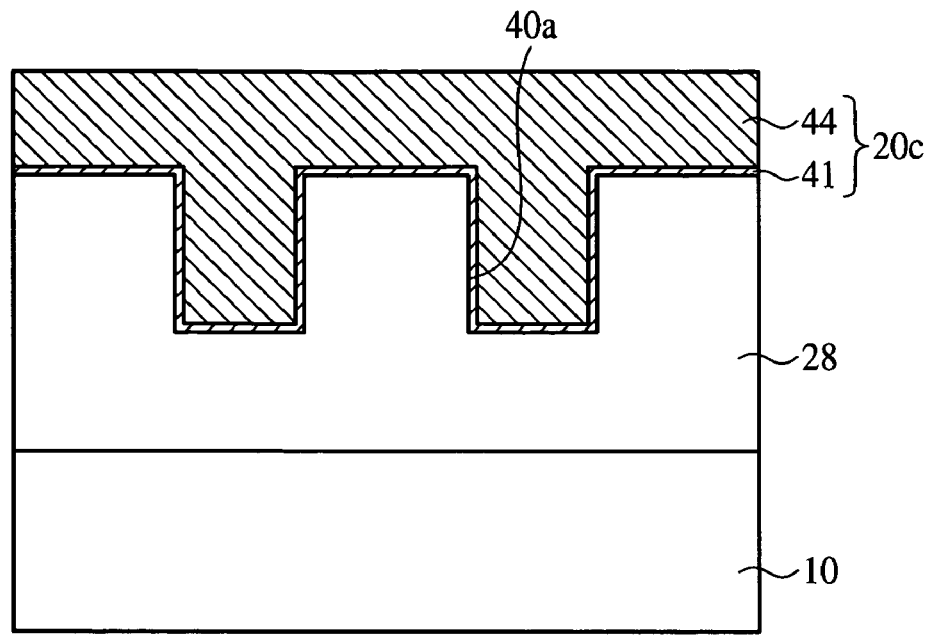
FIGS. 40A and 40B are sectional views of a semiconductor device in the steps of the semiconductor device fabrication method according to a modification (Modification 3) of the third embodiment of the present invention.
Figure 40B:
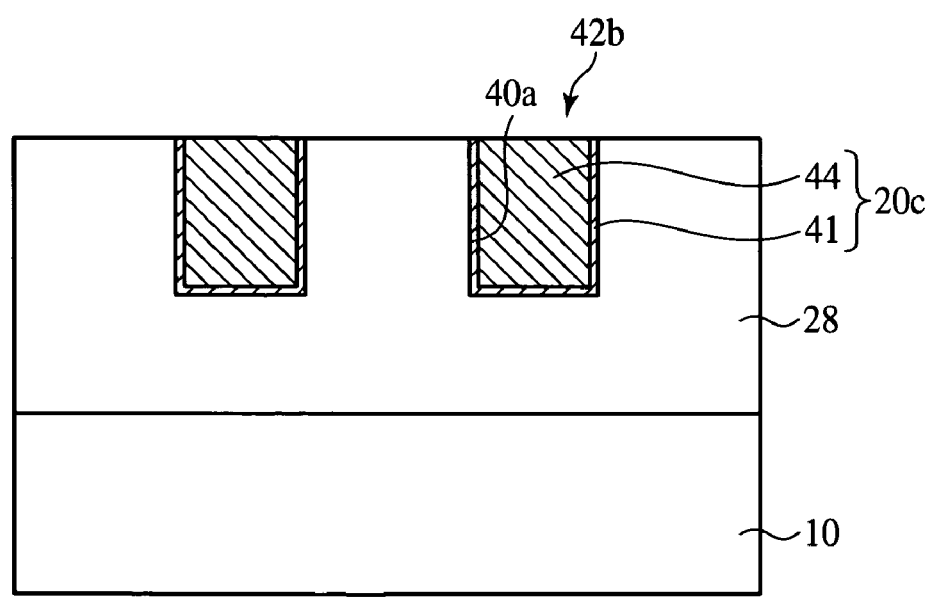

Next, a modification (Modification 3) of the semiconductor device fabrication method according to the present embodiment will be explained with reference to FIGS. 40A and 40B. FIGS. 40A and 40B are sectional views of a semiconductor device in the steps of the semiconductor device fabrication method according to the present modification, which show the method.

First, as shown in FIG. 40A, an inter-layer insulation film 28 of a silicon oxide film is formed on a semiconductor substrate 10 with a transistor (not shown), etc. formed on.

Then, trenches 40a are formed in the inter-layer insulation film 28 by photolithography. Interconnections are to be buried in the trenches 40a. At this time, a first inspection trench (not shown) and a second inspection trench (not shown) are formed in a scribe line 36 (see FIG. 36).

Then, a TiN film 41 is formed on the entire surface. As described above, the TiN film 41 functions as the barrier film. The TiN film 41 is formed here, but a Ti film and a TiN film are sequentially laid the latter on the former.

Then, a Cu film 44 is formed. The Cu film 44 is to be the material of the interconnections. Thus, the TiN film 41 and the Cu film 44 form a layer film 20c.

Then, in the same way as in the semiconductor device fabrication method described above with reference to FIG. 40B, the surface of the film-to-be-polished 20c of the layer film is polished. Thus, interconnections 42b of the layer film are buried in the trenches 40a.

Thus, the semiconductor device fabrication method according to the present modification can fabricate a semiconductor device.

As described above, the film-to-be-polished 20c may be the layer film of the TiN film 41 and the Cu film 44, or others.

A Fourth Embodiment

When the finishing polished is performed simply after the main polish, the film-to-be-polished could be remain over the device regions.

FIGS. 54A to 56 are sectional views of a semiconductor device in the semiconductor device fabrication method, which show the mechanism of the film-to-be-polished remaining above the device regions.

As shown in FIG. 54A, relatively wide trenches 218b and relatively narrow trenches 218c are mixed present in a semiconductor substrate 210. A film-to-be-polished 220 of a silicon oxide film is formed on the semiconductor substrate 210 with the trenches 218b, 218c formed in. Because of the trenches 218b, 218c formed in the semiconductor substrate 210, concavities and convexities 219 are formed in the surface of the film-to-be-polished 220. The concavities 219a are present in the surface of the film-to-be-polished 220 over the relative wide trenches 218b. On the other hand, the convexities 219b are present in the surface of the film-to-be-polished 220 also over the device regions 222. Also above the relatively narrow trenches 218c, the convexities 219b are present in the surface of the film-to-be-polished 220.

In the main polish, the polishing slurry containing the abrasive grains (now shown), and the additive 224 of a surfactant is supplied onto the polishing pad 104. The additive 224 adheres to the surface of the film-to-be-polished 220. When the polish is started, the additive 224 on the convexities 219b is removed by a large pressured applied to, remaining selectively in the concavities 219a (FIG. 54B).

When the surface of the film-to-be-polished 220 is planarized, the main polish is completed. Even at the end of the main polish, the additive 224 is still adhering much to the regions 217a where the concavities 219 have been present. On other hand, the additive is not adhering much to the regions 217b where the convexities 219b have been present. That is, the additive 224 is much adhering to the surface of the film-to-be-polished 220 over the relatively wide trenches 218b, while the additive 224 is not much adhering to the surface of the film-to-be-polished 220 over the device regions 222 and the relatively narrow trenches 218c (see FIG. 55A).

In the finishing polish, the polishing slurry and deionized water are supplied onto the polishing pad. The finishing polish is performed with the additive 224 not sufficiently removed in the regions 217a, where the concavities 219a have been present, in which the additive 224 is much adhering to the surface of the film-to-be-polished 220. On the other hand, in the regions 217b, where the convexities 219b have been present, in which the additive 224 is adhering only in a smaller amount to the surface of the film-to-be-polished 220, the finishing polish is performed with the additive 224 sufficiently removed by the deionized water (see FIG. 55B).

In the regions 217b, in which the convexities 219b have been present, the finishing polish is performed with the additive 224 sufficiently removed from the surface of the film-to-be-polished 220, whereby the polish of polishing the film-to-be-polished 220 is performed without failure. On the other hand, in the regions 217a, in which the concavities 219a have been present, the finishing polish is performed with the additive 224 not removed sufficiently from the surface of the film-to-be-polished 220, and resultantly the polish of polishing the film-to-be-polished 220 is not sufficient. Accordingly, near the regions 217a, in which the concavities 219a have been present, the film-to-be-polished 220 remains over the device regions 222 (see FIG. 56).

The inventors of the present application made earnest studies and have had an idea that the additive adhering to the surface of the film-to-be-polished is removed with deionized water after the main polish and before the finishing polish.

Removing the additive adhering to the surface of the film-to-be-polished before the finishing polish can prevent the finishing polish of the film-to-be-polished with the additive adhering to the surface of the film-to-be-polished. Accordingly, also in the regions where the concavities have been present, the polish of polishing the film-to-be-polished can be performed without failure.

Figure 41:
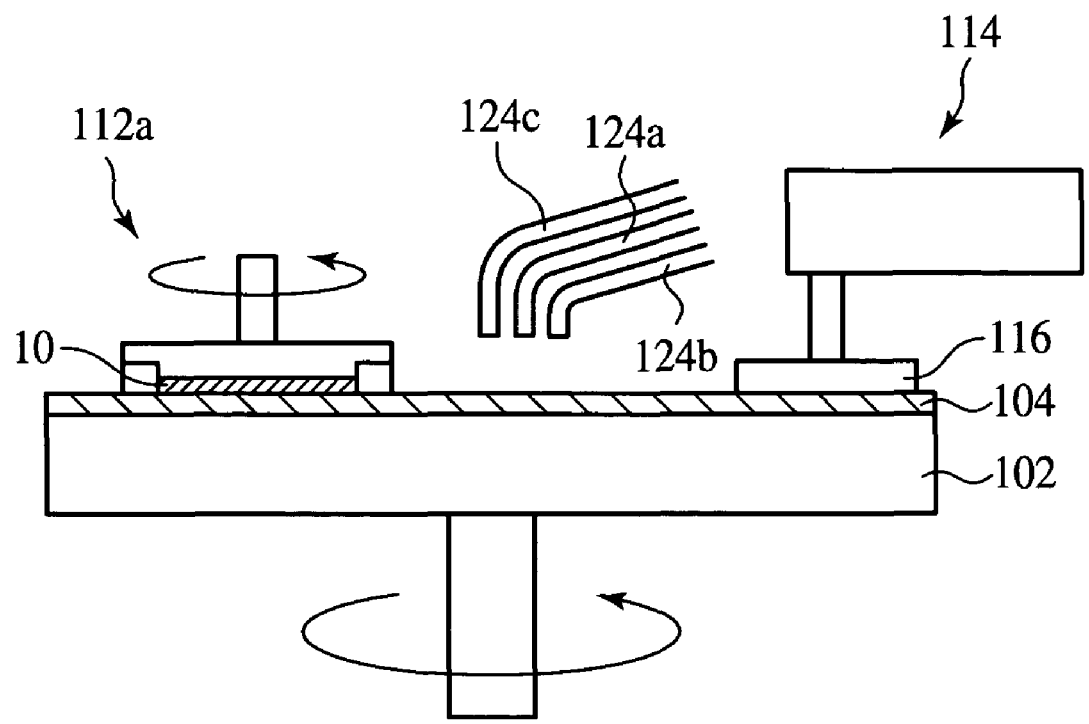
FIG. 41 is a side view of the polishing system used in the method for fabricating the semiconductor device according to a fourth embodiment of the present invention.

The method for fabricating the semiconductor device according to the fourth embodiment of the present invention will be explained with reference to FIGS. 41 to 45. FIG. 41 is a side view of the polishing system used in the present embodiment. FIGS. 42A to 44B are sectional views of the semiconductor device in the steps of the method for fabricating the semiconductor device according to the present embodiment. The same members of the present embodiment as those of the method for fabricating the semiconductor according to the first to the third embodiments shown in FIGS. 1 to 40B are represented by the same reference numbers not to repeat or to simplify their explanation.

First, the polishing system used in the present embodiment will be explained with reference to FIG. 41.

The basic structure of the polishing system according to the present embodiment is the same as the polishing system described above with reference to FIGS. 1 to 4.

The polishing system used in the present embodiment is different from that used in the polishing system described above with reference to FIGS. 1 to 4 in that in addition to the nozzles 124a, 124b, a nozzle 124c is further provided for spouting deionized water under high pressure. The deionized water is spouted under high pressure so that a large amount of the deionized water can be supplied onto the polishing pad 104 in a short period of time, and the additive 24 adhering to the surface of the film-to-be-polished 20 (see FIG. 42B) can be removed without failure in a short period of time.

Thus, the polishing system used in the present embodiment is constituted. As such polishing system is, e.g., the chemical mechanical polishing system (Type: Mirra 3400) by Applied Materials, Inc.

Then, the method for fabricating the semiconductor device according to the present embodiment will be explained with reference to FIGS. 42A to 45.

Figure 42A:
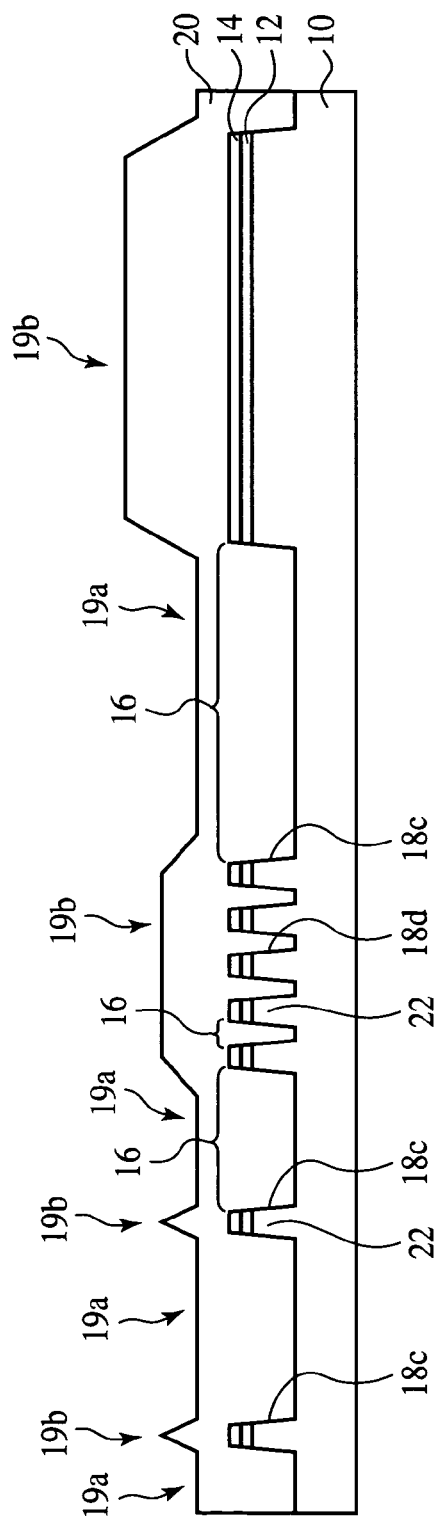
FIGS. 42A and 42B are sectional views of the semiconductor device in the steps of the method for fabricating the semiconductor device according to the fourth embodiment of the present invention, which show the method (Part 1).
Figure 42B:
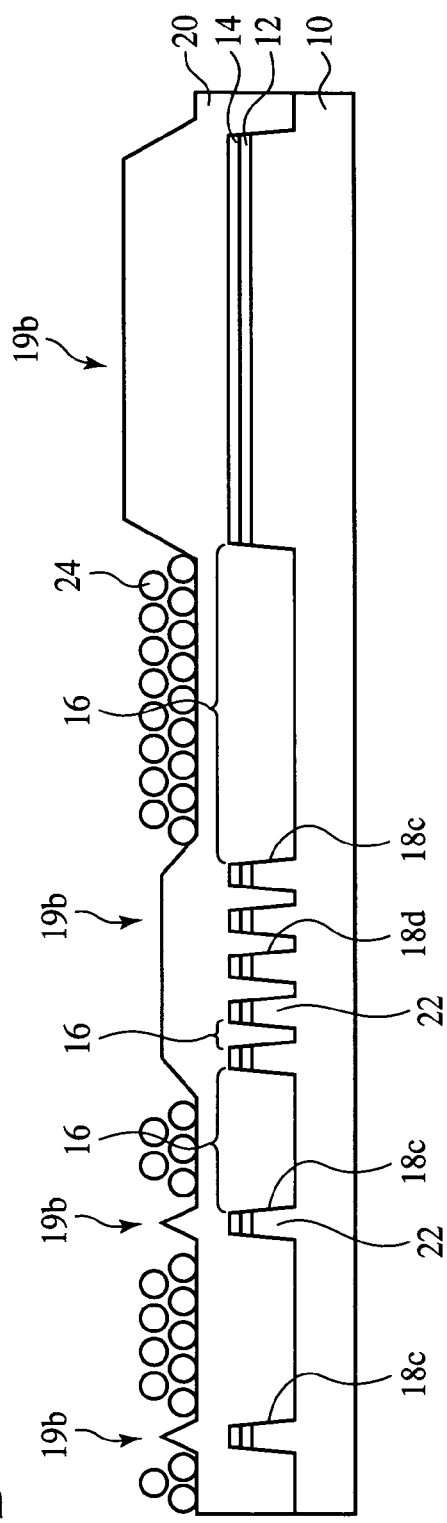

As shown in FIG. 42A, the semiconductor device 10 is prepared as in the method for fabricating the semiconductor device according to the first embodiment.

Then, in the same way as in the method for fabricating the semiconductor device according to the first embodiment, a silicon oxide film 12 is formed on the entire surface of the semiconductor substrate 10 by, e.g., thermal oxidation.

Next, in the same way as in the method for fabricating the semiconductor device according to the first embodiment, a silicon nitride film 14 is formed on the entire surface by, e.g., CVD. The silicon nitride film 14 functions as the stopper film in polishing the silicon oxide film 12 which is the film-to-be-polished.

Then, in the same way as in the method for fabricating the semiconductor device according to the first embodiment, openings 16 are formed in the silicon nitride film 14 and the silicon oxide film 12 down to the semiconductor substrate 10 by photolithography.

Then, in the same way as in the method for fabricating the semiconductor device according to the first embodiment, with the silicon nitride film 14 with the openings 16 formed in as the mask, the semiconductor device 10 is anisotropically etched. Thus, the relatively wide trenches 18c and the relatively narrow trenches 18d are formed in the semiconductor substrate 10.

Next, in the same way as in the method for fabricating the semiconductor device according to the first embodiment, a silicon oxide film 20 is formed on the entire surface by, e.g., high density plasma CVD. The silicon oxide film 20 is thus buried in the trenches 18c, 18d. The concavities and convexities 19 are formed in the surface of the film-to-be-polished 20, which is formed on the semiconductor substrate 10 with the trenches 18c, 18d formed in. Above the relatively wide trenches 18c, the concavities 19a are formed in the surface of the film-to-b-polished 20. On the other hand, above the device regions 22, the convexities 19b are formed in the surface of the film-to-be-polished 20. Also above the relatively narrow trenches 18d, the convexities 19b are formed in the surface of the film-to-be-polished 20.

Next, in the same way as in the method for fabricating the semiconductor device according to the first embodiment, the semiconductor substrate 10 is supported by the polishing head 112a (see FIG. 41) with the film-to-be-polished 20 of the silicon oxide film positioned beneath.

Then, in the same way as in the method for fabricating the semiconductor device according to the first embodiment, the carousel 110 (see FIG. 1) is rotated counter-clockwise by about 90 degrees. Thus, the polishing head 112a supporting the semiconductor substrate 10 is positioned on the polishing table 102a with the polishing pad 104 disposed on the upper surface.

Then, the film-to-be-polished 20 formed on the semiconductor substrate 10 is main-polished by CMP. The main polish is performed as follows. That is, while the semiconductor substrate 10 is being rotated by the polishing head 112a, the polishing head 112a is lowered to press the surface of the polishing film 20 against the surface of the polishing pad 104. At this time, the polishing table 102a is rotated while the polishing slurry is being supplied onto the polishing pad 103 through the nozzle 124a.

Polishing conditions for the main polish are as follows:

The pressure for pressing the polishing head 112a against the polishing pad 104, i.e., the polishing pressure is, e.g., 100-500 gf/cm$^2$. The polishing pressure is, e.g., 280 gf/cm$^2$ here.

The rotation number of the polishing head 112a is, e.g., 70-150 rotation/minute. The rotation number of the polishing head 122a is, e.g., 122 rotations/minute here.

The rotation number of the polishing table 112a is, e.g., 70-150 rotations/minute. The rotation number of the polishing table 112a is, e.g., 120 rotations/minute here.

The supply amount of the polishing slurry is within the range of, e.g., 0.1-0.3 liters/minute. The supply amount of the polishing slurry is, e.g., 0.135 liters/minute here. The polishing slurry is the polishing slurry containing abrasive grains, and an additive of a surfactant, as in the first embodiment.

Figure 45:
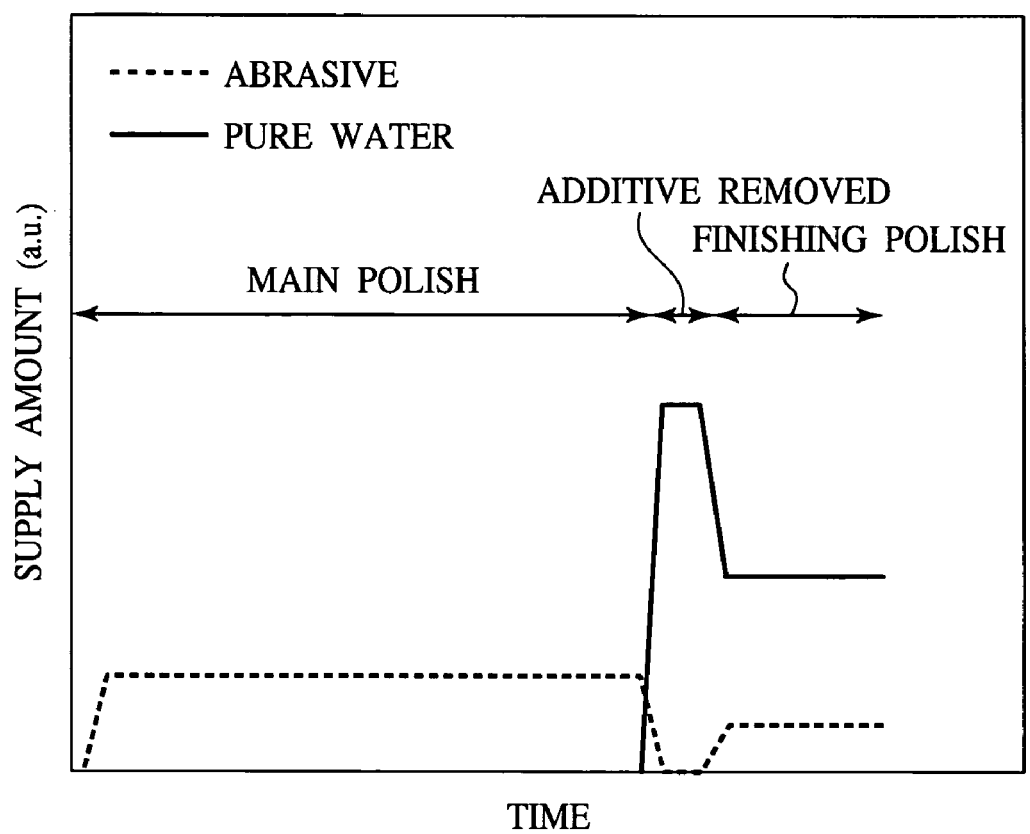
FIG. 45 is a graph of the supply amount of the polishing slurry and the supply amount of the deionized water.

FIG. 45 a graph of the supply amount of the polishing slurry and the supply amount of the deionized water. Time is taken on the horizontal axis, and the supply amounts of the polishing slurry and the deionized water are taken on the vertical axis. In FIG. 45, the dot line indicates the supply amount of the polishing slurry, and the solid line indicates the supply amount of the deionized water.

In the main polish, the polishing slurry containing the abrasive grains (not shown), and the additive of the a surfactant is supplied onto the polishing pad 104. The additive 24 adheres to the surface of the film-to-be-polished 20. When the polish is started, the additive 24 on the convexities 19b is removed by an applied high pressure, remaining selectively in the concavities 19a (see FIG. 42B).

The finish of the main polish can be detected, based on a change of the drive voltage or the drive current of the polishing table 102a, as in the method for fabricating the semiconductor device according to the first embodiment. Thus, the surface of the film-to-be-polished 20 having been planarized is detected.

Otherwise, the finish of the main polish is may be detected based on the spectral reflectance at the surface of the semiconductor substrate 10. Otherwise, the finish of the main polish is may be detected based on the reflectance of the single wavelength at the surface of the semiconductor substrate 10.

Thus, the surface of the film-to-be-polished 20 of the silicon oxide film is planarized, and the main polish is completed.

The conditions for the main polish are not limited to the above and may be suitably set.

In the regions 17a, in which the concavities 19a have been present, the additive 24 is adhering much to the surface of he film-to-be-polished 20 even at the time when the main polish is finished. On the other hand, in the regions 17b, in which the covexitites 19b have been present, the additive 24 is not much adhering to the surface of the film-to-be-polished 20. That is, above the relatively wide trenches 18c, the additive 24 is adhering much to the surface of the film-to-be-polished 20, while the additive 24 is not adhering much to the surface of the film-to-be-polished 20 above the device regions 22 and the relatively narrow trenches 18d (see FIG. 43A).

As in the method for fabricating the semiconductor device according to the first embodiment, dressing of the polishing bad 104 may be performed before the main polish or in the main polish.

Conditions for the dressing the polishing pad 104 are as follows.

A load applied to the polishing pad 104a by the diamond disk 116 is, e.g., 1300-4600 gf. The rotation number of the diamond disk 116 is. e.g., 70-120 rotations/minute.

Figure 43A:
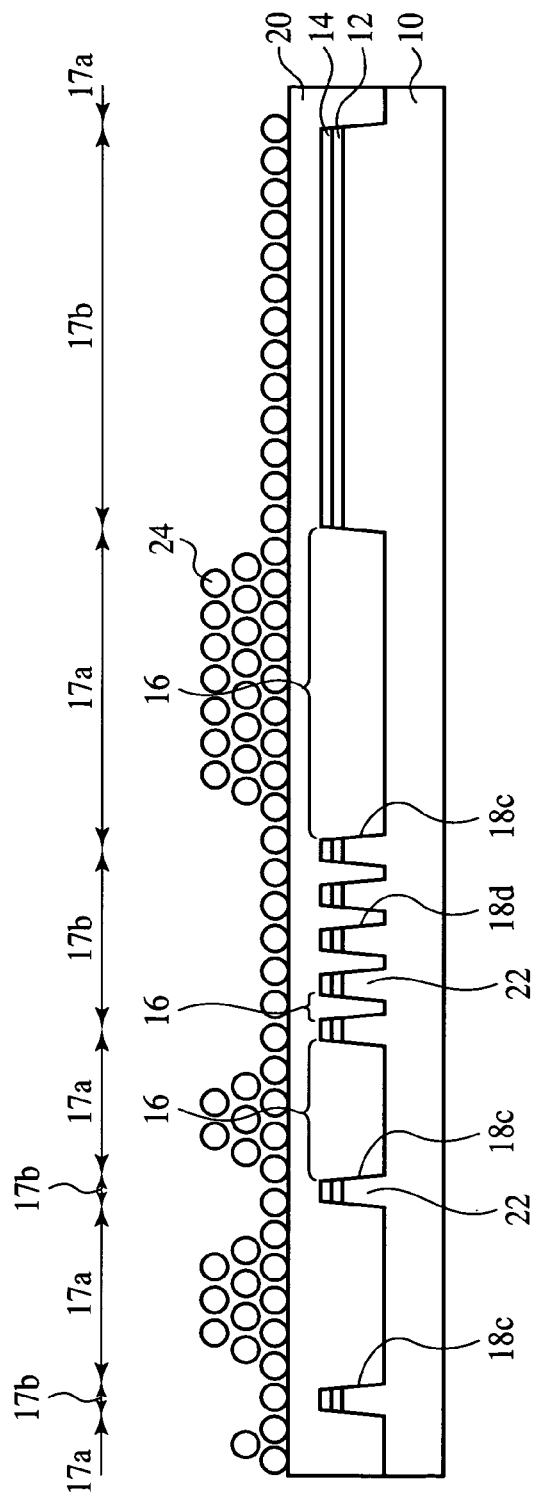
FIGS. 43A and 43B are sectional views of the semiconductor device in the steps of the method for fabricating the semiconductor device according to the fourth embodiment of the present invention. which show the method (Part 2).
Figure 43B:
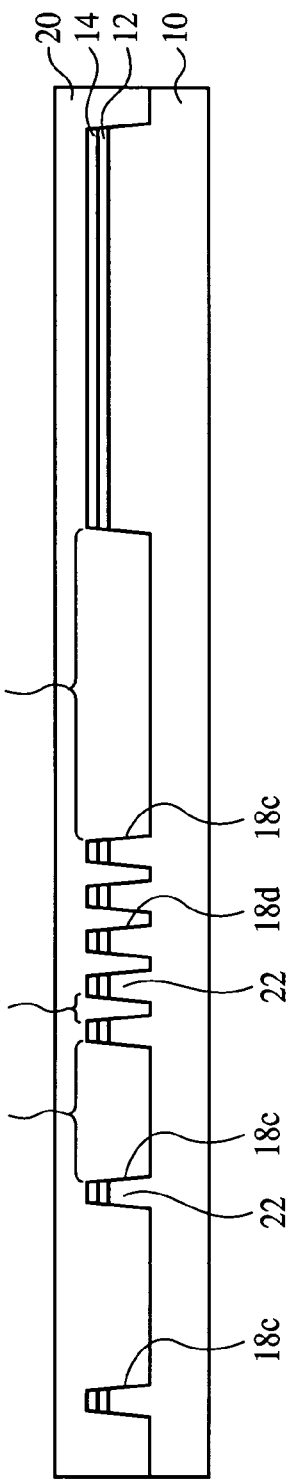

Then, the additive 24 adhering to the surface of the film-to-be-polished 220 is removed with the deionized water (see FIG. 43B). The additive 24 is removed as follows: That is, the deionized water is spouted under high pressure onto the polishing pad 104 through the nozzle 124c while the polishing head 112a a is being rotated, pressing the surface of the film-to-be-polished 20 against the polishing pad 104. At this time, the polishing table 102a is also rotated.

Conditions for removing the additive 24 are set as exemplified below.

The supply amount of the deionized water is within the range of, e.g., 0.2-10 liters/minute. The supply amount of the deionized water is, e.g., 3 liters/minute here.

When the additive 24 is removed with the deionized water, the deionized water alone is applied here (see FIG. 45). In removing the additive 24, not only the deionized water but also the polishing slurry may be supplied. Otherwise, it is possible that the surface of the film-to-be-polished 20 is polished with a mixture of the polishing slurry and the deionized water being supplied onto the polishing pad 104. When the supply amount of the deionized water to the supply amount of the polishing slurry is not sufficiently large, it is difficult to remove the additive 24 adhering to the surface of the film-to-be-polished with the deionized water. Accordingly, the supply amount of the deionized water to the supply amount of the polishing slurry must be sufficiently large. For example, it is desirable to set the supply amount of the deionized water to the supply amount of the polishing slurry to be 5 times or more. More preferably, the supply amount of the deionized water to the supply amount of the polishing slurry is set to be 7 times or more.

The pressure for spouting the deionized water is within the range of, e.g., 70-7000 gf/cm$^2$. The pressure is, e.g., 1750 gf/cm$^2$ here.

The pressure for spouting the deionized water is not limited to the above. For example, the deionized water may be supplied onto the polishing pad 104 without applying no pressure to the deionized water.

The period of time for removing the additive 24 is, e.g., 1-10 seconds. The period of time is, e.g., 4 seconds here.

The polishing pressure is in the range of, e.g., 100-500 gf/cm$^2$. The polishing pressure is, e.g., 210 gf/cm$^2$ here.

The rotation number of the polishing head 112a is in the range of, e.g., 70-150 rotations/minute. The rotation number is, e.g., 122 rotations/minute here.

The rotation number of the polishing table 102a is within the range of 70-150 rotations/minute. The rotation number is, e.g., 120 rotations/minute here.

The conditions for removing the additive 24 are not limited to the above and may be suitably set.

Thus, the additive 24 formed of a surfactant adhering to the surface of the film-to-be-polished 20 is removed with the deionized water.

Next, the finishing polish follows. The finishing polish is performed as follows. That is, the polishing slurry is supplied onto the polishing pad 104 through the nozzle 124a while the deionized water is supplied onto the polishing pad 104 through the nozzle 124b. While the polishing head 112a is being rotated, the film-to-be-polished 20 is pressed against the surface of the polishing pad 104. At this time, the polishing table 102b is rotated.

Conditions for the finishing polish are set as exemplified below.

The polishing pressure is in the range of, e.g., 100-500 gf/cm$^2$. The polishing pressure is, e.g., 210 g gf/cm$^2$ here.

The supply amount of the polishing slurry supplied onto the polishing pad 104 is within the range of, e.g., 0.05-0.3 liters/minute. The supply amount of the polishing slurry is, e.g., 0.1 liters/minute here.

The supply amount of the deionized water supplied onto the polishing pad 104 is within the range of, e.g., 0.05-0.3 liters/minute. The supply amount of the deionized water is, e.g., 0.25 liters/minute.

The rotation number of the polishing head 112a is within the range of, e.g., 70-150 rotations/minute. The rotation number of the polishing head 112a is, e.g., 122 rotations/minute here.

The rotation number of the polishing table 102a is within the range of, e.g., 70-150 rotations/minute. The rotation number of the polishing table 102a is, e.g., 120 rotations/minute here.

The period of time for the finishing polish is, e.g., about 30 seconds.

The finish of the finishing polished may be detected, based on a change of the drive voltage or drive current of the polishing table 102, as in the method for fabricating the semiconductor device according to, e.g., the second embodiment.

Otherwise, the finish of the main polish is may be detected based on the spectral reflectance at the surface of the semiconductor substrate 10. Otherwise, the finish of the main polish is may be detected based on the reflectance of the single wavelength at the surface of the semiconductor substrate 10.

The conditions for the finishing polish are not limited to the above and may be suitably set.

Figure 44A:
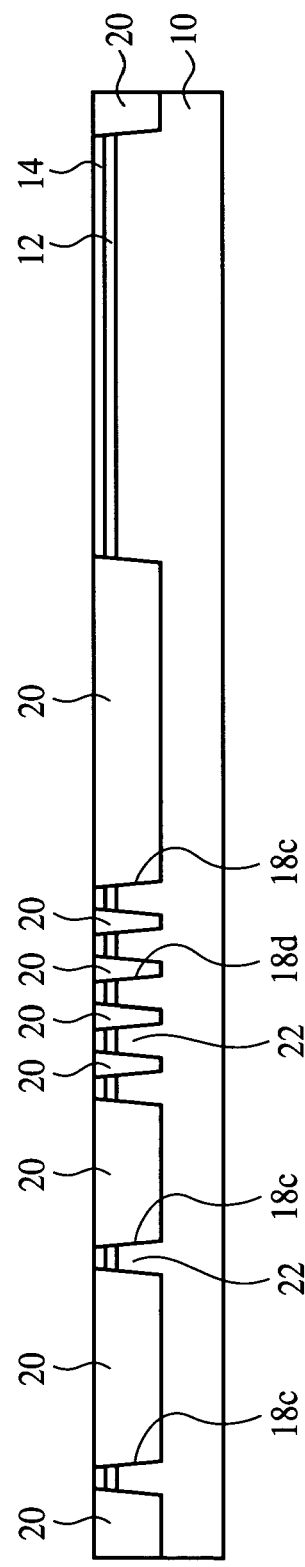
FIGS. 44A and 44B are sectional views of the semiconductor device in the steps of the method for fabricating the semiconductor device according to the fourth embodiment of the present invention. which show the method (Part 3).

Thus, the silicon oxide film 20 on the silicon nitride film 14 is removed, and the finishing polish is completed (see FIG. 44A).

Figure 44B:
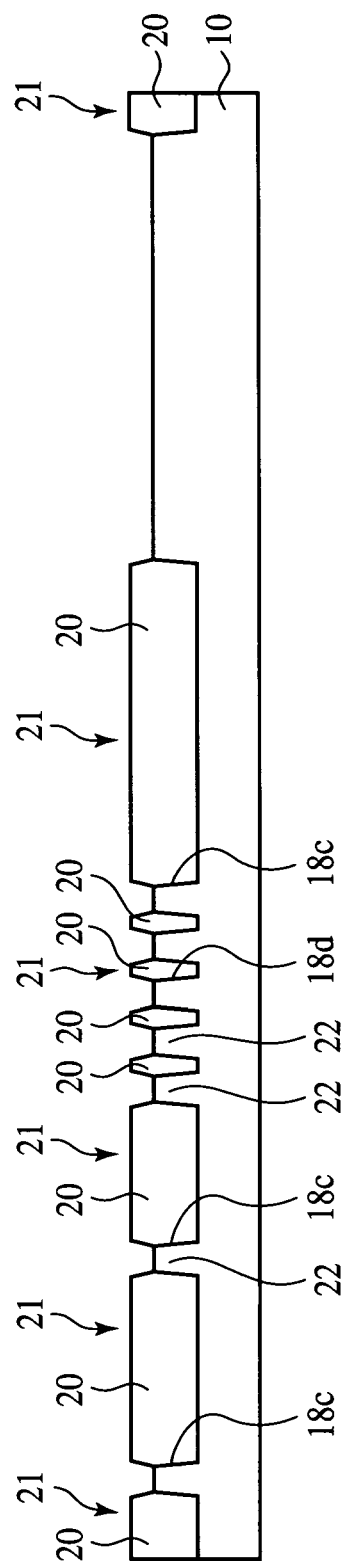

Then, as shown in FIG. 44B, the silicon nitride film 14 and the silicon oxide film 12 are etched off. The device regions 22 are defined by the device isolation regions 21 of the silicon oxide film 20 buried in the trenches 18.

Then, transistor, etc. (not shown) are formed in the device regions 22.

Thus, the semiconductor device according to the present embodiment is fabricated.

The method for fabricating the semiconductor device according to the present embodiment is characterized mainly in that, as described above, the additive 24 adhering to the surface of the film-to-be-polished 20 is removed with the deionized water after the main polish and before the finishing polish.

According to the present embodiment, the additive 24 adhering to the surface of the film-to-be-polished 20 is removed before the finishing polish, whereby the finishing polish with the additive adhering to the surface of the film-to-be-polished 20 can be prevented. Thus, according to the present embodiment, the residue of the film-to-be-polished 20 over the device regions 22 can be prevented without failure, and resultantly, the silicon nitride film 14 and the silicon oxide film 12 over the device regions 22 can be removed without failure.

Modified Embodiments

The present invention is not limited to the above-described embodiments and can cover other various modifications.

For example, in the above-described embodiments, the film-to-be-polished 20 is a silicon oxide film, and the stopper film 14 is a silicon nitride film. However, the materials of the film-to-be-polished 20 and the stopper film 14 are not limited to such films. As long as material have different polishing rates, they can be suitably used as the materials of the film-to-be-polished 20 and the stopper film 14. For example, the film-to-be-polished 20 may be a silicon oxide film, and the stopper film 14 may be a silicon film.

Figure 46A:
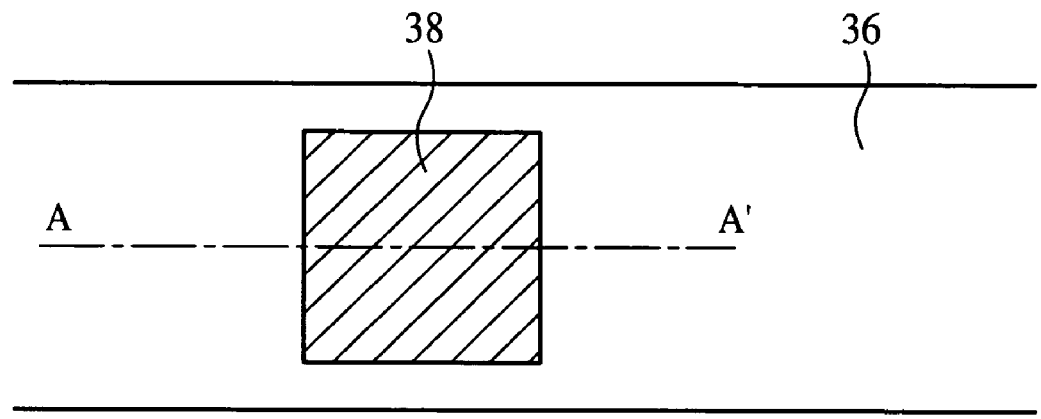
FIGS. 46A and 46B are a plan view and a sectional view of a semiconductor device in the steps of the semiconductor device fabrication method according to a modified embodiment of the present invention, which show the method.
Figure 46B:
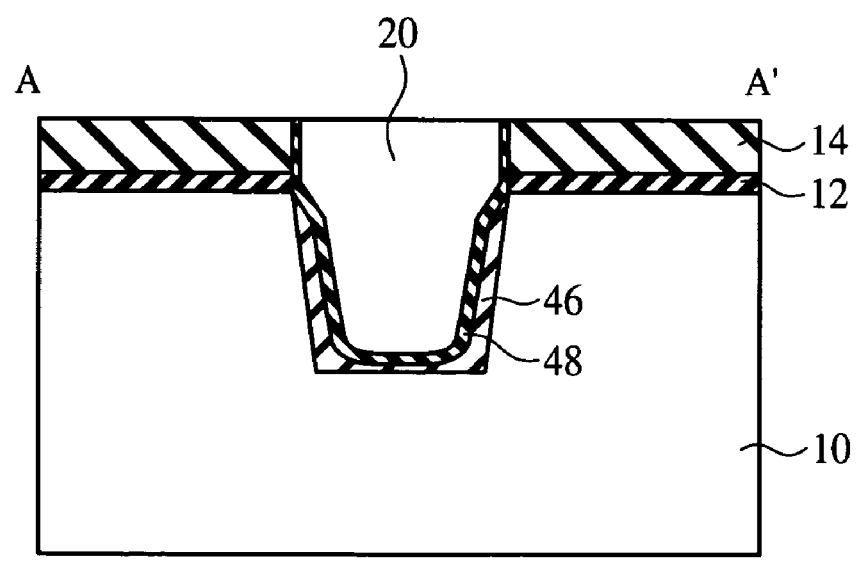
Figure 47A:
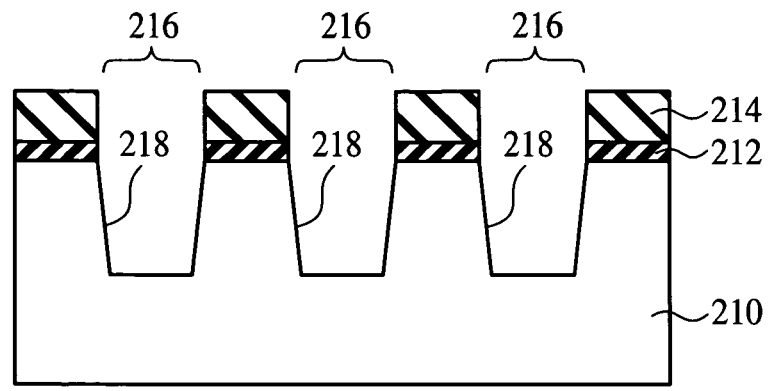
FIGS. 47A to 47C are sectional views of a semiconductor device in the steps of the conventional semiconductor device fabrication method, which show the method.
Figure 47B:
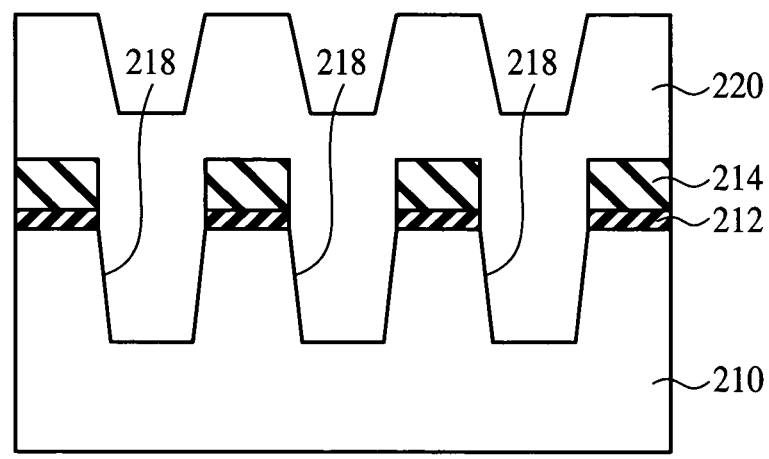
Figure 47C:
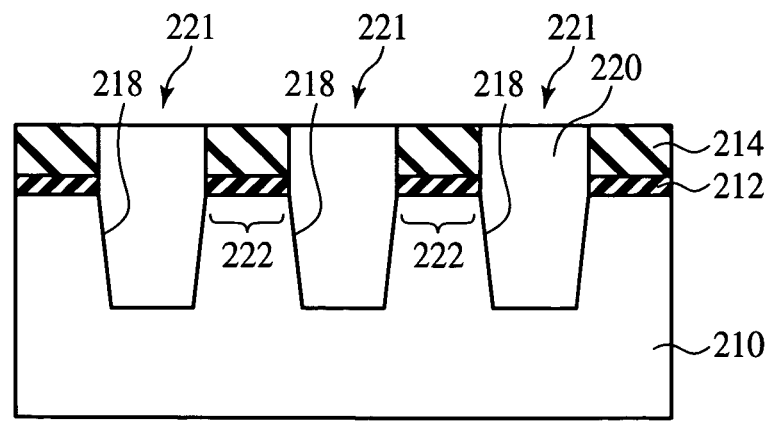
Figure 48A:
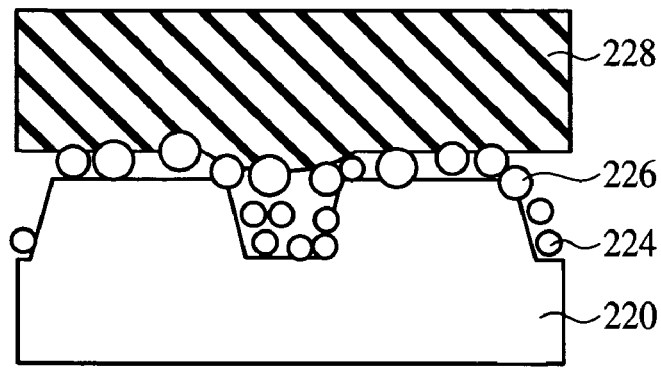
FIGS. 48A to 48C are conceptual views of the polishing mechanism for polishing the film-to-be-polished with the proposed polishing slurry.
Figure 48B:
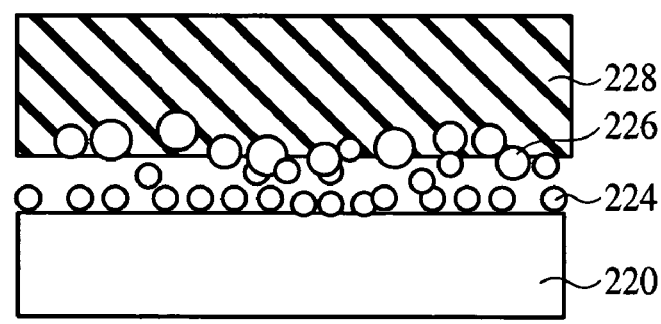
Figure 48C:
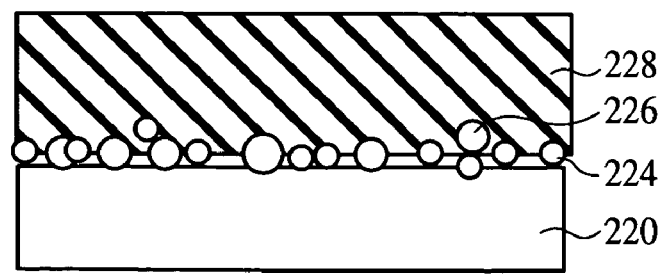
Figure 49A:
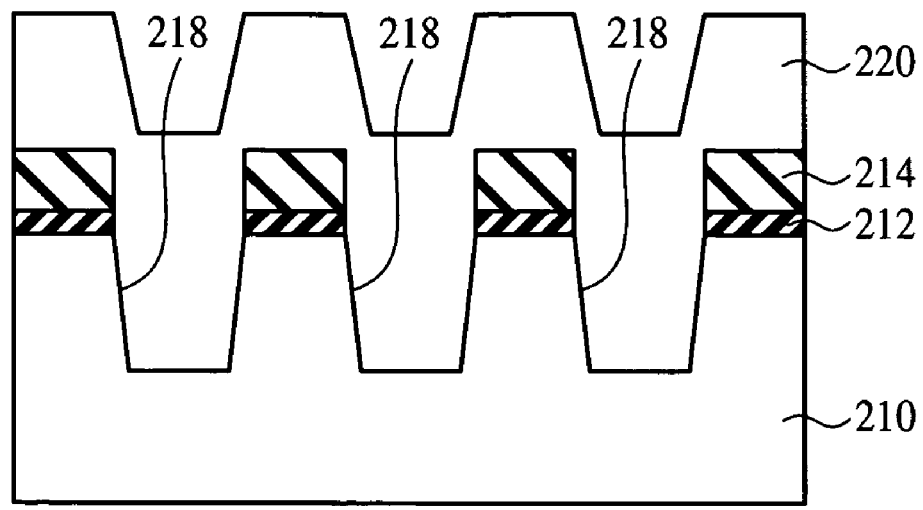
FIGS. 49A and 49B are sectional views of a semiconductor device in the steps of the proposed semiconductor device fabrication method, which show the polish.
Figure 49B:
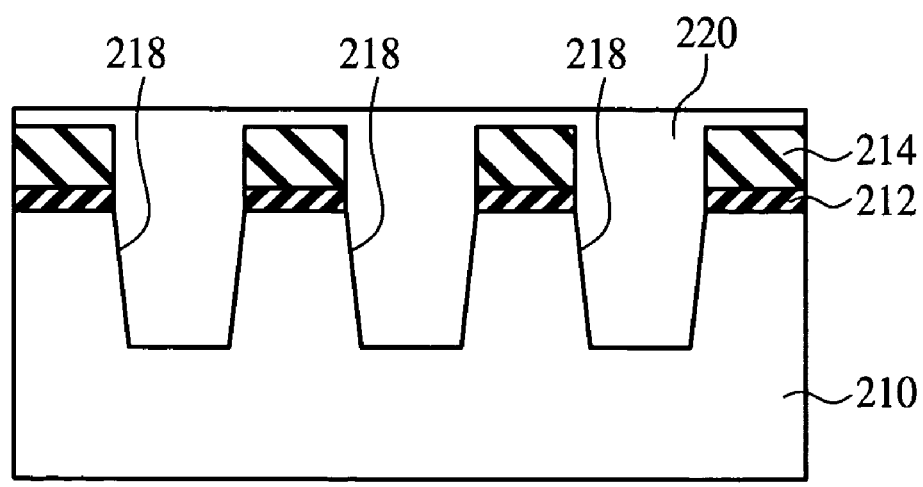
Figure 50A:
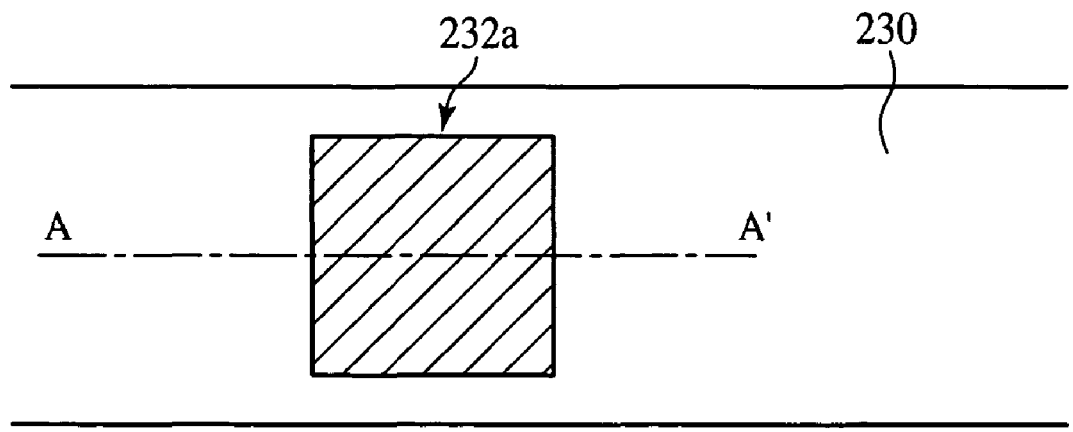
FIGS. 50A and 50B are a plan view and a sectional view of the inspection patterns of the stopper film formed in the scribe line.
Figure 50B:
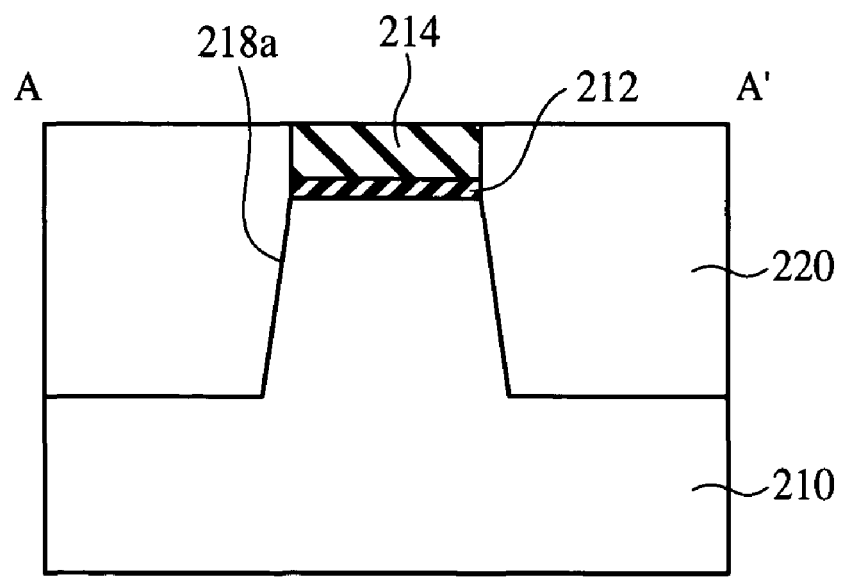
Figure 51A:
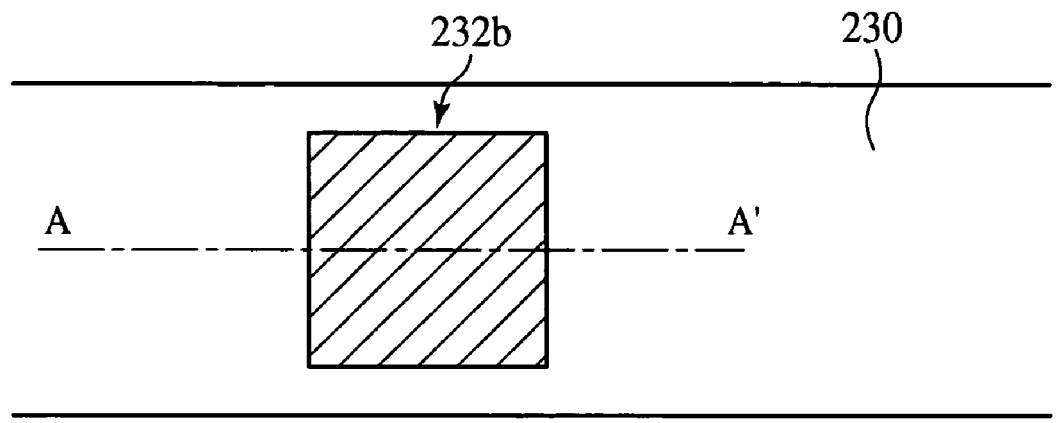
FIGS. 51A and 51B are a plan view and a sectional view of the inspection patterns of the buried insulation film formed in the scribe line.
Figure 51B:
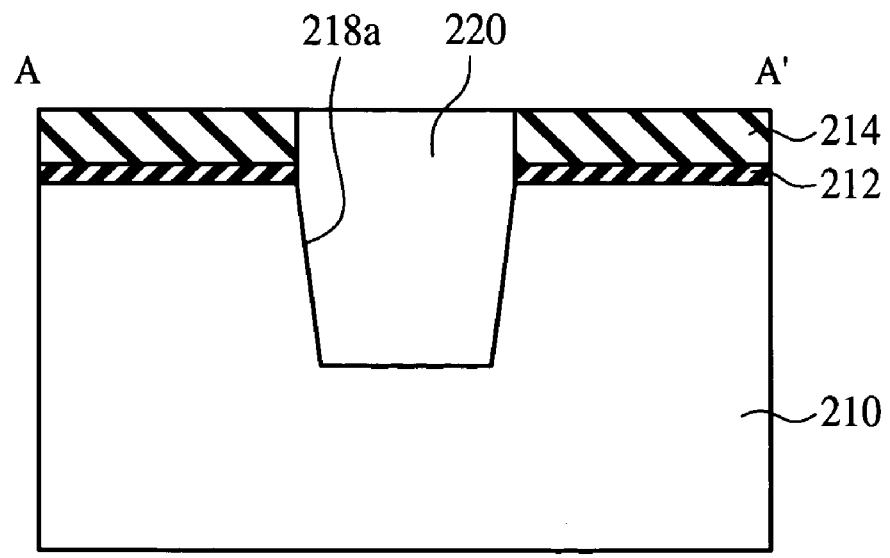
Figure 52:
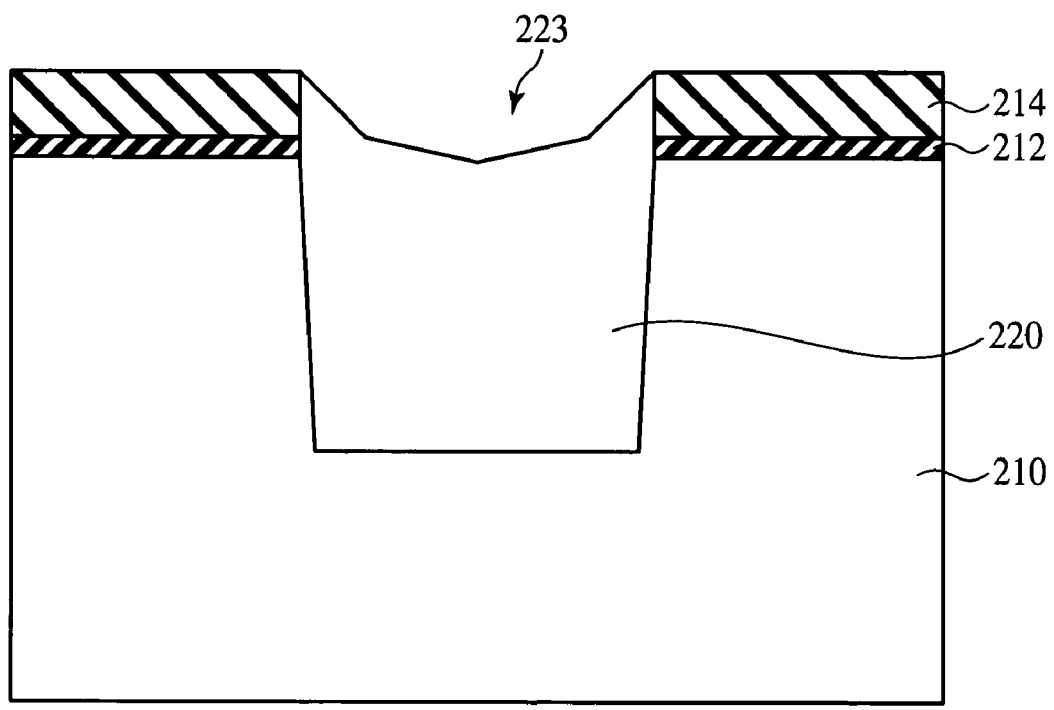
FIG. 52 is a sectional view showing the state of the dishing occurred in the surface of the buried oxide film.
Figure 53:
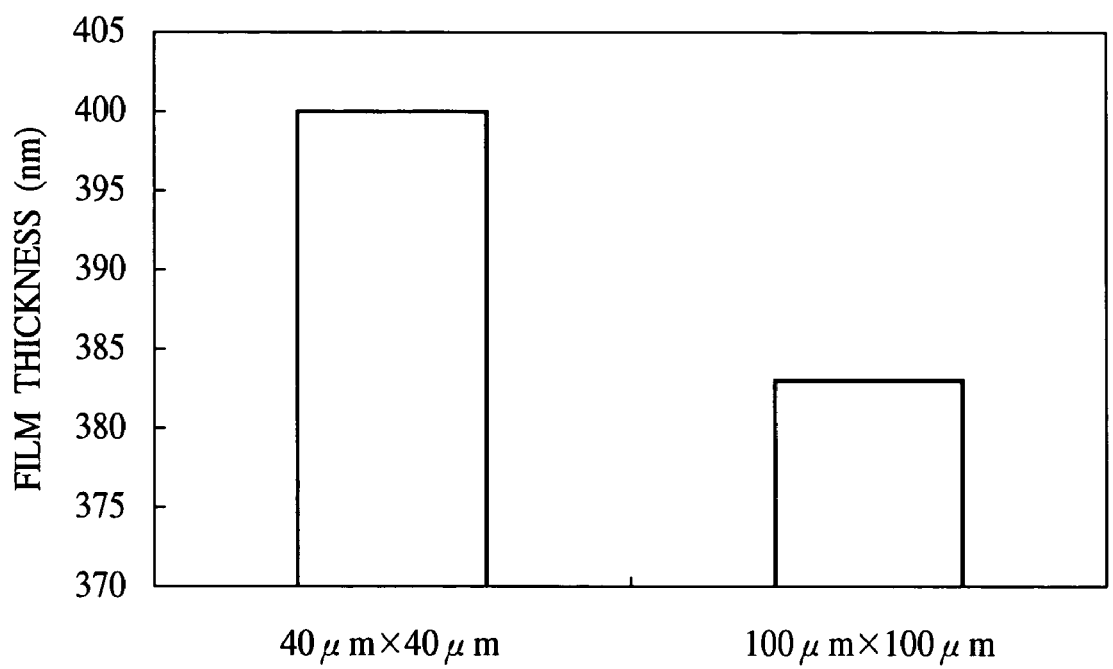
FIG. 53 is a graph which compares the film thickness of the buried oxide film between the trenches.
Figure 56:
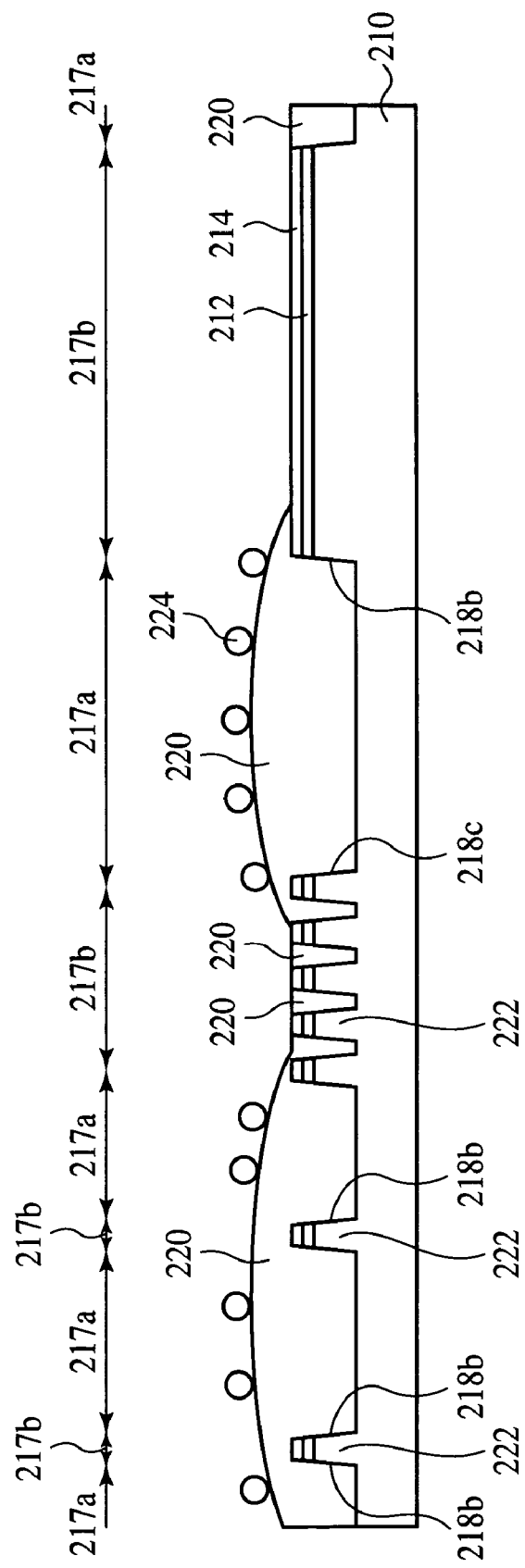
FIG. 56 is a sectional view of the semiconductor device in the step of the method for fabricating the semiconductor device, which show the mechanism of the film-to-be-polished remaining over the device regions (Part 3).

In the above-described embodiments, after the trenches 18 have been formed, the silicon oxide film 20, filling the trenches 18. However, after the trenches 18 have been formed, as shown in FIGS. 46A and 46B, a silicon oxide film 46 and a silicon nitride film 48 may be sequentially formed on the inside wall of a trench 18 before the silicon oxide film 20 to be the film-to-be-polished is formed. FIGS. 46A and 46B are a plan view and a sectional view explaining the semiconductor device fabrication method according to a modified embodiments. FIG. 46A is the plan view, and the FIG. 46B is the sectional view along the line A-A' in FIG. 46A.

In the above-described embodiments, the abrasive grains contained in the polishing slurry are cerium oxide. However, the abrasive grains contained in the polishing slurry are not essentially limited to cerium oxide. Any other abrasive grains can be used. For example, silicon oxide (silica) may be used as the abrasive grains.

In the third embodiment, the inspection patterns 38a, 38b are formed on the scribe line, but the region for the inspection patterns to be formed in is not essentially limited to the scribe line. The inspection patterns may be formed, e.g., in the chip region.

What is claimed is:

1. A semiconductor device fabrication method comprising:
a first polishing of polishing a film-to-be-polished while a polishing slurry including abrasive grains and a surfactant is supplied onto a polishing pad through a first nozzle; and
a second polishing of polishing the film-to-be-polished while said polishing slurry is supplied onto a polishing pad through the first nozzle and water is further supplied onto the polishing pad through a second nozzle different from the first nozzle, wherein supply of said water through the second nozzle starts at the second polishing after the first polishing.

2. A semiconductor device fabrication method according to claim 1, wherein in the second polishing, said water is supplied to first position on a polishing table, and the polishing slurry is supplied to a second position on the polishing table, wherein a distance between the first position and a center position of the polishing table is larger than a distance between the center position and the second position.

3. A semiconductor device fabrication method according to claim 1, wherein in the second polishing, a supply amount of said water is 2 or more times as much as a supply amount of said polishing slurry.

4. A semiconductor device fabrication method according to claim 1, further comprising, before the first polishing:

forming over a semiconductor substrate an insulation film having polish characteristics different from those of the film-to-be-polished;

forming an opening in the insulation film;

etching the semiconductor substrate with the insulation film as a mask to form a trench in the semiconductor substrate; and forming the film-to-be-polished in the trench and over the insulation film, in the second polishing, the film-to-be-polished is polished with the insulation film as a stopper.

5. A semiconductor device fabrication method according to claim 1, wherein the abrasive grains comprise cerium oxide or silicon oxide,
the surfactant comprises poly(ammonium acrylate).

6. A semiconductor device fabrication method according to claim 1, wherein in the second polishing, a supply amount of said polishing slurry to a supply amount of said water is 1:5.

7. A semiconductor device fabrication method according to claim 1, wherein the polishing pad used in the second polishing is different from the polishing pad used in the first polishing.

* * * * *